United States Patent
Yamazaki et al.

(10) Patent No.: US 12,300,126 B2
(45) Date of Patent: May 13, 2025

(54) DISPLAY DEVICE, MANUFACTURING METHOD THEREOF, AND VEHICLE

(71) Applicant: Semiconductor Energy Laboratory Co., Ltd., Kanagawa-ken (JP)

(72) Inventors: Shunpei Yamazaki, Tokyo (JP); Shingo Eguchi, Kanagawa (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 161 days.

(21) Appl. No.: 18/038,271

(22) PCT Filed: Nov. 24, 2021

(86) PCT No.: PCT/IB2021/060900
§ 371 (c)(1),
(2) Date: May 23, 2023

(87) PCT Pub. No.: WO2022/123378
PCT Pub. Date: Jun. 16, 2022

(65) Prior Publication Data
US 2024/0096242 A1    Mar. 21, 2024

(30) Foreign Application Priority Data

Dec. 7, 2020  (JP) ................. 2020-202399
Jan. 22, 2021  (JP) ................. 2021-008656
(Continued)

(51) Int. Cl.
G09F 9/30    (2006.01)
G09F 21/00   (2006.01)
H10K 59/126  (2023.01)

(52) U.S. Cl.
CPC ............... *G09F 9/30* (2013.01); *G09F 21/00* (2013.01); *H10K 59/126* (2023.02)

(58) Field of Classification Search
CPC .......... G09F 9/30; G09F 21/00; H10K 59/126
(Continued)

(56) References Cited

U.S. PATENT DOCUMENTS 5,953,985 A    9/1999  Kobayashi
6,120,338 A    9/2000  Hirano et al.
(Continued)

FOREIGN PATENT DOCUMENTS

CN    111516592 A    8/2020
JP    2000-036385 A    2/2000
(Continued)

OTHER PUBLICATIONS

International Search Report (Application No. PCT/IB2021/060900) Dated Mar. 1, 2022.
(Continued)

*Primary Examiner* — Kerri L McNally
(74) *Attorney, Agent, or Firm* — Husch Blackwell LLP

(57) ABSTRACT

One embodiment of the present invention provides a display device from which a driver or a fellow passenger in a mobile body such as a vehicle can easily obtain desired information. One embodiment of the present invention is a display device including a display panel. The display panel is placed inside a mobile body including window glass. A film including a light-blocking layer is provided between the window glass and the display panel of the mobile body. By providing a driving unit controlling the display panel, the positional relationship between the window glass and the display panel is changed. Alternatively, by providing a driving unit controlling the film including the light-blocking layer, the positional relationship between the window glass and the film including the light-blocking layer is changed.

10 Claims, 42 Drawing Sheets

(30) Foreign Application Priority Data

Jan. 22, 2021 (JP) ................................. 2021-008774
Sep. 29, 2021 (JP) ................................. 2021-158694

(58) Field of Classification Search
USPC ....................................................... 340/691.6
See application file for complete search history.

(56) References Cited

U.S. PATENT DOCUMENTS

| | | | |
|---|---|---|---|
| 7,199,520 | B2 | 4/2007 | Fujii et al. |
| 7,221,092 | B2 | 5/2007 | Anzai et al. |
| 7,598,927 | B2 | 10/2009 | Yamazaki et al. |
| 7,750,552 | B2 | 7/2010 | Yamazaki et al. |
| 8,956,891 | B2 | 2/2015 | Chida |
| 9,065,034 | B2 | 6/2015 | Chida |
| 9,196,813 | B2 | 11/2015 | Chida |
| 9,444,020 | B2 | 9/2016 | Chida |
| 9,978,981 | B2 | 5/2018 | Chida |
| 10,290,266 | B2 | 5/2019 | Kurokawa |
| 10,434,847 | B2 | 10/2019 | Yoshizumi et al. |
| 10,453,381 | B2 | 10/2019 | Kurokawa |
| 10,490,766 | B2 | 11/2019 | Chida |
| 10,504,489 | B2 | 12/2019 | Yamazaki et al. |
| 10,734,596 | B2 | 8/2020 | Chida |
| 10,930,205 | B2 | 2/2021 | Kurokawa |
| 11,201,308 | B2 | 12/2021 | Chida |
| 11,205,356 | B2 | 12/2021 | Yoshizumi et al. |
| 11,380,218 | B2 | 7/2022 | Tsukamoto. et al. |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0268665 | A1 | 10/2012 | Yetukuri et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2015/0291032 | A1* | 10/2015 | Kim .................... B62D 1/04 280/779 |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0217290 | A1 | 8/2017 | Yoshizumi et al. |
| 2017/0256754 | A1 | 9/2017 | Defranco et al. |
| 2018/0136895 | A1* | 5/2018 | Harris ................ B60R 11/0229 |
| 2018/0170181 | A1* | 6/2018 | Tan ..................... B60K 35/26 |
| 2018/0190908 | A1 | 7/2018 | Ke et al. |
| 2019/0146216 | A1* | 5/2019 | Mourou ................ B60J 3/04 280/781 |
| 2019/0265582 | A1* | 8/2019 | Sakai ................. G03B 21/142 |
| 2020/0203662 | A1 | 6/2020 | Mollard et al. |
| 2020/0247327 | A1* | 8/2020 | Ito ....................... B60K 35/22 |
| 2020/0292905 | A1* | 9/2020 | Larry ................... G02F 1/1313 |
| 2020/0358023 | A1 | 11/2020 | Chida |
| 2021/0383694 | A1 | 12/2021 | Yamazaki et al. |
| 2022/0058996 | A1 | 2/2022 | Yoshizumi et al. |
| 2022/0102667 | A1 | 3/2022 | Chida |
| 2023/0044180 | A1 | 2/2023 | Akimoto et al. |
| 2023/0057378 | A1 | 2/2023 | Osipov et al. |
| 2023/0403881 | A1 | 12/2023 | Yamazaki et al. |
| 2024/0057378 | A1 | 2/2024 | Nakamura et al. |
| 2024/0057402 | A1 | 2/2024 | Okazaki et al. |

FOREIGN PATENT DOCUMENTS

| | | |
|---|---|---|
| JP | 2002-274172 A | 9/2002 |
| JP | 2003-059663 A | 2/2003 |
| JP | 2004-345399 A | 12/2004 |
| JP | 2005-067367 A | 3/2005 |
| JP | 2005-183006 A | 7/2005 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-124950 A | 8/2020 |
| JP | 2020-155420 A | 9/2020 |
| JP | 2020-160305 A | 10/2020 |
| JP | 2021-043276 A | 3/2021 |
| JP | 2021-059150 A | 4/2021 |
| WO | WO 2004/061807 A1 | 7/2004 |
| WO | WO 2004/068910 A1 | 8/2004 |
| WO | WO 2016/020808 A1 | 2/2016 |

OTHER PUBLICATIONS

Written Opinion (Application No. PCT/IB2021/060900) Dated Mar. 1, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

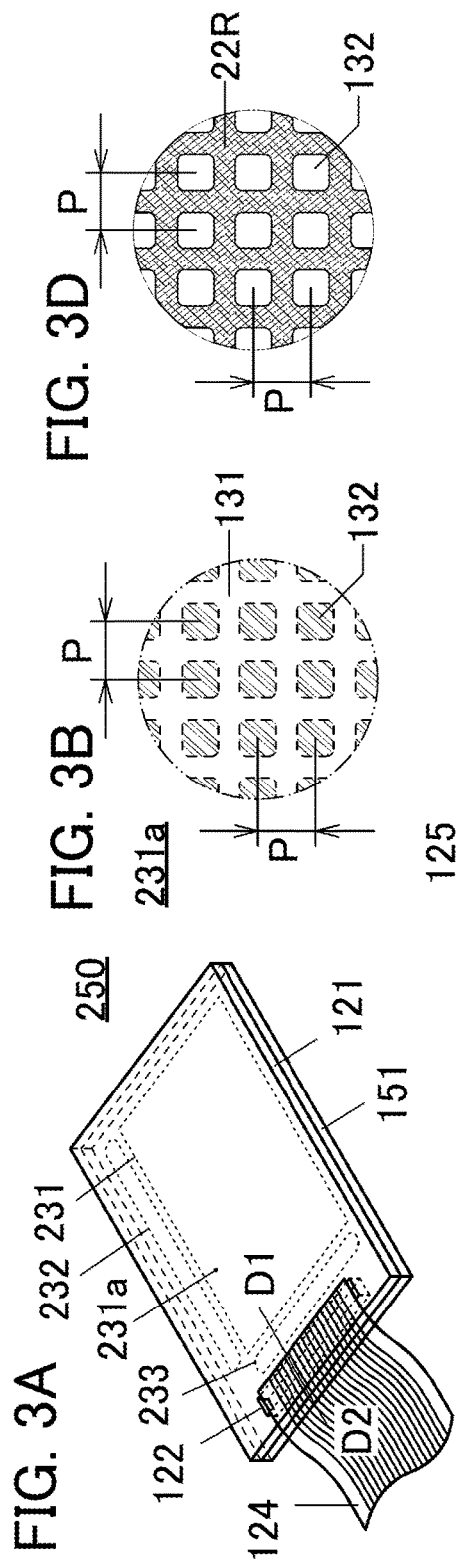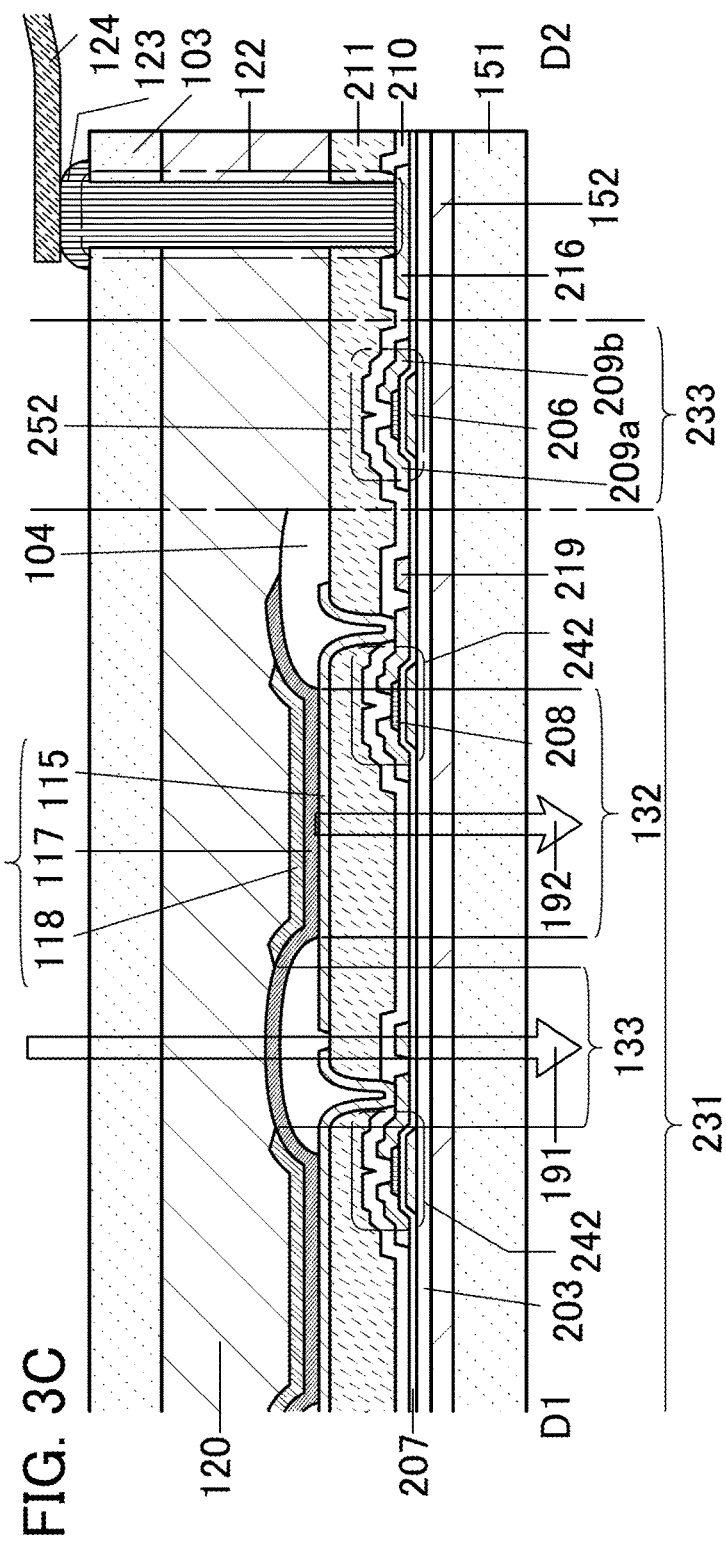

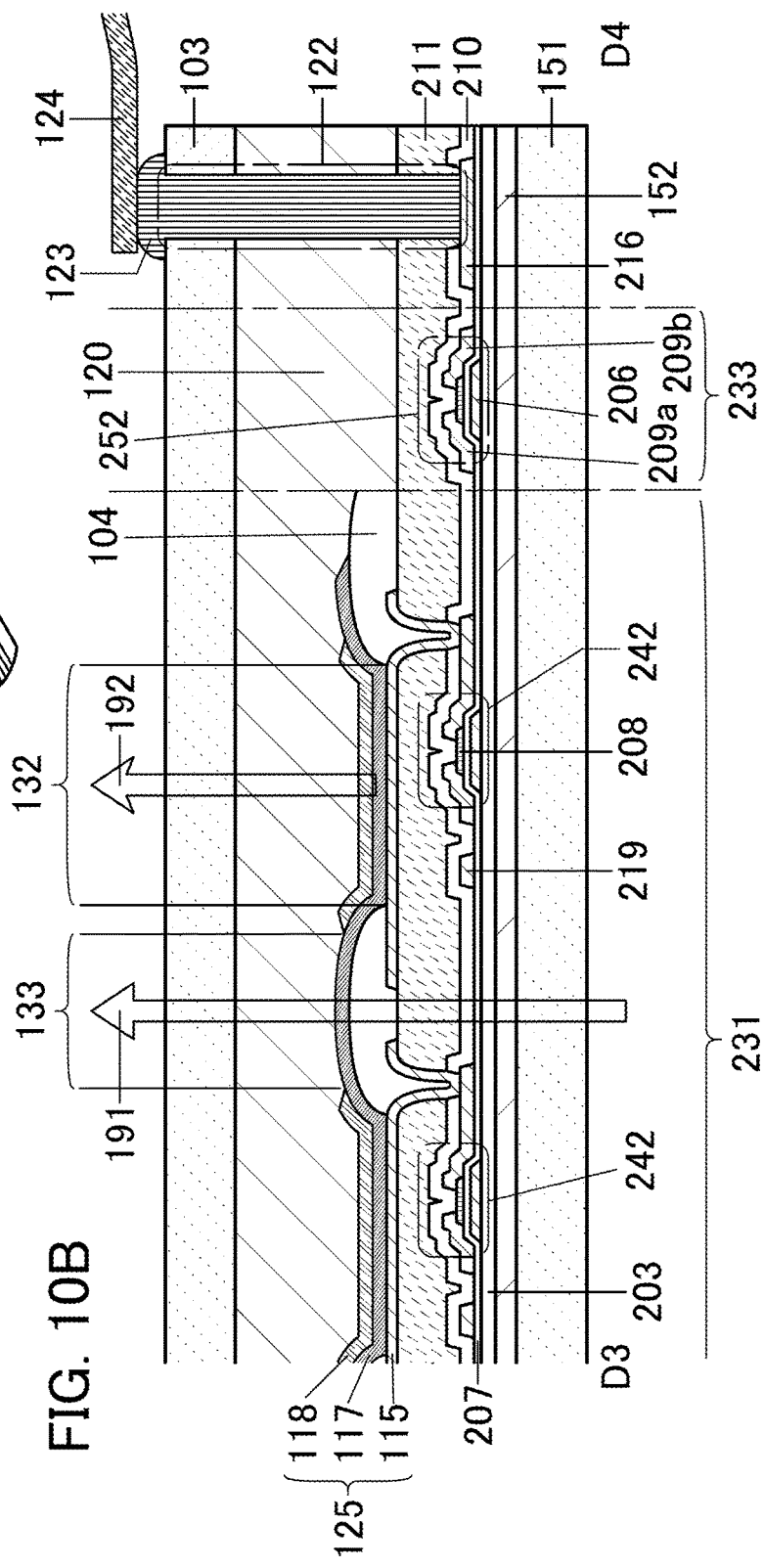

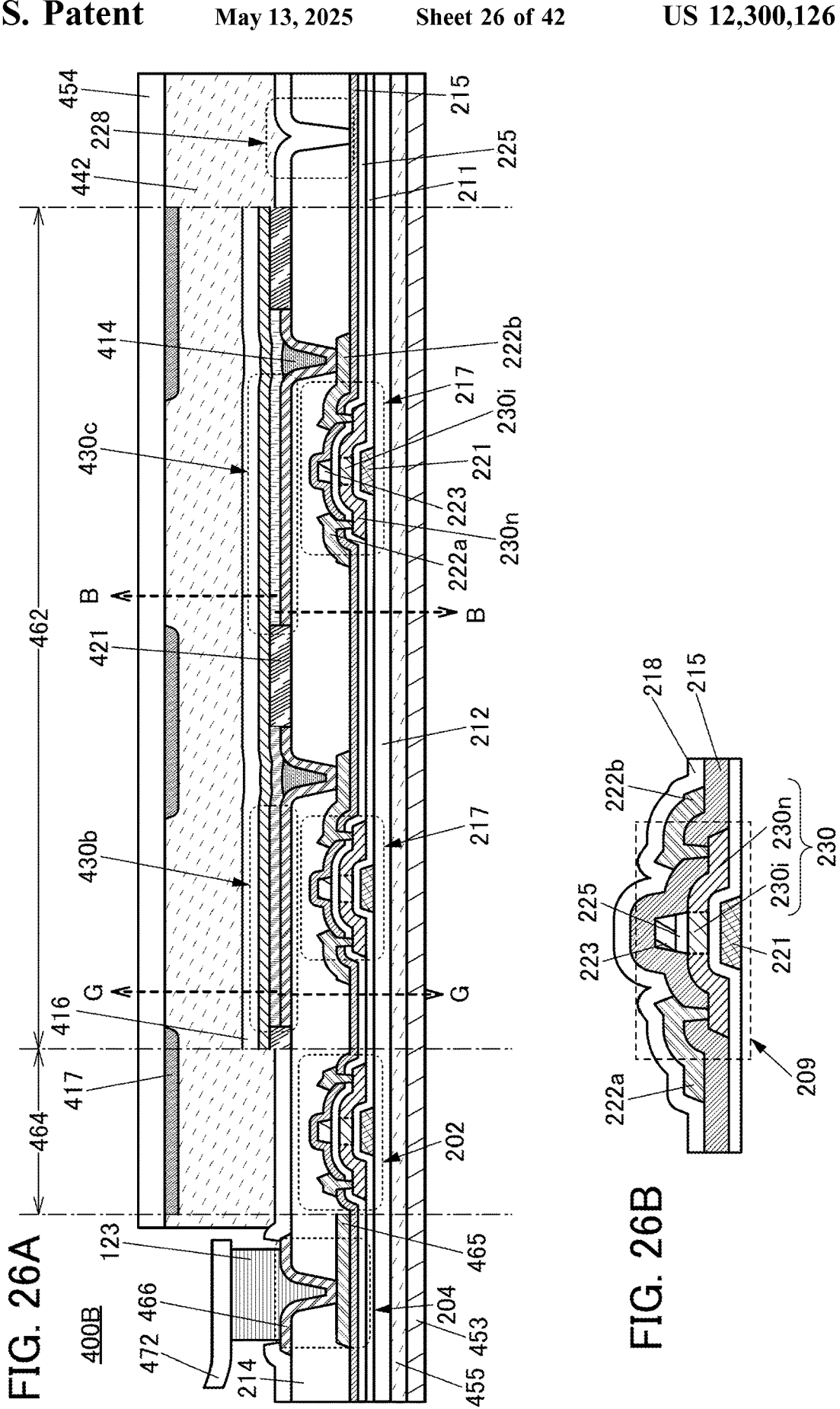

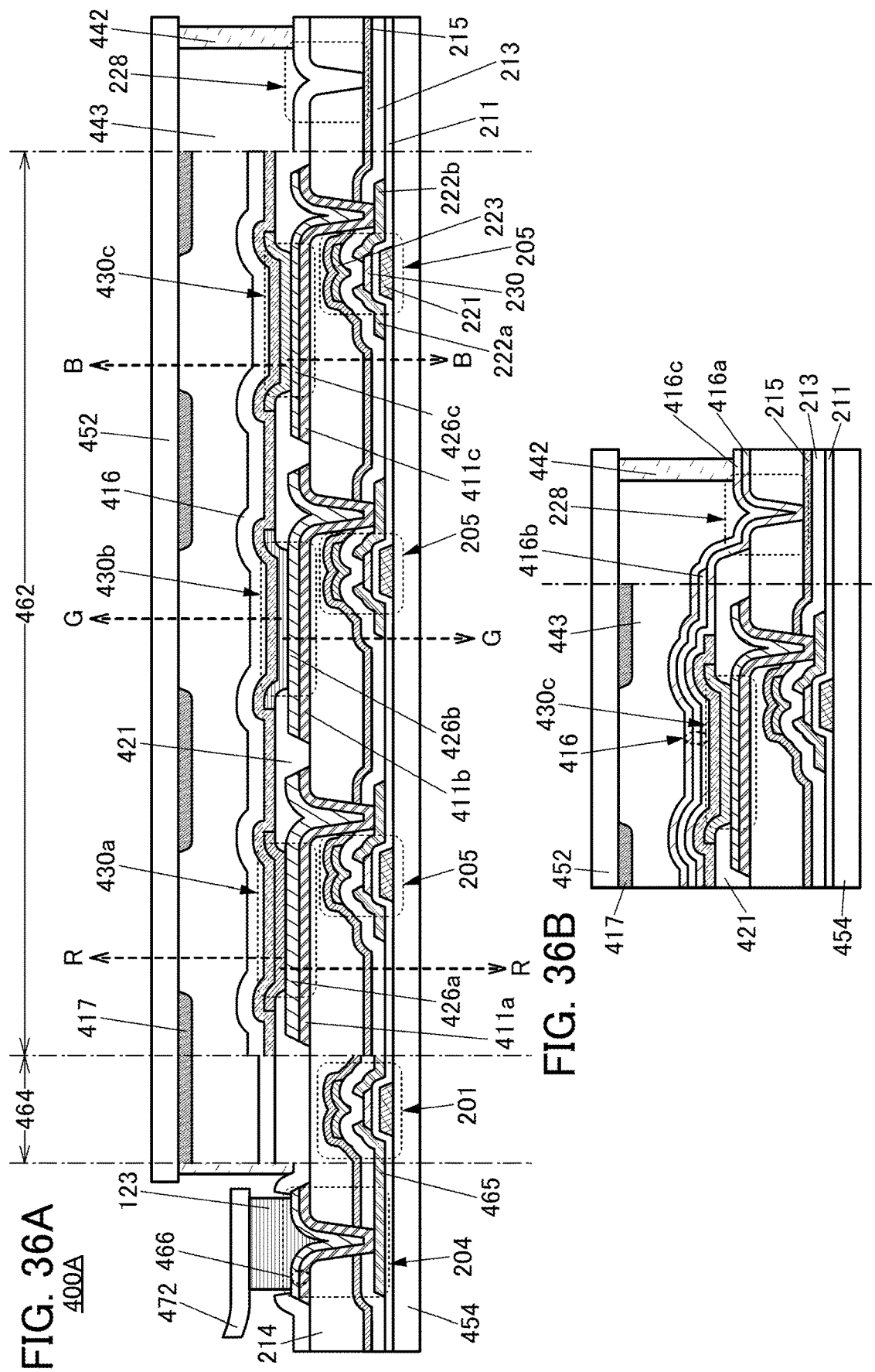

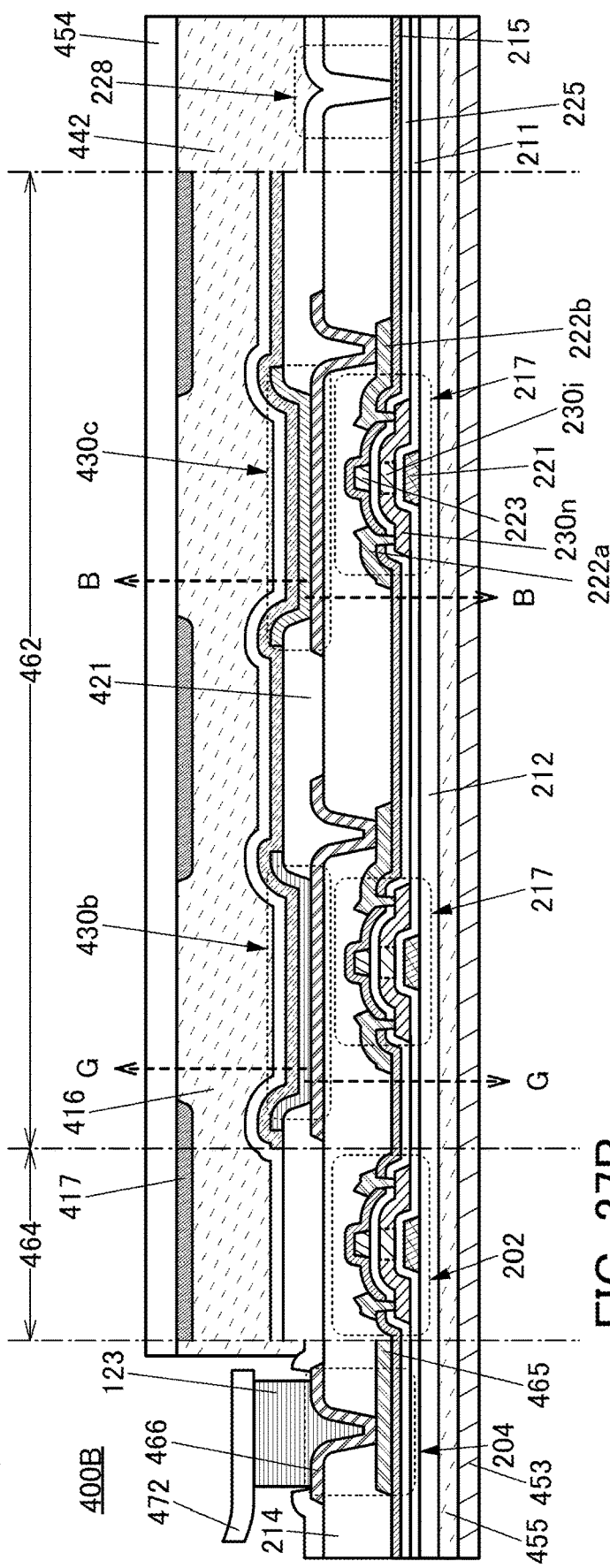
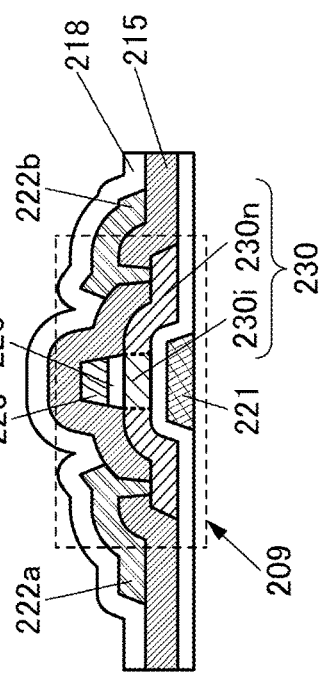
FIG. 37A
FIG. 37B

DISPLAY DEVICE, MANUFACTURING METHOD THEREOF, AND VEHICLE

This application is a 371 of international application PCT/IB2021/060900 filed on Nov. 24, 2021, which is incorporated herein by reference.

TECHNICAL FIELD

One embodiment of the present invention relates to a display device. One embodiment of the present invention relates to a display device that can be mounted on a vehicle.

Note that one embodiment of the present invention is not limited to the above technical field. Examples of the technical field of one embodiment of the present invention disclosed in this specification include a semiconductor device, a display device, a light-emitting device, a lighting device, a power storage device, a memory device, a method for driving any of them, and a method for manufacturing any of them.

BACKGROUND ART

As for display devices in recent years, liquid crystal display devices, which can have small thicknesses and are advantageous in manufacturing cost and power consumption, are widely used as compared with display devices of other displaying modes (CRT or plasma television devices). Although transmissive liquid crystal display devices that use backlights are generally used, they have problems in display clarity and viewing angle as compared with display devices of other modes, and are being developed in various ways for improvement on a daily basis.

With regard to display clarity, LEDs are used as backlights, and optical films for color filters are being improved. Furthermore, liquid crystal elements of horizontal electric field mode are used to bring significantly improvement in viewing angle.

Display devices with organic EL elements are also being actively studied.

Note that Patent Document 1 to Patent Document 3 each disclose a dual-emission display device as a kind of display devices with organic EL elements.

Development is advanced so that a measuring instrument in a car is partly replaced with an organic EL display device. Approaches to supporting a driver at a car by displaying more information (information on the situation, traffic information, or geographic information around the car) have been taken.

Patent Document 4 discloses a dual-emission display device that is installed in a car.

REFERENCE

Patent Document

[Patent Document 1] Japanese Published Patent Application No. 2005-183006

[Patent Document 2] PCT International Publication No. 2004/061807

[Patent Document 3] PCT International Publication No. 2004-068910

[Patent Document 4] Japanese Published Patent Application No. 2005-67367

SUMMARY OF THE INVENTION

Problems to be Solved by the Invention

An object of one embodiment of the present invention is to provide a display device from which a driver or a fellow passenger in a mobile body such as a vehicle can easily obtain desired information. Another object is to provide a display device that is suitable for space saving and does not defile the interior of a vehicle. Another object is to provide a novel display device. Another object is to provide a highly reliable display device.

Note that the description of these objects does not preclude the existence of other objects. One embodiment of the present invention does not need to achieve all these objects. Other objects can be derived from the description of the specification.

Means for Solving the Problems

One embodiment of the present invention is a display device including a display panel and a first driving unit controlling the display panel. The display panel is placed inside a mobile body including window glass and includes a film including a light-blocking layer between the window glass and the display panel of the mobile body and a second driving unit that controls the film including the light-blocking layer.

In the above structure, the first driving unit changes the positional relationship between the window glass and the display panel. Specifically, the first driving unit changes a region where the window glass and the display panel overlap with each other in a direction from which the driver or the fellow passenger of the mobile body sees. By the first driving unit, the fellow passenger can make the display panel move (slide) to the position overlapping with the window glass, thereby seeing an image on the display panel. When a dual-emission display device in which a pair of electrodes of a light-emitting element has a light-transmitting property is used as the display panel, the outside view can be seen through the display panel and the window glass. In order to focus on the outside view, the fellow passenger can store away the display panel by the first driving unit to see the outside view through the window glass.

When a dual-emission display panel in which a pair of electrodes of a light-emitting element has a light-transmitting property is used as the display panel, the display seems to overlap with the outside view when seen from the fellow passenger sitting on the rear seat. Therefore, the display is not clear in some cases depending on the outside view or external light. In such a case, it is possible to improve the contrast by using a film including a light-blocking layer.

In the above structure, the second driving unit changes the positional relationship between the window glass and the film including the light-blocking layer. Specifically, the second driving unit changes a region where the window glass and the film including the light-blocking layer overlap with each other in a direction from which the driver or the fellow passenger of the mobile body sees. By the second driving unit, the film including the light-blocking layer can move (slide) to overlap with the display panel, whereby external light can be partly blocked and display of an image with high contrast is possible. The second driving unit and the film including the light-blocking layer are effective in the situation with intense external light in the daytime in which the contrast of the image on the dual-emission display device is reduced.

In the above structure, the film including the light-blocking layer is preferably stored away so as to be wound by the second driving unit so that it is suitable for space saving and does not defile the interior of the vehicle.

In the above structure, the display panel preferably includes a first substrate, a second substrate, a display portion including an organic light-emitting element, a sealing layer, and a protective layer.

In the above structure, a substrate having a high light-transmitting property, such as a glass substrate, can be used as each of the first substrate and the second substrate in the display panel; in particular, when a flexible film is used, the display panel can be flexible. In such a case, the display panel can be configured to be stored away so as to be wound by the first driving unit.

Although the above structure includes the first driving unit and the second driving unit, the structure may include only one of them. Furthermore, the display panel may be fixed to the inside surface of the window glass of the mobile body without providing the first driving unit or the second driving unit; in such a case, a flexible display panel is preferably used because the window glass has a curved surface.

In the above structure, the mobile body refers to a vehicle including at least window glass and refers to a motor vehicle, specifically, a fossil fuel motor vehicle provided with an engine that uses fossil fuel such as gasoline as fuel, or a next-generation clean energy motor vehicle, e.g., a hybrid vehicle (HV), an electric vehicle (EV), or a plug-in hybrid vehicle (PHV). The display device according to one embodiment of the present invention can also be mounted on agricultural machines such as electric tractors, motorized bicycles including motor-assisted bicycles, motorcycles, electric wheelchairs, electric carts, boats or ships, submarines, aircraft such as fixed-wing aircraft and rotary-wing aircraft, rockets, artificial satellites, space probes, planetary probes, or spacecraft.

In the above structure, a film including a stripe-shaped light-blocking layer or a film in which stripe-shaped light-block layers are placed to intersect each other like a grid pattern is preferably used as the film including the light-blocking layer. Instead of the film including the light-blocking layer, an optical film, e.g., a polarizing film, may be used.

In this specification, a device formed using a metal mask or a fine metal mask (FMM) may be referred to as a device having a metal mask (MM) structure. In this specification, a device formed without using a metal mask or an FMM may be referred to as a device having a metal maskless (MML) structure.

In this specification, a structure in which light-emitting layers in light-emitting devices of different colors (here, blue (B), green (G), and red (R)) are separately formed or separately patterned may be referred to as an SBS (Side By Side) structure. In this specification, a light-emitting device capable of emitting white light may be referred to as a white-light-emitting device. Note that a white light-emitting device that is combined with coloring layers (e.g., color filters) can be a light-emitting device of full-color display.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that their emission colors are complementary. For example, when the emission color of a first light-emitting layer and the emission color of a second light-emitting layer are complementary colors, the light-emitting device can be configured to emit white light as a whole. The same applies to a light-emitting device including three or more light-emitting layers.

A light-emitting device having a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In a device having a tandem structure, an intermediate layer such as a charge-generation layer is preferably provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Effect of the Invention

According to one embodiment of the present invention, a display device that is suitable for a mobile body can be provided. Alternatively, a display device which is suitable for space saving can be provided. Alternatively, a highly reliable display device can be provided.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 3A is a perspective view explaining one embodiment of a light-emitting device, FIG. 3B and FIG. 3D are each an enlarged view of part of a pixel portion, and FIG. 3C is a cross-sectional view explaining one embodiment of the light-emitting device.

FIG. 10A is a perspective view explaining one embodiment of a light-emitting device, and FIG. 10B is a cross-sectional view explaining the one embodiment of the light-emitting device.

FIG. 26A is a cross-sectional view showing an example of a display device, and FIG. 26B is an enlarged cross-sectional view of part of the display device.

FIG. 36A is a cross-sectional view showing an example of a display device, and FIG. 36B is an enlarged cross-sectional view of part of the display device.

FIG. 37A is a cross-sectional view showing an example of a display device, and FIG. 37B is an enlarged cross-sectional view of part of the display device.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Embodiment 1

Figure 1A:
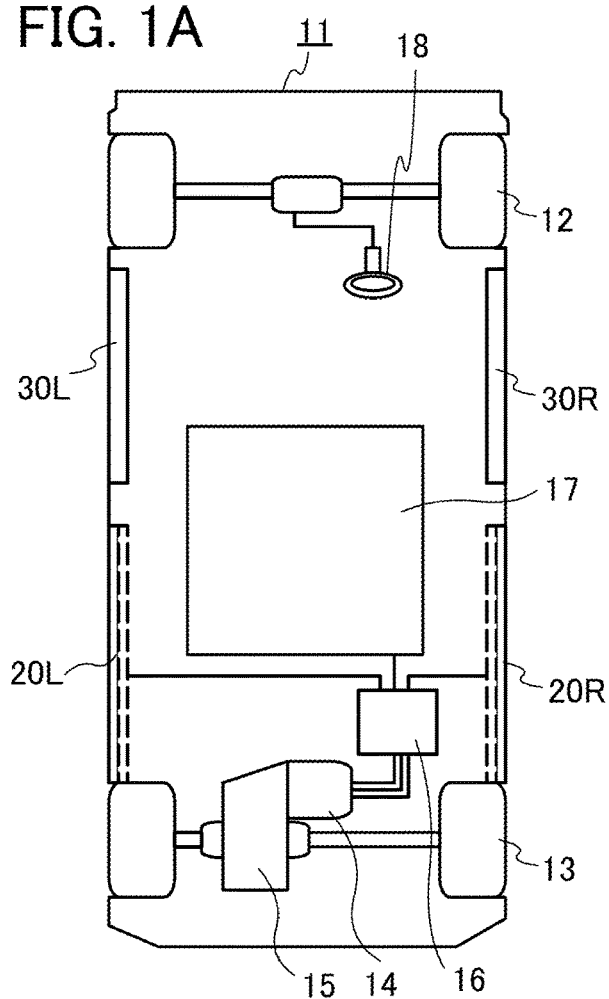
FIG. 1A is a schematic top view showing one embodiment of the present invention.

FIG. 1A is a schematic top view of an electric vehicle that is an example of a mobile body.

An electric vehicle 11 includes steering front wheels 12, driving rear wheels 13, a motor 14 for driving the two driving rear wheels 13, and a driving device such as a transmission 15 that distributes and sends driving power of the motor 14 to the two driving rear wheels 13. It is possible to change the orientation of the steering front wheels 12 by operating a wheel 18.

The motor 14 is an AC motor, and DC power of a secondary battery 17 is converted into AC power by an inverter 16 and supplied to the motor 14.

Window glass 30R is placed on a surface on the right side of the driver. Window glass 30L is placed on a surface on the left side of the passenger seat. The driver operates the wheel 18 and steps on an accelerator pedal (not shown), whereby a control circuit detects signals from an accelerator pedal stroke sensor (not shown) and controls an output of the motor 14 on the basis of the signals. The control of these signals is performed by a control circuit called an ECU (Electronic Control Unit). The ECU is connected to a CAN (Controller Area Network) provided in the electric vehicle. The CAN is a type of a serial communication standard used as an in-vehicle LAN. The ECU includes a microcomputer. Moreover, the ECU uses a CPU or a GPU. The ECU also controls charging or discharging of the secondary battery 17.

The secondary battery 17 is placed below the rear seat, and window glass 20R and window glass 20L are placed on surfaces on the right side and the left side of a fellow passenger sitting on the rear seat, respectively. A polarizing film may be used as a film 22R including a light-blocking layer. Since the external light is intense during driving in the daytime, display is more easily seen in the state where a display panel 21R and the film 22R including the light-blocking layer overlap with each other. During driving in the night time, the film 22R including the light-blocking layer is unnecessary, and thus display is more easily seen in the state where they do not overlap with each other. In the case where a window tinting film is always attached on the inside of the window, the film 22R including the light-blocking layer and a mechanism for moving it can be unnecessary.

Figure 1B:
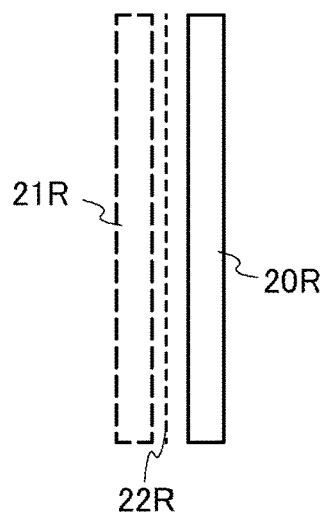
FIG. 1B is a partial enlarged view.

FIG. 1B is an enlarged top view of the vicinity of the window glass 20R.

When seen from the fellow passenger sitting on the rear seat, the display panel 21R is placed to overlap with the window glass 20R and the film 22R including the light-blocking layer is placed between the display panel 21R and the window glass 20R.

In this embodiment, a dual-emission display device with a structure called a dual-emission structure is preferably used as the display panel 21R. Note that the dual-emission display device refers to a structure in which a pair of electrodes of a light-emitting element in a bottom-emission structure or a top-emission structure has a light-transmitting property.

When a dual-emission display device is used as the display panel 21R, the display seems to overlap with the outside view when seen from the fellow passenger sitting on the rear seat. Therefore, the display is not clear in some cases depending on the outside view or external light. In such a case, it is possible to improve the contrast by using the film 22R including the light-blocking layer.

Figure 1C:
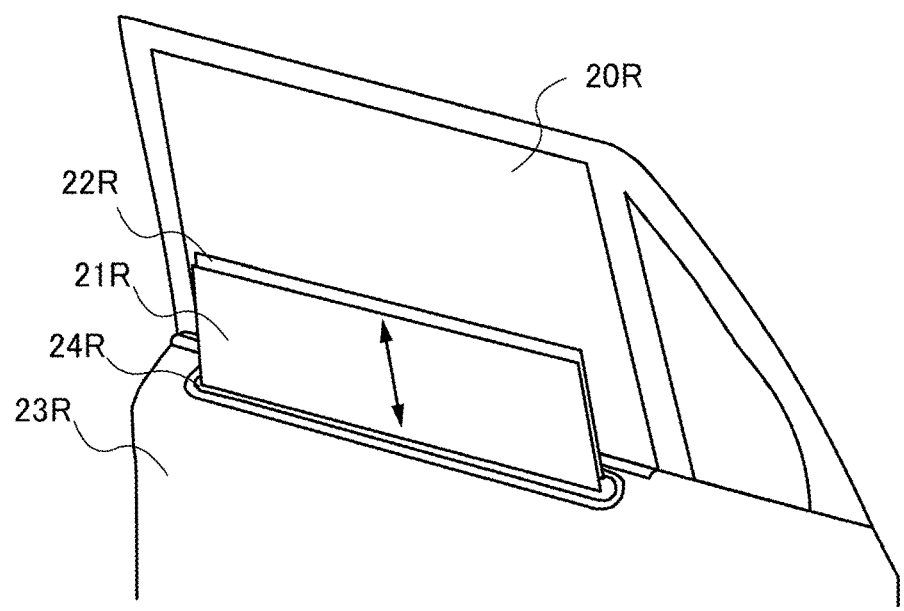
FIG. 1C is a perspective view of a display device seen from the inside of a vehicle.

FIG. 1C is a perspective view seen from the fellow passenger sitting on the rear seat. The figure shows that the display panel 21R is placed on a rear door provided with the window glass 20R and there is a region where the film 22R including the light-blocking layer and the window glass 20R overlap with each other. The film 22R including the light-blocking layer and the display panel 21R protrude from an opening portion 24R provided on a door trim 23R.

Although the display panel 21R overlaps with about the half of the window glass 20R in the example shown in FIG. 1C for easy understanding, the position of the display panel 21R can be moved by a first driving unit described later so as to overlap with most of the window glass.

The display panel 21R is not necessarily stored away completely, and may be placed so as to be partly exposed all the time.

Figure 2A:
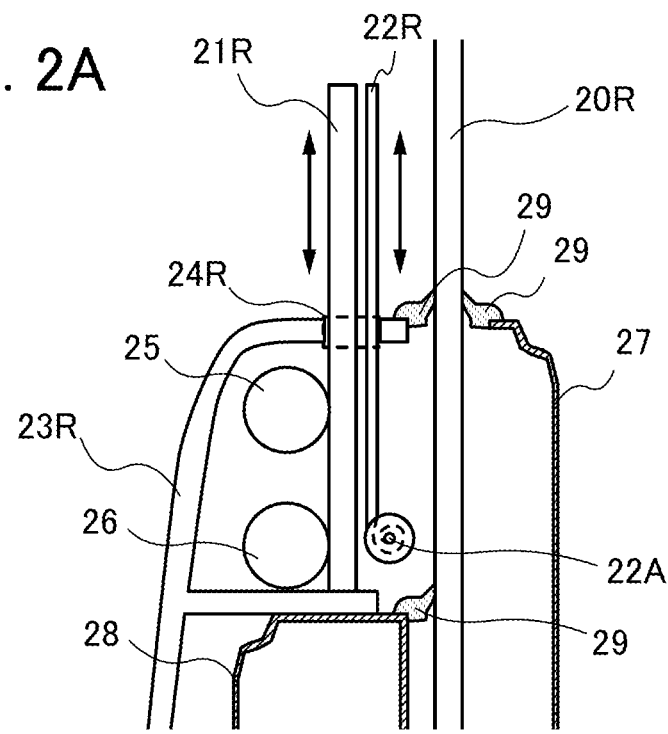
FIG. 2A is a cross-sectional view showing one embodiment of the present invention.

FIG. 2A shows a cross-sectional structure diagram of the door trim 23R and the vicinity of the window glass 20R. Note that the window glass 20R having a flat surface is shown for simplification; however, the window glass 20R actually has a curved surface along the car body.

The opening portion 24R is provided in the upper portion of the door trim 23R, and a mechanism that makes the display panel 21R and the film 22R including the light-blocking layer protrude from the opening portion 24R or stores them is provided.

A first driving unit that is structured with rollers 25 and 26 and a motor (not shown) for rotating the rollers 25 and 26 so that the display panel 21R and the window glass 20R overlap with each other when seen from the fellow passenger on the rear seat is provided. By the first driving unit, the display panel 21R is moved up and down. The first driving unit is placed in a space provided between the window glass 20R and the door trim 23R. A rigid plastic material is used for the door trim 23R.

The film 22R including the light-blocking layer is wound to a winding shaft 22A, and a second driving unit that is structured with a motor (not shown) for rotating the winding shaft 22A or a fixing portion (not shown) is provided. The second driving unit is placed in a space provided between the window glass 20R and the door trim 23R.

An exterior body part 27 of the vehicle is provided on the outside of the window glass 20R in FIG. 2A, and a rubber component 29 is provided between the exterior body part 27 and the window glass 20R to prevent rain water from entering a gap therebetween. The rubber component 29 is also provided between the window glass 20R and the door trim 23R. The exterior body part 27 is formed using the same metal material as an interior body part 28 and functions as a frame of the door.

A touch input panel may be further provided in the display panel 21R. The touch input panel enables the fellow passenger to adjust the position of the display panel freely.

Figure 2B:
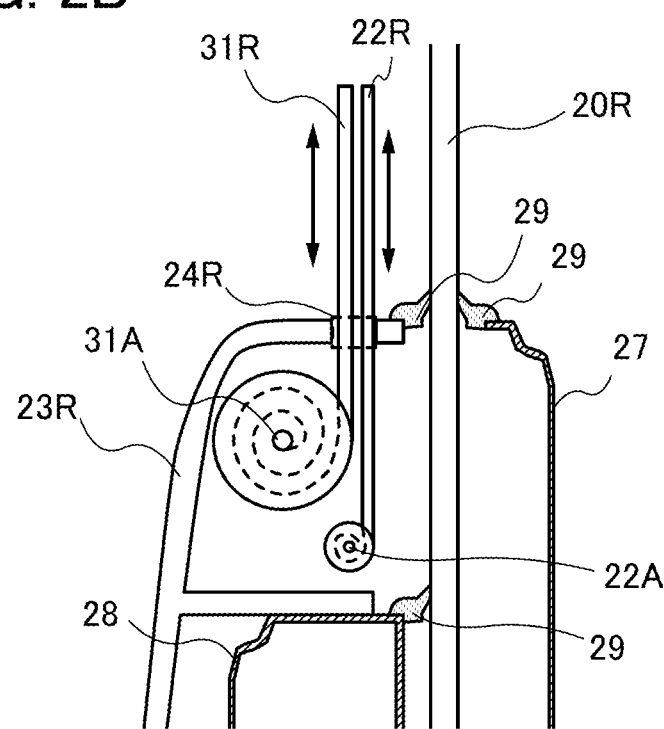
FIG. 2B is a cross-sectional view showing a modification example.

To store away the display panel 21R completely, a flexible display panel 31R is preferably employed. FIG. 2B shows a modification example of FIG. 2A.

In FIG. 2B, the same portions as those in FIG. 2A are denoted by the same reference numerals, and description of the same portions is omitted.

FIG. 2B shows the flexible display panel 31R that can be wound to a winding shaft 31A. A first driving unit that is structured with a motor (not shown) for rotating the winding shaft 31A so that flexible display panel 31R and the window glass 20R overlap with each other when seen from the fellow passenger on the rear seat is provided.

The thickness of the flexible display panel 31R can be small to reduce the area of the opening portion 24R provided on the door trim 23R, which is preferable. Furthermore, the flexible display panel 31R requires only a small space for storage; thus, it can be stored inside the door trim 23R.

Although the right hand drive vehicle is shown as the example in this embodiment, the vehicle is not particularly limited thereto. In addition, although the electric vehicle using a secondary battery is shown as the example, the vehicle is not particularly limited thereto.

Although the display panel used by the fellow passenger on the rear seat is shown as the example, the display panel is not limited thereto; the display panel may be used by the driver on the driver seat. In such a case, the display panel and the film including the light-blocking layer are placed near the window glass 30R.

Embodiment 2

In this embodiment, a display panel 250 corresponding to the flexible display panel 31R described in Embodiment 1 will be described with reference to FIG. 3 to FIG. 12. FIG. 3A is a perspective view of the display panel 250. The display panel 250 described in this embodiment includes a display region 231, a driver circuit 232, and a driver circuit 233. FIG. 3B is an enlarged view of part of the display region 231, which is shown as a portion 231a in FIG. 3A. FIG. 3C is a cross-sectional view of a portion indicated by a dashed-dotted line D1-D2 in FIG. 3A.

<Structure Example of Light-Emitting Device>

In this embodiment, a light-emitting device having a bottom-emission structure is described as an example of the display panel 250. The display panel 250 includes a plurality of light-emitting portions 132 arranged in a matrix. The plurality of light-emitting portions 132 are arranged in a matrix in the display region 231. The light-emitting portion 132 includes a light-emitting element 125 including an electrode 115, an EL layer 117, and an electrode 118. A transistor 242 that controls the amount of light emitted by the light-emitting element 125 is connected to each of the light-emitting elements 125. In the display region 231, a region where the light-emitting portions 132 are not formed includes a region which transmits visible light. In the display region 231, a region which transmits visible light is called a light-transmitting portion 133. In this embodiment, an example of a light-blocking pattern of the film 22R having the light-blocking layer that overlaps with the light-transmitting portion 133 is shown in FIG. 3D. The display panel 250 described as an example in this embodiment functions as an active-matrix display device.

The display panel 250 includes a terminal electrode 216. The terminal electrode 216 is electrically connected to an external electrode 124 through an anisotropic conductive connection layer 123. In addition, the terminal electrode 216 is electrically connected to the driver circuit 232 and the driver circuit 233.

The driver circuit 232 and the driver circuit 233 are formed with a plurality of transistors 252. The driver circuit 232 and the driver circuit 233 each have a function of determining which of the light-emitting elements 125 in the display region 231 is supplied with a signal from the external electrode 124.

The transistor 242 and the transistor 252 each include a gate electrode 206, a gate insulating layer 207, a semiconductor layer 208, a source electrode 209a, and a drain electrode 209b. A wiring 219 is formed in the same layer as the source electrode 209a and the drain electrode 209b. In addition, an insulating layer 210 is formed over the transistor 242 and the transistor 252, and an insulating layer 211 is formed over the insulating layer 210. The electrode 115 is formed over the insulating layer 211. The electrode 115 is electrically connected to the drain electrode 209b through an opening formed in the insulating layer 210 and the insulating layer 211. A partition 104 is formed over the electrode 115, and the EL layer 117 and the electrode 118 are formed over the electrode 115 and the partition 104.

In the display panel 250, a substrate 151 and a substrate 103 are bonded to each other with an adhesive layer 120 therebetween.

An insulating layer 203 is formed over the substrate 151 with an adhesive layer 152 therebetween. The insulating layer 203 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 203 can be formed by a sputtering method, a CVD method, a thermal oxidation method, a coating method, or a printing method.

Note that the insulating layer 203 functions as a base layer and can prevent or reduce diffusion of moisture or impurity elements from the substrate 151 or the adhesive layer 152 to the transistor or the light-emitting element.

In the display panel 250 described as an example in this embodiment, when light at given luminance is emitted or not emitted from the plurality of light-emitting elements 125, characters or images can be displayed on the display region 231. Thus, the display panel 250 described in this embodiment can function not only as a lighting device but also as a display device.

According to one embodiment of the present invention, a display device with high display quality can be achieved. According to one embodiment of the present invention, a display device with low power consumption can be achieved.

The percentage (also referred to as "light transmittance") of the area occupied by the light-transmitting portion 133 in the area occupied by the display region 231 is preferably 80% or less, further preferably 50% or less, still further preferably 20% or less. Light emission from the display region 231 can be made more uniform as the light transmittance gets lower; accordingly, an image having a high display quality can be displayed. On the other hand, when the light transmittance is high, the state of the substrate 103 side can be viewed more clearly.

In FIG. 3B, a distance between the centers of two adjacent light-emitting portions 132 is denoted by a pitch P. When the pitch P is made small, the state of the substrate 103 side can be viewed more clearly. Moreover, when the pitch P is made small, light emission from the light-emitting portion 132 can be made more uniform. The pitch P is preferably 1 cm or less, further preferably 5 mm or less, still further preferably 1 mm or less.

When the number of light-emitting portions 132 per inch is 200 or more (200 dpi or more; approximately 127 μm or less on the basis of the pitch P), preferably 300 or more (300 dpi or more; approximately 80 μm or less on the basis of the pitch P), the uniformity of light emitted from the light-emitting portions 132 and the visibility of the substrate 103 side can be made favorable. Moreover, an image having a high display quality can be displayed.

In addition, a microlens array or a light diffusing film may be provided in a position overlapping with the light-emitting portion 132.

Note that although the light-emitting device having a bottom-emission structure is described as an example in this embodiment, a light-emitting device having a top-emission structure or a dual-emission structure may be used.

<Example of Pixel Circuit>

Figure 4A:
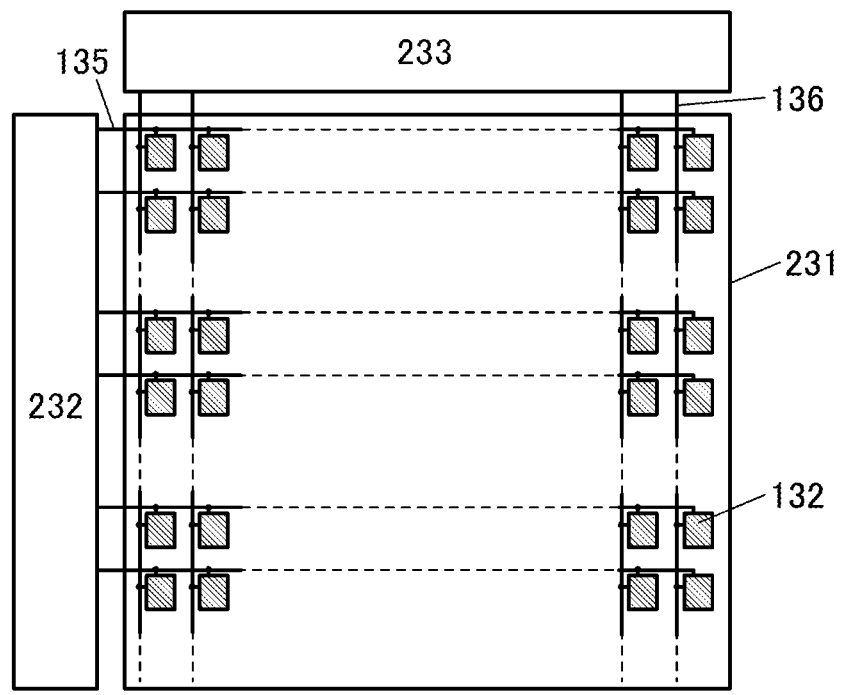
FIG. 4A is a block diagram explaining one embodiment of a light-emitting device.

Next, a more specific structural example of the display panel 250 is described with reference to FIG. 4. FIG. 4A is a block diagram for explaining the structure of the display panel 250. The display panel 250 includes the display region 231, the driver circuit 232, and the driver circuit 233. The driver circuit 232 functions as, for example, a scan line driver circuit. The driver circuit 233 functions as, for example, a signal line driver circuit.

The display panel 250 includes m scan lines 135 that are arranged parallel or substantially parallel to each other and whose potentials are controlled by the driver circuit 232, and n signal lines 136 that are arranged parallel or substantially parallel to each other and whose potentials are controlled by the driver circuit 233. In addition, the display region 231 includes a plurality of light-emitting portions 132 arranged in a matrix. The driver circuit 232 and the driver circuit 233 are collectively referred to as a driver circuit portion in some cases.

Each of the scan lines 135 is electrically connected to the n light-emitting portions 132 in the corresponding row among the light-emitting portions 132 arranged in m rows and n columns in the display region 231. Each of the signal lines 136 is electrically connected to the m light-emitting portions 132 in the corresponding column among the light-emitting portions 132 arranged in m rows and n columns. Note that m and n are each an integer of 1 or more.

[Example of Pixel Circuit for Light-Emitting Display Device]

Figure 4B:
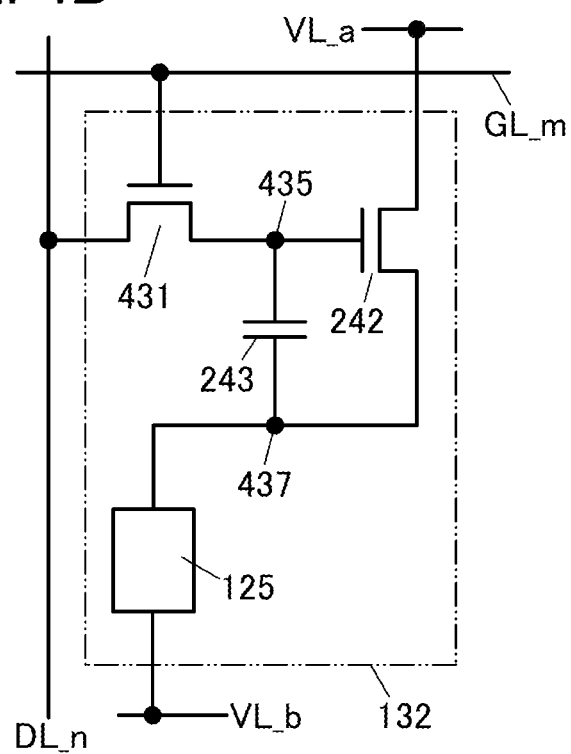
FIG. 4B is a pixel circuit diagram of the light-emitting device.

FIG. 4B shows a circuit structure that can be used for the light-emitting portions 132 in the display device shown in FIG. 4A. The light-emitting portion 132 shown in FIG. 4B includes a transistor 431, a capacitor 243, the transistor 242, and the light-emitting element 125.

One of a source electrode and a drain electrode of the transistor 431 is electrically connected to a wiring supplied with a data signal (hereinafter referred to as a signal line DL n). A gate electrode of the transistor 431 is electrically connected to a wiring supplied with a gate signal (hereinafter referred to as a scan line GL m).

The transistor 431 has a function of controlling writing of the data signal to a node 435.

One of a pair of electrodes of the capacitor 243 is electrically connected to the node 435, and the other is electrically connected to a node 437. The other of the source electrode and the drain electrode of the transistor 431 is electrically connected to the node 435.

The capacitor 243 has a function of a storage capacitor for retaining data written to the node 435.

One of a source electrode and a drain electrode of the transistor 242 is electrically connected to a potential supply line VL_a, and the other is electrically connected to the node 437. A gate electrode of the transistor 242 is electrically connected to the node 435.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) can be used, for example. Note that the light-emitting element 125 is not limited thereto; an inorganic EL element formed of an inorganic material may be used.

Note that a high power supply potential VDD is supplied to one of the potential supply line VL_a and the potential supply line VL_b, and a low power supply potential VSS is supplied to the other.

In the display device including the light-emitting portion 132 in FIG. 4B, the light-emitting portions 132 are sequentially selected row by row by the driver circuit 232, whereby the transistors 431 are turned on and data signals are written to the nodes 435.

When the transistors 431 are turned off, the light-emitting portions 132 in which the data has been written to the nodes 435 are brought into a holding state. Furthermore, the amount of current flowing between the source electrode and the drain electrode of the transistor 242 is controlled in accordance with the potential of the data written to the node 435, and the light-emitting element 125 emits light with a luminance corresponding to the amount of current flow. This operation is sequentially performed row by row; thus, an image can be displayed.

Note that as the display element, a display element other than the light-emitting element 125 can be used. For example, a liquid crystal element, an electrophoretic element, an electronic ink, an electrowetting element, MEMS (micro electro mechanical systems), a digital micromirror device (DMD), a DMS (digital micro shutter), or an IMOD (interferometric modulation) element can be used as the display element.

<Manufacturing Process Example 1 of Light-Emitting Device>

Next, an example of a process for manufacturing the display panel 250 will be described with reference to FIGS. 5 to 22. FIGS. 5 to 22 are diagrams corresponding a cross section of the portion indicated by the dashed-dotted line D1-D2 in FIG. 3A.

[Formation of Separation Layer 153]

Figure 5A:
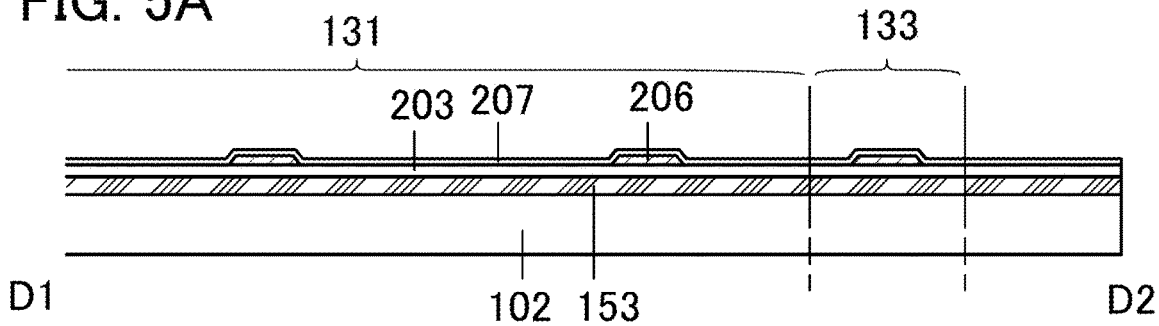
FIG. 5A to FIG. 5E are cross-sectional views explaining an example of a method for manufacturing a light-emitting device.
Figure 5B:
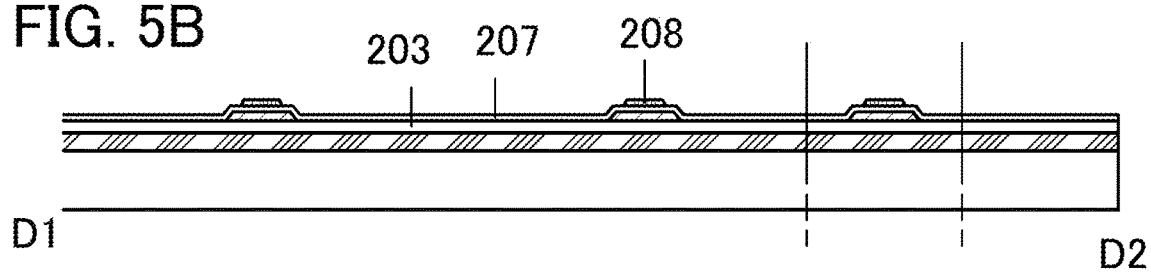

First, a separation layer 153 is formed over an element formation substrate 102 (see FIG. 5A). Note that the element formation substrate 102 may be a glass substrate, a quartz substrate, a sapphire substrate, a ceramic substrate, a metal substrate, or the like. Alternatively, a plastic substrate having heat resistance to the processing temperature in this embodiment may be used.

For the glass substrate, a glass material such as aluminosilicate glass, aluminoborosilicate glass, or barium borosilicate glass is used, for example. By containing a large amount of barium oxide (BaO), the glass substrate can be heat-resistant and more practical. Alternatively, crystallized glass can be used.

The separation layer 153 can be formed using an element selected from tungsten, molybdenum, titanium, tantalum, niobium, nickel, cobalt, zirconium, ruthenium, rhodium, palladium, osmium, iridium, and silicon, an alloy material containing any of the elements, or a compound material containing any of the elements. The separation layer 153 can be formed to have a single-layer structure or a stacked-layer structure using any of these materials. Note that the crystalline structure of the separation layer 153 may be amorphous, microcrystalline, or polycrystalline. Furthermore, the separation layer 153 can be formed using a metal oxide such as aluminum oxide, gallium oxide, zinc oxide, titanium dioxide, indium oxide, indium tin oxide, indium zinc oxide, or InGaZnO (IGZO).

The separation layer 153 can be formed by a sputtering method, a CVD method, a coating method, or a printing method. Note that a coating method includes a spin coating method, a droplet discharge method, and a dispensing method.

In the case where the separation layer 153 is formed to have a single-layer structure, tungsten, molybdenum, or a material containing tungsten and molybdenum is preferably used. Alternatively, in the case where the separation layer 153 is formed to have a single-layer structure, an oxide or oxynitride of tungsten, an oxide or oxynitride of molybdenum, or an oxide or oxynitride of a material containing tungsten and molybdenum is preferably used.

When the separation layer 153 has a stacked-layer structure including a layer containing tungsten and a layer containing an oxide of tungsten, the layer containing an oxide of tungsten may be formed as follows: an oxide insulating layer is formed in contact with the layer containing tungsten, so that the layer containing an oxide of tungsten is formed at the interface between the layer containing tungsten and the oxide insulating layer. Furthermore, the layer containing an oxide of tungsten may be formed by performing thermal oxidation treatment, oxygen plasma treatment, or treatment with a highly oxidizing solution such as ozone water on the surface of the layer containing tungsten.

In this embodiment, a glass substrate is used as the element formation substrate 102. As the separation layer 153, tungsten is formed over the element formation substrate 102 by a sputtering method.

[Formation of Insulating Layer 203]

Next, the insulating layer 203 is formed as a base layer over the separation layer 153 (see FIG. 5A). The insulating layer 203 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 203 may have, for example, a two-layer structure of silicon oxide and silicon nitride or a five-layer structure in which the above materials are combined. The insulating layer 203 can be formed by a sputtering method, a CVD method, a thermal oxidation method, a coating method, or a printing method.

The thickness of the insulating layer 203 is greater than or equal to 30 nm and less than or equal to 500 nm, preferably greater than or equal to 50 nm and less than or equal to 400 nm.

The insulating layer 203 can prevent or reduce diffusion of impurity elements from the element formation substrate 102 or the separation layer 153. Even after the element formation substrate 102 is replaced by the substrate 151, the insulating layer 203 can prevent or reduce diffusion of impurity elements into the light-emitting element 125 from the substrate 151 or the adhesive layer 152. In this embodiment, as the insulating layer 203, a stacked-layer film of a 200-nm-thick silicon oxynitride and a 50-nm-thick silicon nitride oxide is formed by a plasma CVD method.

[Formation of Gate Electrode 206]

Next, the gate electrode 206 is formed over the insulating layer 203 (see FIG. 5A). The gate electrode 206 can be formed using a metal element selected from aluminum, chromium, copper, tantalum, titanium, molybdenum, and tungsten, an alloy containing any of the above metal elements as its component; or an alloy containing any of the above metal elements in combination. Furthermore, one or more metal elements selected from manganese and zirconium may be used. The gate electrode 206 may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which an aluminum film is stacked over a titanium film and a titanium film is stacked thereover, and the like can be given. Alternatively, an alloy film or a nitride film in which aluminum and one or more elements selected from titanium, tantalum, tungsten, molybdenum, chromium, neodymium, and scandium are combined may be used.

For the gate electrode 206, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used. A stacked-layer structure of the above-described light-transmitting conductive material and the above-described metal element may be employed.

First, a conductive film to be the gate electrode 206 is stacked over the insulating layer 203 by a sputtering method, a CVD method, or an evaporation method, and a resist mask is formed over the conductive film by a photolithography process. Next, part of the conductive film to be the gate electrode 206 is etched with the use of the resist mask to form the gate electrode 206. At the same time, a wiring and another electrode can be formed.

The etching of the conductive film may be performed by either one or both of a dry etching method and a wet etching method. Note that in the case where etching is performed by a dry etching method, ashing treatment is performed before the resist mask is removed, in which case the resist mask can be easily removed using a stripper.

Note that the gate electrode 206 may be formed by an electrolytic plating method, a printing method, or an inkjet method instead of the above formation method.

The thickness of the conductive film, i.e., the thickness of the gate electrode 206 is greater than or equal to 5 nm and less than or equal to 500 nm, preferably greater than or equal to nm and less than or equal to 300 nm, further preferably greater than or equal to 10 nm and less than or equal to 200 nm.

The gate electrode 206 is formed using a light-blocking conductive material, in which case external light can be prevented from reaching the semiconductor layer 208 from the gate electrode 206 side. As a result, a change in electrical characteristics of the transistor due to light irradiation can be reduced.

[Formation of Gate Insulating Layer 207]

Next, the gate insulating layer 207 is formed (see FIG. 5A). The gate insulating layer 207 is formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, or silicon nitride.

When a high-k material such as hafnium silicate (HfSiO$_x$), hafnium silicate to which nitrogen is added (HfSi$_x$O$_y$N$_x$), hafnium aluminate to which nitrogen is added (HfAl$_x$O$_y$N$_x$), hafnium oxide, or yttrium oxide is used for the gate insulating layer 207, gate leakage of the transistor can be reduced. For example, a stacked layer of silicon oxynitride and hafnium oxide may be used.

The thickness of the gate insulating layer 207 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The gate insulating layer 207 can be formed by a sputtering method, a CVD method, or an evaporation method.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

The gate insulating layer 207 can have a stacked-layer structure in which a nitride insulating layer and an oxide insulating layer are stacked in this order from the gate electrode 206 side. When the nitride insulating layer is provided on the gate electrode 206 side, hydrogen, nitrogen, an alkali metal, or an alkaline earth metal can be prevented from moving from the gate electrode 206 side to the semiconductor layer 208. Note that nitrogen, an alkali metal, or an alkaline earth metal generally serves as an impurity element of a semiconductor. In addition, hydrogen serves as an impurity element of an oxide semiconductor. Thus, an "impurity" in this specification includes hydrogen, nitrogen, an alkali metal, or an alkaline earth metal.

In the case where an oxide semiconductor is used for the semiconductor layer 208, defect states at the interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer, in which case defect states at the interface between the gate insulating layer 207 and the semiconductor layer 208 can be further reduced.

In the case where the gate insulating layer 207 is a stacked layer of a nitride insulating layer and an oxide insulating layer as described above, it is preferable that the nitride insulating layer be thicker than the oxide insulating layer.

The nitride insulating layer has a dielectric constant higher than that of the oxide insulating layer; therefore, an electric field generated from the gate electrode 206 can be efficiently transmitted to the semiconductor layer 208 even when the gate insulating layer 207 has a large thickness. When the gate insulating layer 207 has a large total thickness, the withstand voltage of the gate insulating layer 207 can be increased. Thus, the reliability of the light-emitting device can be increased.

The gate insulating layer 207 can have a stacked-layer structure in which a first nitride insulating layer with few defects, a second nitride insulating layer with a high blocking property against hydrogen, and an oxide insulating layer are stacked in this order from the gate electrode 206 side. When the first nitride insulating layer with few defects is used in the gate insulating layer 207, the withstand voltage of the gate insulating layer 207 can be improved. Particularly when an oxide semiconductor is used for the semiconductor layer 208, the use of the second nitride insulating layer with a high blocking property against hydrogen in the gate insulating layer 207 makes it possible to prevent hydrogen contained in the gate electrode 206 and the first nitride insulating layer from moving to the semiconductor layer 208.

An example of a method of forming the first nitride insulating layer and the second nitride insulating layer is described below. First, as the first nitride insulating layer, a silicon nitride film with few defects is formed using a mixed gas of silane, nitrogen, and ammonia as a source gas by a plasma CVD method. Next, a mixed gas of silane and nitrogen is used as a source gas, so that a silicon nitride film in which the hydrogen concentration is low and which can block hydrogen is formed as the second nitride insulating layer. By such a formation method, the gate insulating layer 207 in which nitride insulating layers with few defects and a blocking property against hydrogen are stacked can be formed.

The gate insulating layer 207 can have a stacked-layer structure in which a third nitride insulating layer with a high blocking property against an impurity, the first nitride insulating layer with few defects, the second nitride insulating layer with a high blocking property against hydrogen, and the oxide insulating layer are stacked in this order from the gate electrode 206 side. When the third nitride insulating layer with a high blocking property against an impurity is provided in the gate insulating layer 207, hydrogen, nitrogen, alkali metal, or alkaline earth metal can be prevented from moving from the gate electrode 206 to the semiconductor layer 208.

An example of a method of forming the first nitride insulating layer to the third nitride insulating layer is described below. First, as the third nitride insulating layer, a silicon nitride film with a high blocking property against an impurity is formed using a mixed gas of silane, nitrogen, and ammonia as a source gas by a plasma CVD method. Next, the flow rate of ammonia is increased, so that a silicon nitride film with few defects is formed as the first nitride insulating layer. Next, a mixed gas of silane and nitrogen is used as a source gas, so that a silicon nitride film in which the hydrogen concentration is low and which can block hydrogen is formed as the second nitride insulating layer. By such a formation method, the gate insulating layer 207 in which nitride insulating layers with few defects and a blocking property against an impurity are stacked can be formed.

Moreover, in the case of forming a gallium oxide film as the gate insulating layer 207, an MOCVD (Metal Organic Chemical Vapor Deposition) method can be employed.

Note that the threshold voltage of the transistor can be changed by stacking the semiconductor layer 208 in which a channel of the transistor is formed and an insulating layer containing hafnium oxide with an oxide insulating layer positioned therebetween and injecting electrons into the insulating layer containing hafnium oxide.

[Formation of Semiconductor Layer 208]

The semiconductor layer 208 can be formed using an amorphous semiconductor, a microcrystalline semiconductor, or a polycrystalline semiconductor. For example, amorphous silicon or microcrystalline germanium can be used. Alternatively, a compound semiconductor such as silicon carbide, gallium arsenide, an oxide semiconductor, or a nitride semiconductor, or an organic semiconductor can be used.

The semiconductor layer 208 can be formed by a CVD method such as a plasma CVD method, an LPCVD method, a metal CVD method, or an MOCVD method, an ALD method, a sputtering method, or an evaporation method. Note that a formation surface can be less damaged when the semiconductor layer 208 is formed by a method without plasma, such as an MOCVD method.

The thickness of the semiconductor layer 208 is greater than or equal to 3 nm and less than or equal to 200 nm, preferably greater than or equal to 3 nm and less than or equal to 100 nm, further preferably greater than or equal to 3 nm and less than or equal to 50 nm. In this embodiment, as the semiconductor layer 208, a 30-nm-thick oxide semiconductor film is formed by a sputtering method.

Next, a resist mask is formed over the oxide semiconductor film, and part of the oxide semiconductor film is selectively etched using the resist mask to form the semiconductor layer 208. The formation of the resist mask can be performed by a photolithography method, a printing method, or an inkjet method as appropriate. Formation of the resist mask by an inkjet method needs no photomask; thus, fabrication cost can be reduced.

The etching of the oxide semiconductor film may be performed by either one or both of a dry etching method and a wet etching method. After the etching of the oxide semiconductor film, the resist mask is removed (see FIG. 5B).

[Formation of Source Electrode 209*a* and Drain Electrode 209*b*]

Figure 5C:
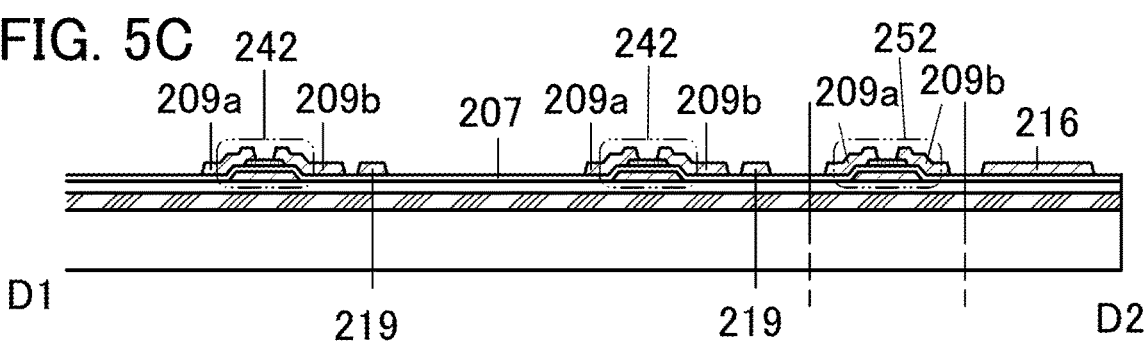

Next, the source electrode 209*a*, the drain electrode 209*b*, the wiring 219, and the terminal electrode 216 are formed (see FIG. 5C). First, a conductive film is formed over the gate insulating layer 207 and the semiconductor layer 208.

For the conductive film, a single-layer structure or a stacked-layer structure of a metal formed of aluminum, titanium, chromium, nickel, copper, yttrium, zirconium, molybdenum, silver, tantalum, or tungsten or an alloy containing any of the metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, a three-layer structure in which a copper film is stacked over a tungsten film and a tungsten film is formed thereover, and the like can be given.

Note that a conductive material containing oxygen, such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride, can also be used. Alternatively, a stacked-layer structure in which a material containing the above-described metal element and a conductive material containing oxygen are combined can be used. Alternatively, a stacked-layer structure in which a material containing the above-described metal element and a conductive material containing nitrogen are combined can be used. Alternatively, a stacked-layer structure in which a material containing the above-described metal element, a conductive material containing oxygen, and a conductive material containing nitrogen are combined can be used.

The thickness of the conductive film is greater than or equal to 5 nm and less than or equal to 500 nm, preferably greater than or equal to 10 nm and less than or equal to 300 nm, more preferably greater than or equal to 10 nm and less than or equal to 200 nm. In this embodiment, a 300-nm-thick indium tin oxide film is formed as the conductive film.

Then, part of the conductive film is selectively etched using a resist mask to form the source electrode 209a, the drain electrode 209b, the wiring 219, and the terminal electrode 216 (including other electrodes and wirings formed using the same layer). The formation of the resist mask can be performed by a photolithography method, a printing method, or an inkjet method. Formation of the resist mask by an inkjet method needs no photomask; thus, fabrication cost can be reduced.

The etching of the conductive film may be performed by either one or both of a dry etching method and a wet etching method. Note that an exposed portion of the semiconductor layer 208 is removed by the etching step in some cases. After the etching of the conductive film, the resist mask is removed.

With the source electrode 209a and the drain electrode 209b, the transistor 242 and the transistor 252 are formed.
[Formation of Insulating Layer]

Figure 5D:
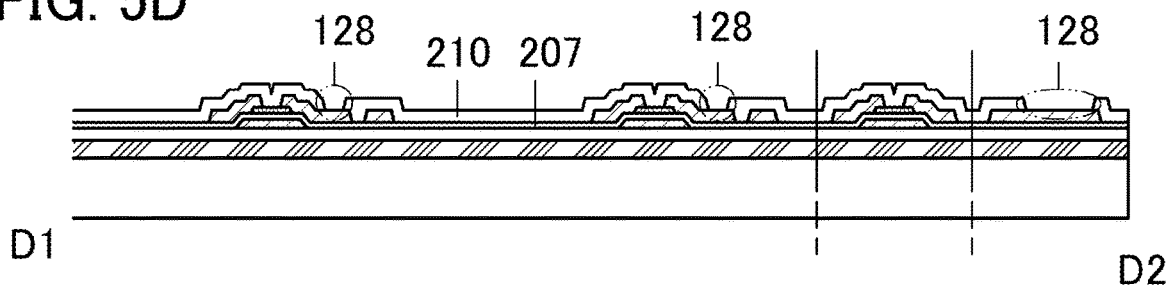

Next, the insulating layer 210 is formed over the source electrode 209a, the drain electrode 209b, the wiring 219, and the terminal electrode 216 (see FIG. 5D). The insulating layer 210 can be formed using a material and a method similar to those of the insulating layer 203.

In the case where an oxide semiconductor is used for the semiconductor layer 208, an insulating layer containing oxygen is preferably used for at least part of the insulating layer 210 which is in contact with the semiconductor layer 208. For example, in the case where the insulating layer 210 which is a stack including a plurality of layers, at least a layer that is in contact with the semiconductor layer 208 is preferably formed using silicon oxide.
[Formation of Opening 128]

Next, part of the insulating layer 210 is selectively etched using a resist mask to form an opening 128 (see FIG. 5D). At the same time, another opening that is not illustrated can also be formed. The formation of the resist mask can be performed by a photolithography method, a printing method, or an inkjet method as appropriate. Formation of the resist mask by an inkjet method needs no photomask; thus, fabrication cost can be reduced.

The etching of the insulating layer 210 may be performed by either one or both of a dry etching method and a wet etching method.

The drain electrode 209b and the terminal electrode 216 are partly exposed by the formation of the opening 128. The resist mask is removed after the formation of the opening 128.
[Formation of Insulating Layer 211]

Figure 5E:
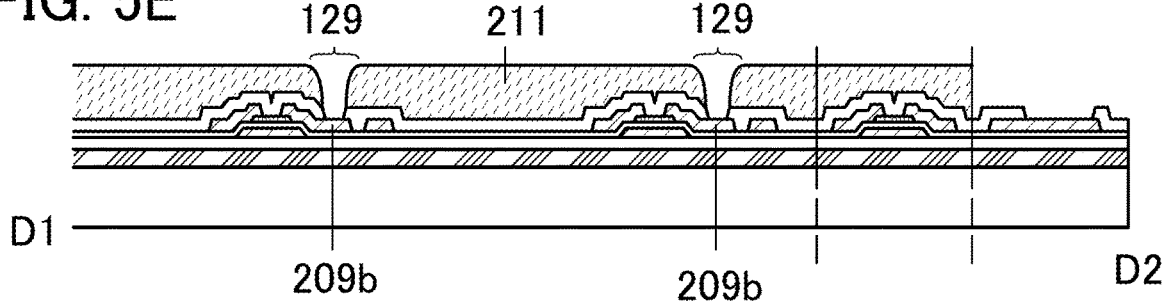

Next, the insulating layer 211 is formed over the insulating layer 210 (see FIG. 5E). The insulating layer 211 can be formed using a material and a method similar to those of the insulating layer 203.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

When the insulating layer 211 is formed using an insulating material with a planarization function, the polishing treatment can be omitted. As the insulating material with a planarization function, for example, an organic material such as a polyimide resin or an acrylic resin can be used. As an alternative to such an organic material, a low-dielectric constant material (a low-k material) can be used. Note that the insulating layer 211 may be formed by stacking a plurality of insulating layers formed of these materials.

Part of the insulating layer 211 in a region overlapping with the opening 128 is removed to form an opening 129 (see FIG. 5E). At the same time, another opening that is not illustrated can also be formed. In addition, the insulating layer 211 in a region to which the external electrode 124 is connected later is removed. Note that the opening 129 can be formed in such a manner that a resist mask is formed by a photolithography process over the insulating layer 211 and a region of the insulating layer 211 that is not covered with the resist mask is etched. A surface of the drain electrode 209b is exposed by the formation of the opening 129.

When the insulating layer 211 is formed using a photosensitive material, the opening 129 can be formed without the resist mask. In this embodiment, a photosensitive acrylic resin is used to form the insulating layer 211 and the opening 129.
[Formation of Electrode 115]

Figure 6A:
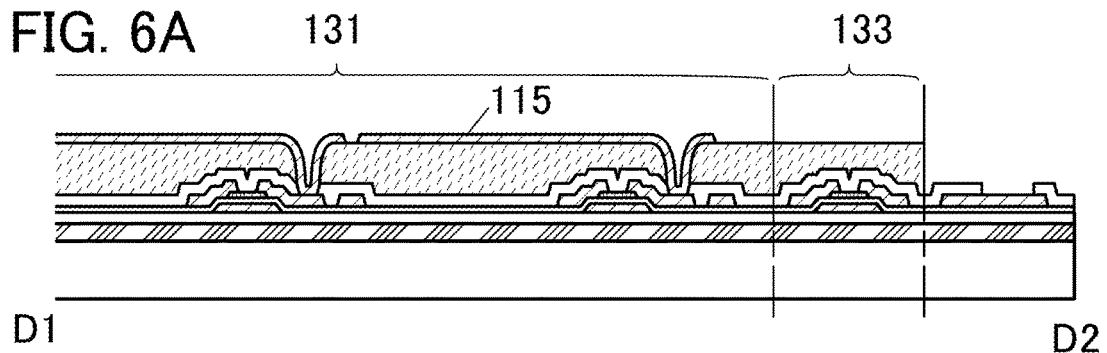
FIG. 6A to FIG. 6D are cross-sectional views explaining an example of a method for manufacturing a light-emitting device.

Next, the electrode 115 is formed over the insulating layer 211 (see FIG. 6A). The electrode 115 is preferably formed using a conductive material that transmits light emitted by the EL layer 117 formed later. For the electrode 115, a light-transmitting material having a larger work function than the EL layer 117, e.g., indium tin oxide is used. The electrode 115 may be formed by an electrolytic plating method, a printing method, or an inkjet method. Note that the electrode 115 may have a stacked-layer structure of a plurality of layers without limitation to a single-layer structure. For example, in the case where the electrode 115 is used as an anode, a layer that is in contact with the EL layer 117 may be a light-transmitting layer having a higher work function than the EL layer 117, such as indium tin oxide.

Note that although the display device having a bottom-emission structure is described as an example in this embodiment, a display device having a top-emission structure or a dual-emission structure may be used.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by a dry etching method, a wet etching method, or both a dry etching method and a wet etching method. The formation of the resist mask can be performed by a photolithography method, a printing method, or an inkjet method as appropriate. Formation of the resist mask by an inkjet method needs no photomask; thus, fabrication cost can be reduced. After the formation of the electrode 115, the resist mask is removed.

[Formation of Partition 104]

Figure 6B:
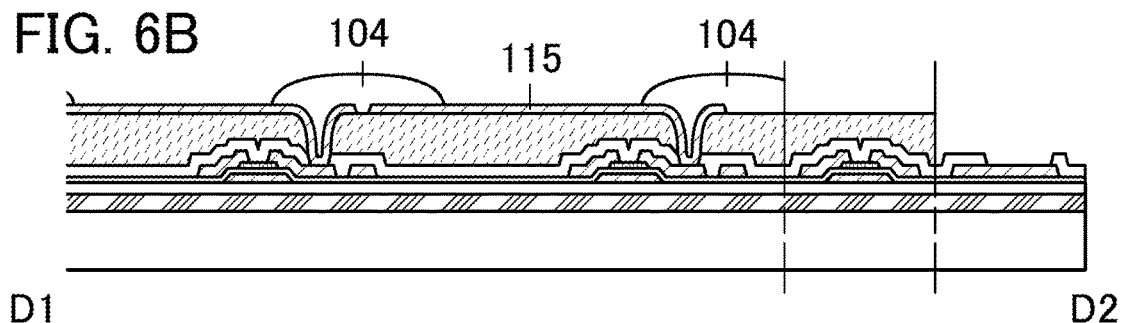

Next, the partition 104 is formed (see FIG. 6B). The partition 104 is provided to prevent an unintentional electric short-circuit between light-emitting elements 125 of adjacent light-emitting portions 132 and unintended light emission therefrom. The partition 104 also has a function of preventing the contact of a metal mask with the electrode 115 in the case where the metal mask is used to form the EL layer 117 described later. The partition 104 can be formed of an organic resin material such as an epoxy resin, an acrylic resin, or an imide resin or an inorganic material such as silicon oxide. The partition 104 is preferably formed so that its sidewall has a tapered shape or a tilted surface with a continuous curvature. The sidewall of the partition 104 having the above-described shape enables favorable coverage with the EL layer 117 or the electrode 118 formed later.

[Formation of EL Layer 117]

Figure 6C:
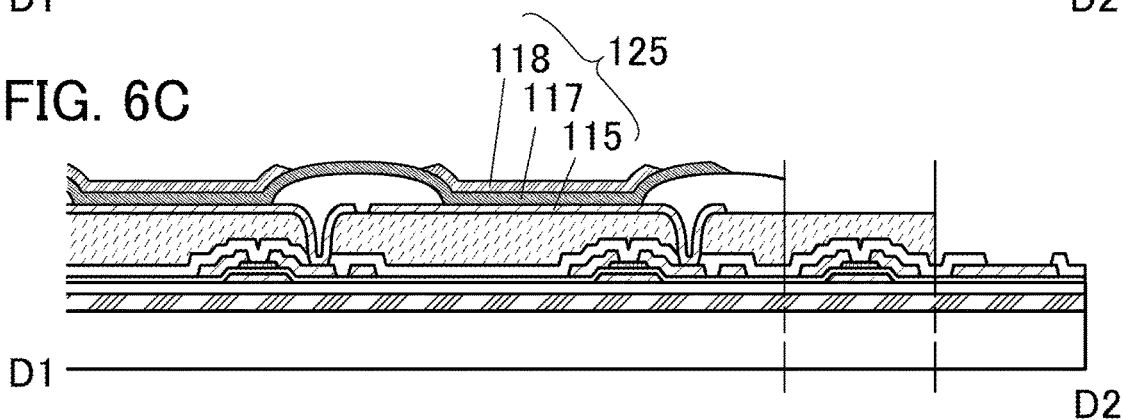

Next, the EL layer 117 is formed over the electrode 115 (see FIG. 6C). The structure of the EL layer 117 is described in Embodiment 3.

[Formation of Electrode 118]

Next, the electrode 118 is formed over the EL layer 117 (see FIG. 6C). The electrode 118 is used as a cathode, and thus is preferably formed using a material that has a low work function and can inject electrons into the EL layer 117. As well as a single-layer of a metal having a low work function, a stack in which a several-nanometer-thick formed of an alkali metal or an alkaline earth metal having a low work function is formed as a buffer layer and a metal material such as aluminum (Al), titanium (Ti), tantalum (Ta), tungsten (W), molybdenum (Mo), chromium (Cr), or magnesium (Mg), a conductive oxide material such as indium tin oxide, or a semiconductor material is formed thereover may be employed. As the buffer layer, an oxide of an alkaline earth metal, a halide, or a magnesium-silver alloy can also be used.

In this embodiment, a stacked layer of aluminum and titanium can be used for the electrode 118. The electrode 118 can be formed by an evaporation method using a metal mask. Moreover, in this embodiment, a several-nanometer-thick lithium fluoride film is formed between the EL layer 117 and the electrode 118 so that electrons are easily injected into the EL layer 117. The metal mask used in this embodiment is a metal plate having a plurality of openings arranged in a matrix. First, lithium fluoride, aluminum, and titanium are successively evaporated through the metal mask, whereby the lithium fluoride film and the electrodes 118 can be formed over the EL layer 117 so as to overlap with the openings of the metal mask.

In the above manner, the light-emitting element 125 is formed with the electrode 115, the EL layer 117, and the electrode 118.

[Attachment of Substrate 103]

Figure 6D:
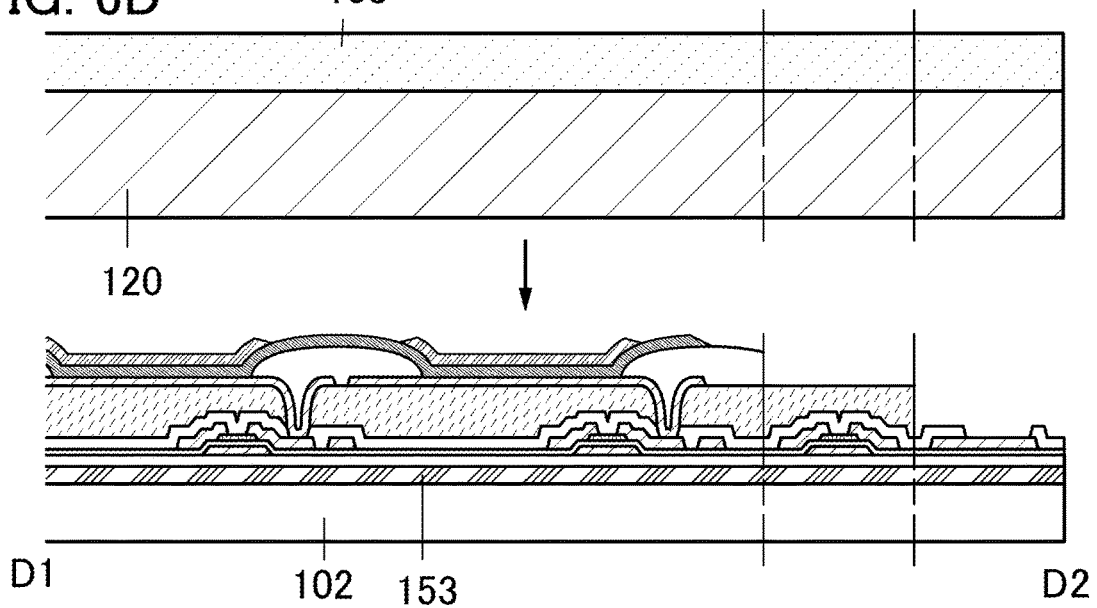
Figure 7A:
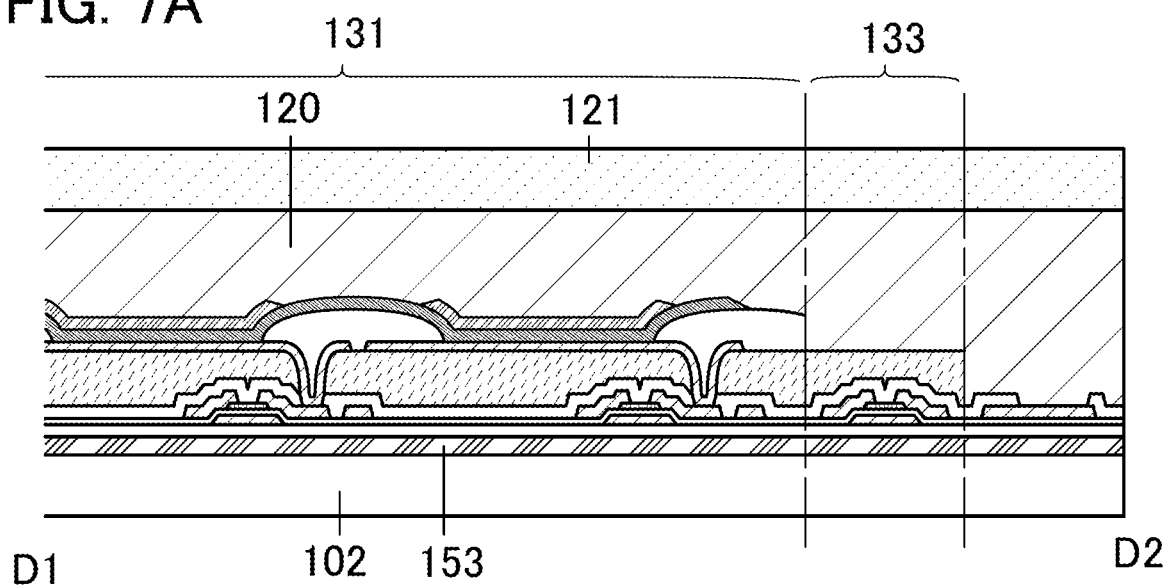
FIG. 7A and FIG. 7B are cross-sectional views explaining an example of a method for manufacturing a light-emitting device.

Next, the substrate 103 is formed over the element formation substrate 102 with the adhesive layer 120 therebetween (see FIG. 6D and FIG. 7A). For the substrate 103, a polyethylene terephthalate resin, a polyethylene naphthalate resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, or a polyvinylchloride resin can be used. As the adhesive layer 120, a photocurable adhesive, a reactive curable adhesive, a thermosetting adhesive, or an anaerobic adhesive can be used. For example, an epoxy resin, an acrylic resin, or an imide resin can be used. The adhesive layer 120 may be mixed with a drying agent (zeolite). Note that the substrate 103 is formed to face the element formation substrate 102 and may thus be referred to as a "counter substrate".

[Separation of Element Formation Substrate from Insulating Layer 203]

Figure 7B:
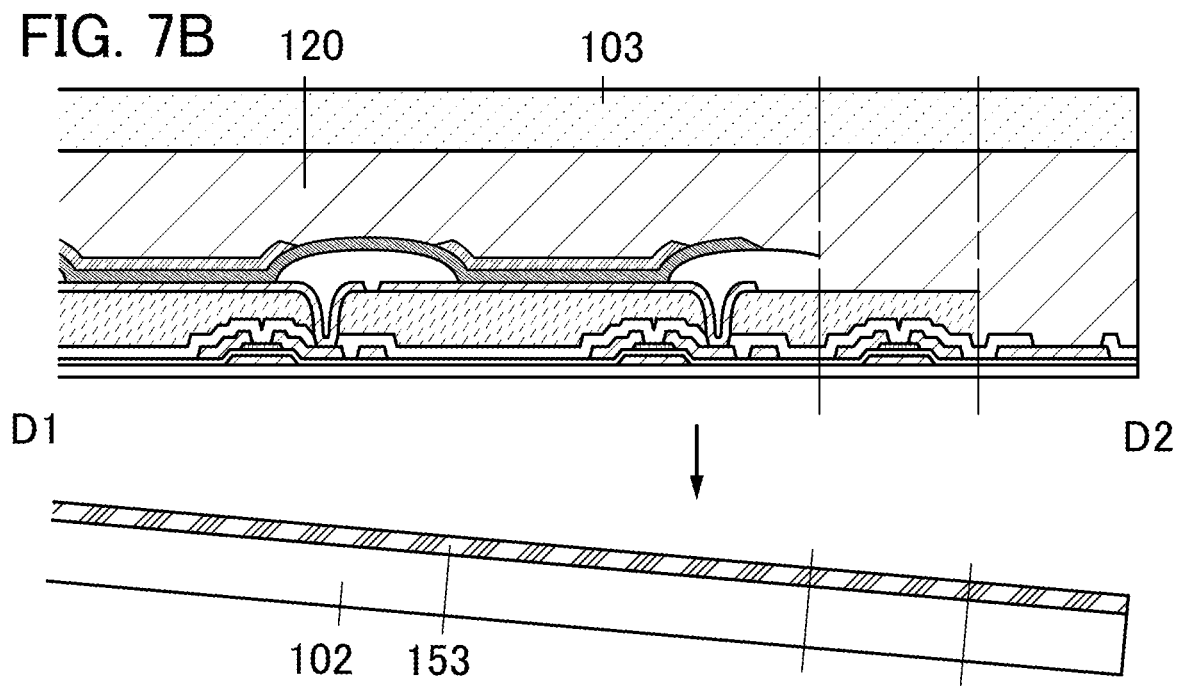

Next, the element formation substrate 102 in contact with the insulating layer 203 with the separation layer 153 therebetween is separated from the insulating layer 203 (see FIG. 7B). As a separating method, mechanical force (a peeling process with a human hand or a gripper, a division process by rotation of a roller, or ultrasonic waves) may be used. For example, a cut is made in the separation layer 153 with a sharp edged tool or by laser light irradiation and water is injected into the cut. Alternatively, the cut is sprayed with a mist of water. A portion between the separation layer 153 and the insulating layer 203 absorbs water through capillarity action, so that the element formation substrate 102 can be separated easily from the insulating layer 203.

[Attachment of Substrate]

Figure 8A:
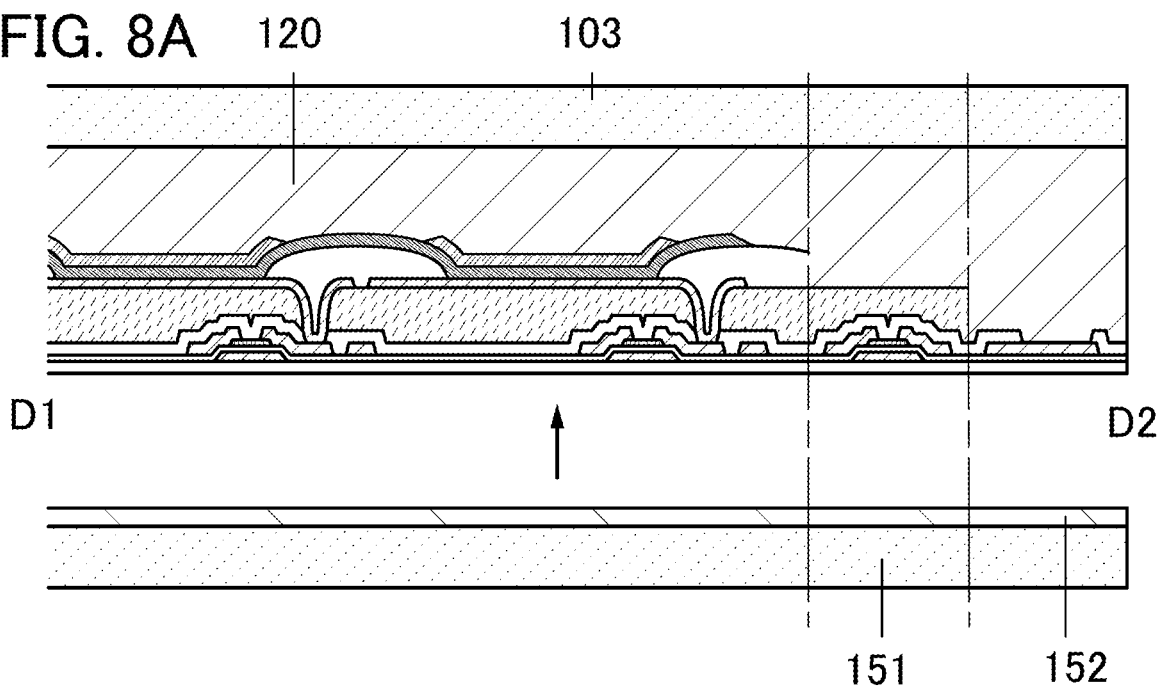
FIG. 8A and FIG. 8B are cross-sectional views explaining an example of a method for manufacturing a light-emitting device.
Figure 8B:
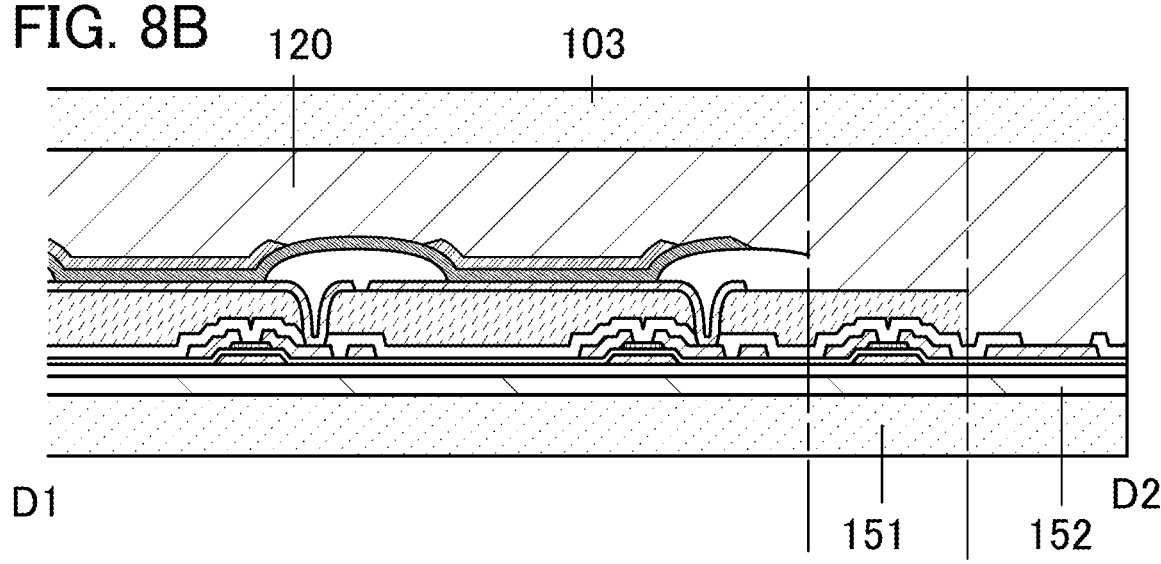

Next, the substrate 151 is attached to the insulating layer 203 with the adhesive layer 152 therebetween (see FIG. 8A and FIG. 8B). The adhesive layer 152 can be formed using a material similar to that of the adhesive layer 120. In this embodiment, a 20-µm-thick aramid (polyamide resin) is used for the substrate 151.

[Formation of Opening 122]

Figure 9A:
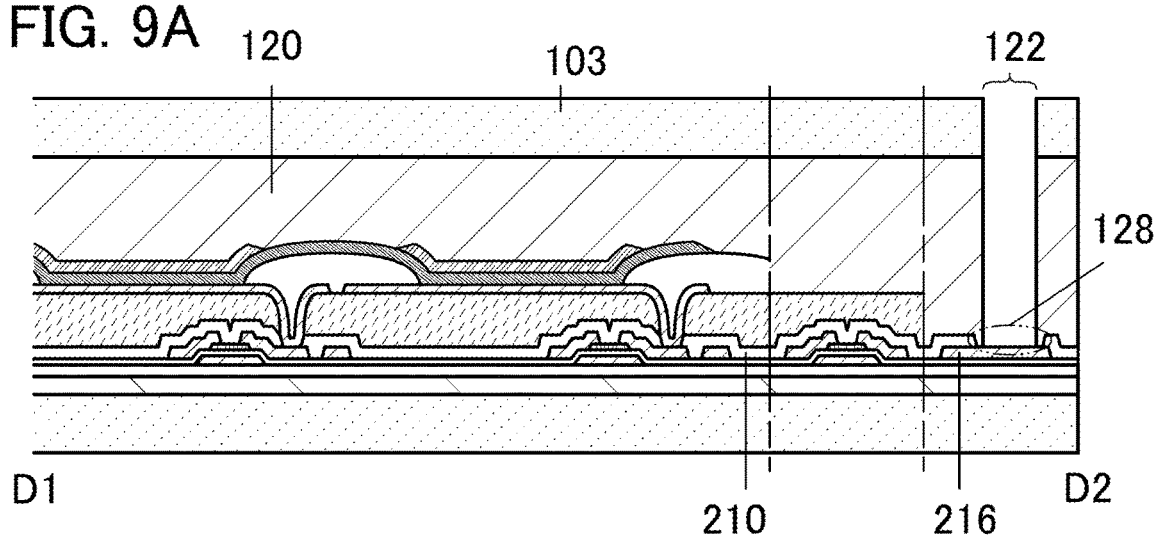
FIG. 9A and FIG. 9B are cross-sectional views explaining an example of a method for manufacturing a light-emitting device.

Next, the substrate 103 and the adhesive layer 120 in a region overlapping with the terminal electrode 216 and the opening 128 are removed to form an opening 122 (see FIG. 9A). A surface of the terminal electrode 216 is partly exposed by the formation of the opening 122.

[Formation of External Electrode]

Figure 9B:
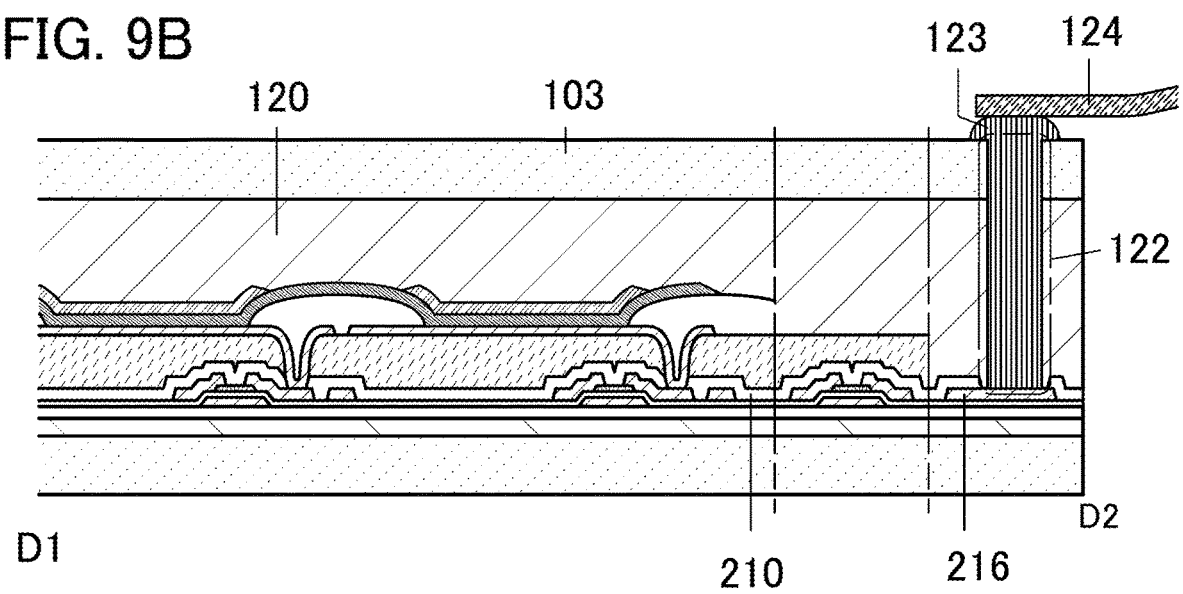

Next, the anisotropic conductive connection layer 123 is formed in the opening 122, and the external electrode 124 for inputting electric power or a signal to the display panel 250 is formed over the anisotropic conductive connection layer 123 (see FIG. 9B). The terminal electrode 216 is electrically connected to the external electrode 124 through the anisotropic conductive connection layer 123. For example, an FPC (Flexible Printed Circuit) can be used as the external electrode 124.

The anisotropic conductive connection layer 123 can be formed using any of a variety of anisotropic conductive films (ACFs) or anisotropic conductive pastes (ACPs).

The anisotropic conductive connection layer 123 is formed by curing a paste-form or sheet-form material that is obtained by mixing conductive particles to a thermosetting resin or a thermosetting and light curable resin. The anisotropic conductive connection layer 123 is a material that exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

In the above-described manner, the display panel 250 can be manufactured.

Modification Example 1 of Light-Emitting Device

An example in which the display panel 250 having a bottom-emission structure described in this embodiment is modified into a display panel 300 having a top-emission structure is described with reference to FIG. 10. FIG. 10A is a perspective view of the display panel 300 having a top-emission structure. FIG. 10B is a cross-sectional view of a portion indicated by a dashed-dotted line D3-D4 in FIG. 10A.

In the case where the display panel 250 having a bottom-emission structure is modified into the display panel 300 having a top-emission structure, the electrode 115 is formed using a material having a function of reflecting light and the electrode 118 is formed using a material having a function of transmitting light.

Note that the electrode 115 and the electrode 118 may have a stacked-layer structure of a plurality of layers without limitation to a single-layer structure. For example, in the case where the electrode 115 is used as an anode, a layer in contact with the EL layer 117 may be a light-transmitting layer having a higher work function than the EL layer 117, such as indium tin oxide layer, and a layer having high reflectance (e.g., aluminum, an alloy containing aluminum, or silver) may be provided in contact with the layer.

External light 191 that is incident on the display panel 300 having a top-emission structure from the substrate 151 side is transmitted to the substrate 103 side through the light-transmitting portion 133. In other words, the state of the substrate 151 side can be observed on the substrate 103 side through the light-transmitting portion 133.

Light 192 is emitted from the light-emitting element 125 to the substrate 103 side. That is, even when a transistor is formed so as to overlap with the light-emitting portion 132, emission of the light 192 is not hindered. Thus, the light 192 can be emitted efficiently, whereby power consumption can be reduced. In addition, the circuit design can be performed easily; thus, the productivity of the light-emitting device can be increased. Moreover, a wiring or the like overlapping with the light-transmitting portion 133 is provided so as to overlap with the light-emitting portion 132, whereby transmittance of the light-transmitting portion 133 can be improved. Thus, the state of the substrate 151 side can be viewed more clearly.

Modification Example 2 of Light-Emitting Device

Figure 11A:
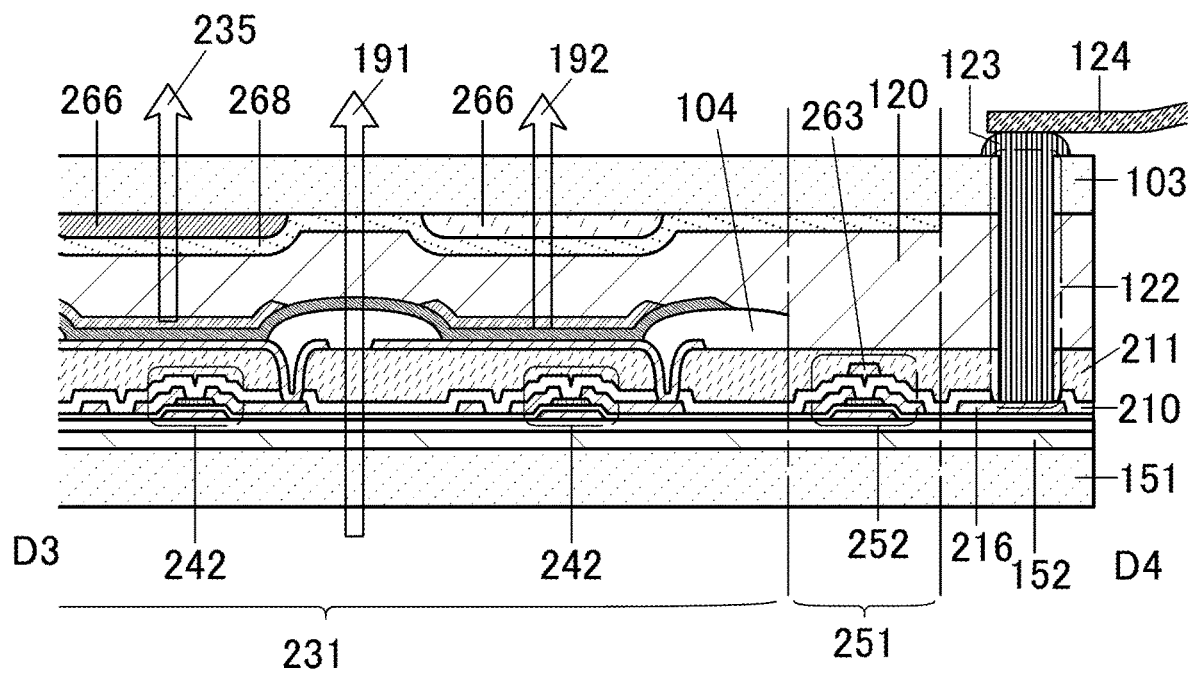
FIG. 11A and FIG. 11B are cross-sectional views each explaining one embodiment of a light-emitting device.

FIG. 11A shows a structure example, in which a coloring layer is added to the display panel 300 having a top-emission structure to enable the display panel 300 having a top-emission structure to perform color display. FIG. 11A is a cross-sectional view of a portion indicated by the dashed-dotted line D3-D4 in FIG. 10A.

The display panel 300 having a top-emission structure shown in FIG. 11A includes a coloring layer 266 over the substrate 103, and an overcoat layer 268 covering the coloring layer 266. The coloring layer 266 is formed to overlap with the light-emitting portion 132. The light 192 is colored in a given color by passing through the coloring layer 266. For example, a light-emitting device capable of full color display can be achieved in such a manner that, in adjacent three light-emitting portions 132, overlapping coloring layers 266 serve as a red coloring layer, a green coloring layer, and a blue coloring layer. The coloring layer 266 can be formed with any of various materials by a printing method, an ink-jet method, or a photolithography method.

For the overcoat layer 268, an organic insulating layer of an acrylic resin, an epoxy resin, or polyimide can be used. With the overcoat layer 268, diffusion of an impurity contained in the coloring layer 266 to the light-emitting element 125 side can be inhibited, for example. Note that the overcoat layer 268 is not necessarily formed; a structure including no overcoat layer 268 may be employed.

A light-transmitting conductive film may be formed as the overcoat layer 268. When a light-transmitting conductive film is formed as the overcoat layer 268, light 235 emitted from the light-emitting element 125 can be transmitted through the overcoat layer 268 and transmission of ionized impurities can be prevented.

The light-transmitting conductive film can be formed using, for example, indium oxide, indium tin oxide, indium zinc oxide, zinc oxide, or zinc oxide to which gallium is added. Graphene or a metal film that is thin enough to have a light-transmitting property can also be used.

Note that FIG. 11A shows an example in which an electrode 263 is provided through the insulating layer 210 in a region overlapping with the semiconductor layer 208 of the transistor 252 included in the driver circuit 233. The electrode 263 can be formed using a material and a method similar to those for the gate electrode 206.

The electrode 263 can also serve as a gate electrode. In the case where one of the gate electrode 206 and the electrode 263 is simply referred to as a "gate electrode", the other may be referred to as a "back gate electrode". Furthermore, in some cases, one of the gate electrode 206 and the electrode 263 is referred to as a "first gate electrode", the other may be referred to as a "second gate electrode".

In general, a back gate electrode is formed using a conductive film and positioned so that a channel formation region in a semiconductor layer is sandwiched between the gate electrode and the back gate electrode. Thus, the back gate electrode can function in a manner similar to that of the gate electrode. The potential of the back gate electrode may be equal to the potential of the gate electrode or may be a GND potential or a given potential. By changing the potential of the back gate electrode, the threshold voltage of the transistor can be changed.

In addition, the gate electrode and the back gate electrode are formed using conductive films and thus each also have a function of preventing an electric field generated outside the transistor from influencing the semiconductor layer in which the channel is formed (in particular, a function of preventing static electricity).

By providing the gate electrode 206 and the electrode 263 with the semiconductor layer 208 provided therebetween and setting the potentials of the gate electrode 206 and the electrode 263 to be equal, carriers are induced to the semiconductor layer 208 from both the upper surface side and the lower surface side and a region of the semiconductor layer 208 through which carriers flow is enlarged in the film thickness direction; thus, the number of transferred carriers is increased. As a result, the on-state current of the transistor is increased and the field-effect mobility is increased.

The gate electrode 206 and the electrode 263 each have a function of blocking an external electric field; thus, electric charge in a layer below the gate electrode 206 and in a layer over the electrode 263 does not affect the semiconductor layer 208. Thus, there is a little change in the threshold voltage in a stress test (e.g., a −GBT (Gate Bias-Temperature) stress test in which a negative voltage is applied to a gate or a +GBT stress test in which a positive voltage is applied to a gate). In addition, changes in the rising voltages of on-state current at different drain voltages can be inhibited.

Note that BT stress tests are a kind of accelerated test and can measure a change in transistor characteristics (i.e., change over time) due to long-term use, in a short time. In particular, the amount of change in threshold voltage of the transistor between before and after the BT stress test is an important indicator when the reliability is examined. The smaller the amount of change in the threshold voltage between before and after the BT stress test is, the higher the reliability of the transistor becomes.

By providing the gate electrode 206 and the electrode 263 and setting the potentials of the gate electrode 206 and the electrode 263 to be the same, the amount of change in the threshold voltage is reduced. Accordingly, variation in electrical characteristics among a plurality of transistors is also reduced.

Note that a back gate electrode may be provided in the transistor 242 formed in the display region 231.

Modification Example 3 of Light-Emitting Device

Another structural example in which the display panel 300 having a top-emission structure is modified into a display panel having a top-emission structure which is capable of color display without using the coloring layer 266 is described with reference to FIG. 11B.

Figure 11B:
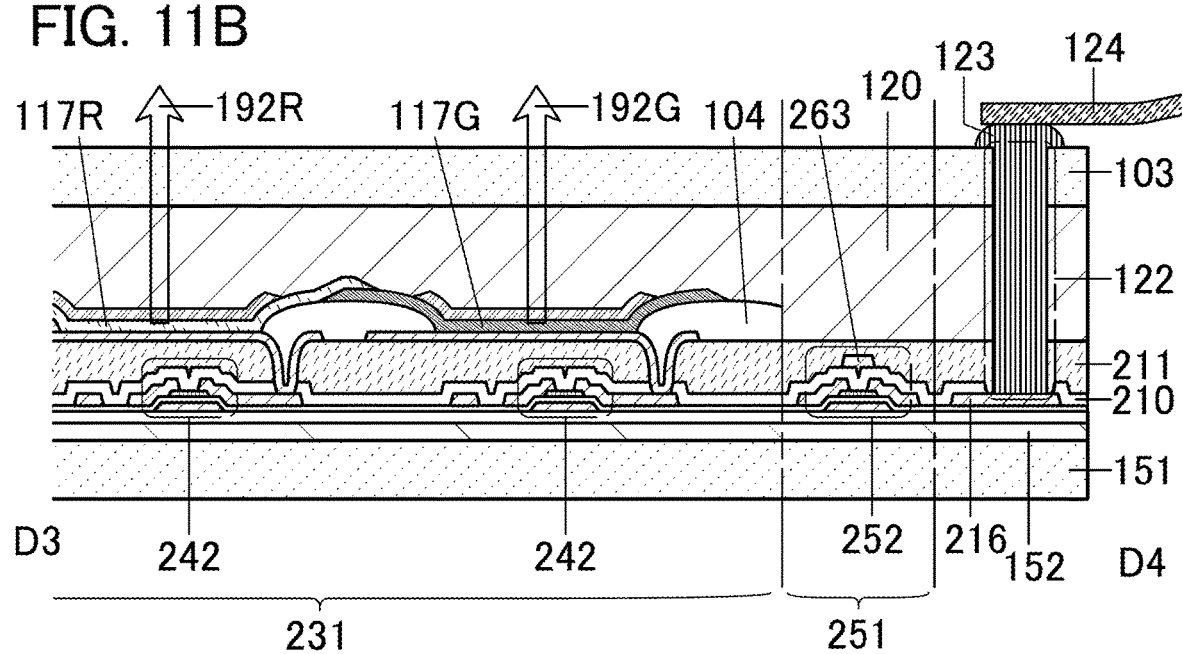

In the display panel having a top-emission structure shown in FIG. 11B, color display can be performed by using an EL layer 117R, an EL layer 117G, and an EL layer 117B (not shown) instead of the coloring layer 266 and the overcoat layer 268. The EL layer 117R, the EL layer 117G, and the EL layer 117B can emit light of the different colors such as red, green, and blue. For example, the EL layer 117R emits light 192R with a red wavelength, the EL layer 117G emits light 192G with a green wavelength, and the EL layer 117B emits light 192B (not illustrated) with a blue wavelength.

Since the coloring layer 266 is not provided, a reduction in luminance caused when the light 192R, the light 192G, and the light 192B are transmitted through the coloring layer 266 can be prevented. The thicknesses of the EL layer 117R, the EL layer 117G, and the EL layer 117B are adjusted in accordance with the wavelengths of the light 192R, the light 192G, and the light 192B, whereby a higher color purity can be achieved.

Modification Example 4 of Light-Emitting Device

Figure 12A:
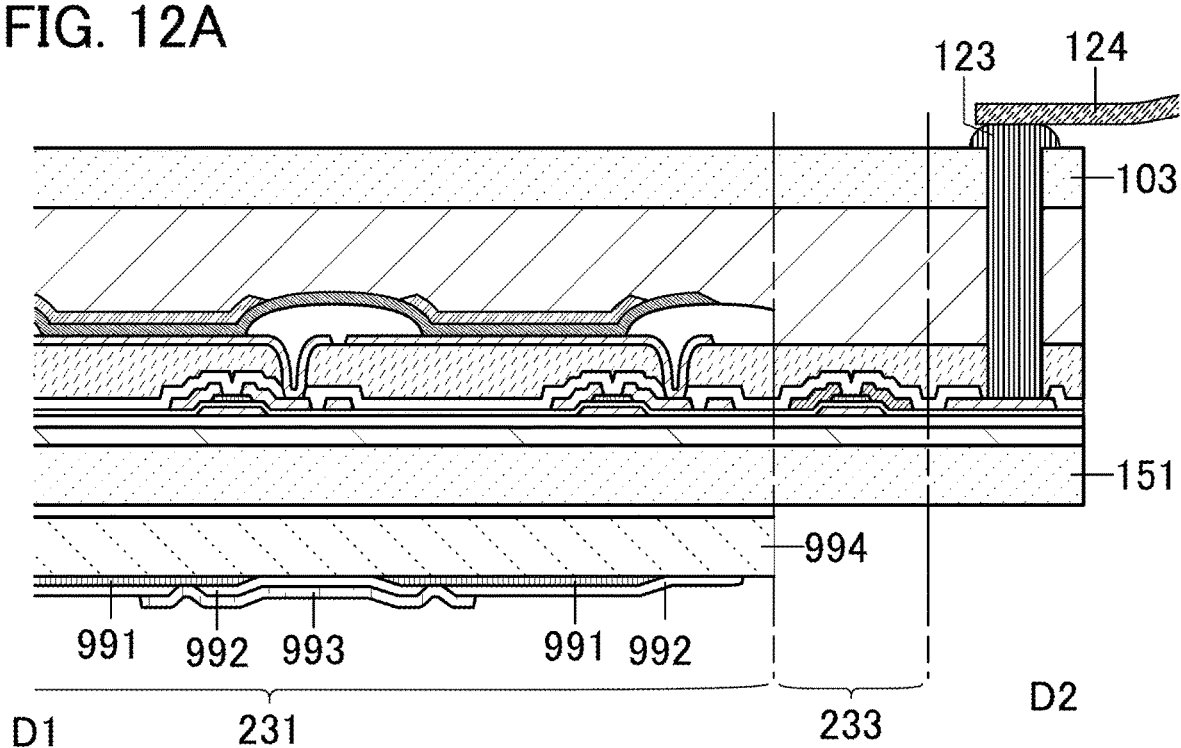
FIG. 12A and FIG. 12B are cross-sectional views each explaining one embodiment of a light-emitting device.

As shown in FIG. 12A, a substrate including a touch sensor may be provided on the substrate 151 side in the display panel 250 having a bottom-emission structure. The touch sensor is formed with a conductive layer 991 and a conductive layer 993. In addition, an insulating layer 992 is formed between them.

As the conductive layer 991 and/or the conductive layer 993, a transparent conductive film of indium tin oxide or indium zinc oxide is preferably used. Note that a layer containing a low-resistance material may be used for part or the whole of the conductive layer 991 and/or the conductive layer 993 to reduce resistance. For example, a single-layer structure or a stacked-layer structure of a metal formed of aluminum, titanium, chromium, nickel, copper, yttrium, zirconium, molybdenum, silver, tantalum, or tungsten or an alloy containing any of the metals as its main component can be used. Alternatively, a metal nanowire may be used for the conductive layer 991 and/or the conductive layer 993. Silver is preferred as the metal in such a case. Thus, the resistance can be reduced and the sensitivity of the sensor can be improved.

The insulating layer 992 is preferably formed as a single layer or a multilayer using silicon oxide, silicon nitride, silicon oxynitride, silicon nitride oxide, aluminum oxide, aluminum oxynitride, or aluminum nitride oxide. The insulating layer 992 can be formed by sputtering, CVD, thermal oxidation, a coating method, or a printing method.

Although an example in which the touch sensor is provided on the substrate 151 side is shown in FIG. 12A, one embodiment of the present invention is not limited thereto. The touch sensor may be provided on the substrate 103 side.

Note that the substrate 994 may have a function of an optical film. That is, the substrate 994 may have a function of a polarizing plate or a retardation plate.

Figure 12B:
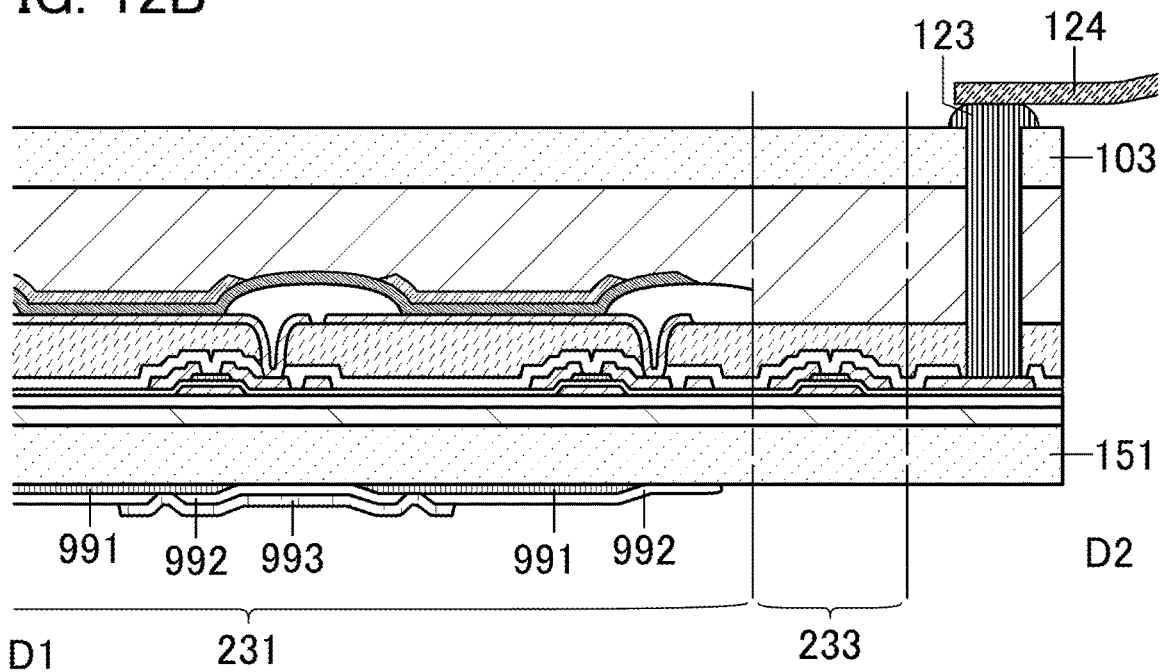

Moreover, a touch sensor may be directly formed on the substrate 151 as shown in FIG. 12B.

This embodiment can be implemented in an appropriate combination with the structures described in the other embodiments.

Embodiment 3

In this embodiment, a structure example of a light-emitting element that can be used as the light-emitting element 125 will be described. Note that an EL layer 320 described in this embodiment corresponds to the EL layer 117 described in the other embodiments.

<Structure of Light-Emitting Element>

Figure 13A:
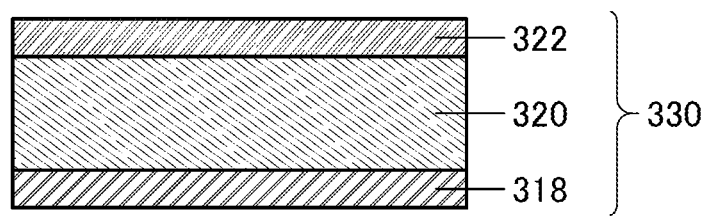
FIG. 13A and FIG. 13B are cross-sectional views explaining structure examples of a light-emitting element.

A light-emitting element 330 shown in FIG. 13A has a structure in which the EL layer 320 is sandwiched between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance with a high hole-injection property, a substance with a high hole-transport property, a substance with a high electron-transport property, a substance with a high electron-injection property, or a substance with a bipolar property (a substance with high electron-transport and hole-transport properties) can be used. Specifically, functional layers such as a hole-injection layer, a hole-transport layer, an electron-transport layer, and an electron-injection layer can be used in combination as appropriate.

The light-emitting element 330 illustrated in FIG. 13A emits light when current flows by applying a potential difference between the electrode 318 and the electrode 322 and holes and electrons are recombined in the EL layer 320. That is, a light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 13B:
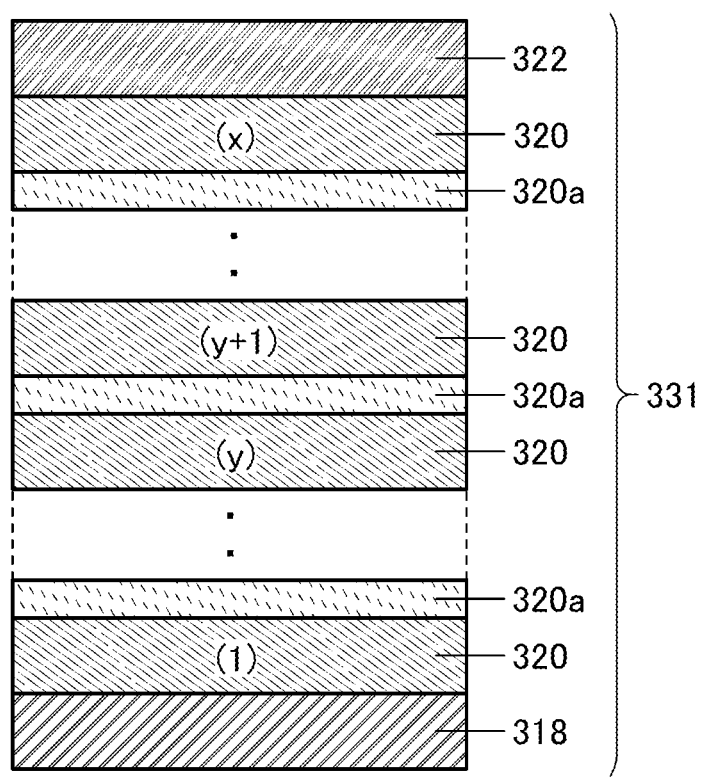

Note that a plurality of EL layers 320 may be stacked between the electrode 318 and the electrode 322 as in a light-emitting element 331 shown in FIG. 13B. In the case of a stacked-layer structure of x (x is a natural number of 2 or more) layers, a charge generation layer 320a is preferably provided between a y-th (y is a natural number satisfying 1≤y<x) EL layer 320 and a (y+1)-th EL layer 320.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include an organic compound and a metal oxide such as vanadium oxide, molybdenum oxide, or tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, other substances may also be used as long as they have a property of transporting more holes than electrons. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing the composite material of an organic compound and a metal oxide may be combined with a layer containing a compound of a substance selected from electron-donating substances and a compound having a high electron-transport property. Moreover, a layer containing the composite material of an organic compound and a metal oxide may be combined with a transparent conductive film.

The light-emitting element 331 having such a structure is unlikely to have problems such as energy transfer and quenching and has an expanded choice of materials, and thus can easily have both a high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other thereof, when voltage is applied between the electrode 318 and the electrode 322.

The light-emitting element 331 shown in FIG. 13B can provide a variety of emission colors by changing the type of the light-emitting substance used for the EL layers 320. In addition, a plurality of light-emitting substances emitting light of different colors can be used as the light-emitting substances, whereby light emission having a broad spectrum or white light emission can be obtained.

In the case of obtaining white light emission using the light-emitting element 331 shown in FIG. 13B, as for the combination of a plurality of EL layers, a structure that emits white light including red, green, and blue light may be used; for example, a structure including a light-emitting layer containing a blue fluorescent substance as a light-emitting substance and a light-emitting layer containing red and green phosphorescent substances as light-emitting substances can be given. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like. Note that a structure in which red (R), green (G), and blue (B) are independently provided in respective pixels (SBS: a Side By Side structure) or a tandem structure (a structure in which a plurality of colors R, G, and B are connected in series with intermediate layers (charge generation layers) therebetween) can be combined with a coloring layer (e.g., a color filter) can be used for the EL layer 320. The tandem structure enables the light-emitting device to emit light at high luminance. Note that the luminance of the light emitted from the EL layer 320 can be, for example, higher than or equal to 500 cd/m$^2$, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

Note that in the structure of the above-described stacked-layer element, by providing the charge generation layer between the stacked light-emitting layers, the element can have a long lifetime in a high-luminance region while keeping the current density low. Furthermore, voltage drop due to resistance of an electrode material can be reduced, which allows homogeneous light emission in a large area.

This embodiment can be implemented in an appropriate combination with the structures described in the other embodiments.

Embodiment 4

In this embodiment, kinds of a display panel for the external light 191 that enters the display panel and a modification example thereof are described with reference to FIG. 14. Note that the same portions as those in FIG. 1 are denoted by the same reference numerals and detailed description thereof is omitted.

Figure 14A:
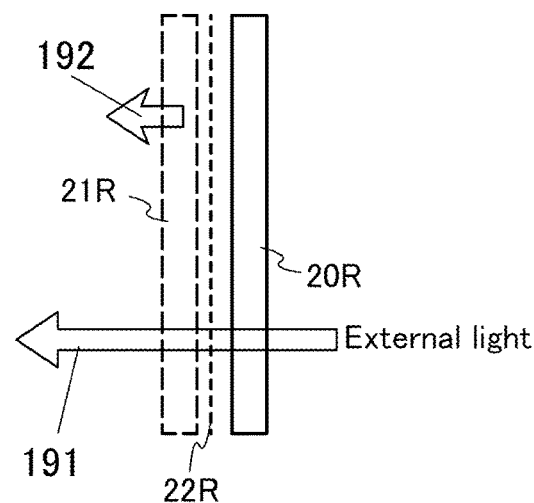
FIG. 14A to FIG. 14C are cross-sectional views explaining other structure examples of a display panel showing one embodiment of the present invention.

FIG. 14A is a schematic cross-sectional view corresponding to FIG. 1B. The cross-sectional view corresponds to FIG. 1B to which the external light 191 entering the display panel and the light 192 emitted from the light-emitting element 125 are added.

In FIG. 14A, as described in the above embodiment, in the case where the display panel 250 having a bottom-emission structure shown in FIG. 3 is used as the display panel 21R, the light 192 from the light-emitting element passes through the substrate 151, whereby the image can be provided to the passenger. The external light 191 passes through the window glass 20R, the film 22R including the light-blocking layer, the substrate 103, and the substrate 151 to enter the eyes of the passenger.

In the case where the display panel 300 having a top-emission structure shown in FIG. 10 is used as the display panel 21R, the light 192 from the light-emitting element passes through the substrate 103, whereby the image can be provided to the passenger.

A display panel having a dual-emission structure can be used as the display panel 21R.

Figure 14B:
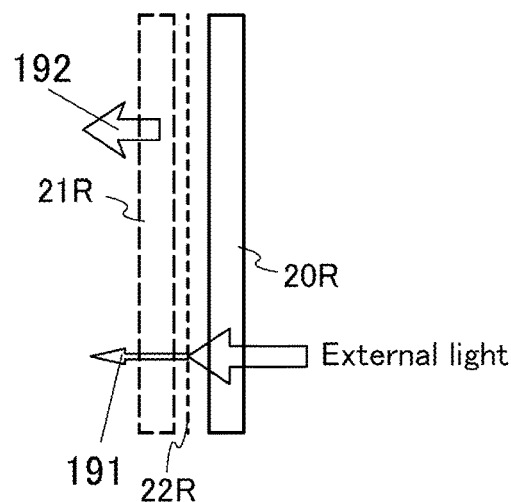

FIG. 14B shows an example where the percentage of external light blocked by the film 22R including the light-blocking layer is high. The amount of light transmitted through the film 22R including the light-blocking layer can be adjusted by the proportion of the opening area in the light-blocking pattern. Instead of the film 22R including the light-blocking layer, a car film called a window tinting film in which a layer attenuating the amount of light is provided over the entire surface may be used. The car film has a function of reducing ultraviolet rays from the outside and protecting the privacy in the vehicle. In the case of using such a film, the film may be attached and fixed to the window glass 20R or the display panel 21R with the use of a resin layer. Attachment of a window tinting film can make the second driving unit unnecessary.

Also in the structure of FIG. 14B, the display panel 250 having a bottom-emission structure shown in FIG. 3, the display panel 300 having a top-emission structure shown in FIG. 10, or a display panel having a dual-emission structure can be used as the display panel 21R.

Figure 14C:
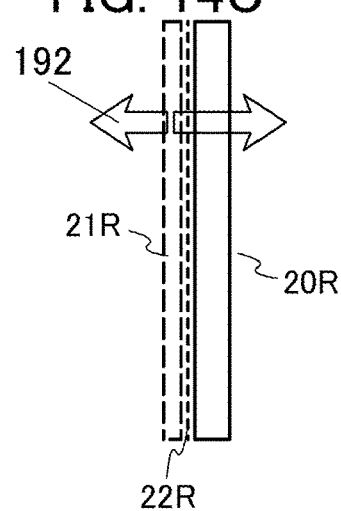

FIG. 14C shows another structure example partly different from those of FIG. 14A and FIG. 14B.

FIG. 14C shows an example where the film 22R including the light-blocking layer is used as the substrate 151 or the substrate 103 of the display panel 21R. It is possible to reduce the number of components and further reduce the entire thickness of the display device. In addition, the second driving unit can be unnecessary.

Furthermore, when the display panel 21R is fixed on the window glass 20R, the first driving unit can be unnecessary. When a display panel having a dual-emission structure is used as the display panel 21R, an image can be displayed not only on the interior but also on the exterior of the vehicle. This enables an alert to the outside of the vehicle or communication using characters with the outside of the vehicle. In this case, it can be called window glass on which the display panel is fixed with a resin layer.

In FIG. 14C, the display panel 21R is not limited to the display panel having a dual-emission structure; the display panel 250 having a bottom-emission structure shown in FIG. 3 or the display panel 300 having a top-emission structure shown in FIG. 10 can also be used.

This embodiment can be implemented in an appropriate combination with the structures described in the other embodiments.

Embodiment 5

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements which emit light of different colors. The light-emitting elements each include a pair of electrodes and an EL layer between them. The light-emitting elements are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

As a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and high aperture ratio. Thus, a measure has been taken for pseudo improvement in resolution (also referred to pixel density) by employing a unique pixel arrangement such as a PenTile arrangement.

In one embodiment of the present invention, fine patterning of an EL layer is performed without a shadow mask such as a metal mask. With this, a display device with high-resolution and a high aperture ratio, which has been difficult to achieve, can be fabricated. Moreover, EL layers can be formed separately, enabling the display device to perform extremely clear display with high contrast and high display quality.

Here, a description is made on a case where EL layers in light-emitting elements of two colors are separately formed, for simplicity. First, a stack of a first EL film and a first sacrificial film is formed to cover pixel electrodes. Next, a resist mask is formed over the first sacrificial film. Then, part of the first sacrificial film and part of the first EL film are etched using the resist mask, so that a first EL layer and a first sacrificial layer over the first EL layer are formed.

Next, a stack of a second EL film and a second sacrificial film is formed. Then, part of the second sacrificial film and part of the second EL film are etched using the resist mask, so that a second EL layer and a second sacrificial layer over the second EL layer are formed. Next, the pixel electrode is processed using the first sacrificial layer and the second sacrificial layer as a mask, so that a first pixel electrode overlapping with the first EL layer and a second pixel electrode overlapping with the second EL layer are formed. In this manner, the first EL layer and the second EL layer can be formed separately. Finally, the first sacrificial layer and the second sacrificial layer are removed, and a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three color or four or more colors can be achieved.

At an end portion of the EL layer, a step is generated owing to a region where the pixel electrode and the EL layer are provided and a region where the pixel electrode and the EL layer are not provided. At the time of forming the common electrode over the EL layer, coverage with the common electrode is degraded owing to the step at the end portion of the EL layer, which might cause disconnection of the common electrode. Furthermore, the common electrode becomes thinner, whereby electric resistance might be increased.

In the case where an end portion of the pixel electrode is substantially aligned with the end portion of the EL layer and the case where the end portion of the pixel electrode is positioned on an outer side than the end portion of the EL layer, the common electrode and the pixel electrode are sometimes short-circuited when the common electrode is formed over the EL layer.

In one embodiment of the present invention, an insulating layer is provided between the first EL layer and the second EL layer, whereby unevenness on the surface where the common electrode is provided can be reduced. Thus, the coverage with the common electrode can be increased at the end portion of the first EL layer and the end portion of the second EL layer, which allows favorable conductivity of the common electrode. In addition, a short circuit between the common electrode and the pixel electrode can be inhibited.

Moreover, in one embodiment of the present invention, the sacrificial layer is formed using a resist mask, and the EL layer and the pixel electrode can be processed using the formed sacrificial layer; thus, a light-emitting element can be formed without use of different resist masks for processing the pixel electrode and processing of the EL layer. Accordingly, a margin for the positions of the end portions of the pixel electrode and the EL layer is not necessarily provided for forming a light-emitting element. With a reduction in the margin for the positions, a light-emitting region can be extended, whereby the aperture ratio of the light-emitting element can be increased. Moreover, with a reduction in the margin for the positions, a reduction in the pixel size is possible, whereby the display device can have higher definition. Furthermore, the number of uses of the resist masks can be reduced, whereby the process can be simplified. This enables a reduction in cost and an improvement in yield.

In the case where EL layers for different colors are adjacent to each other, it is difficult to set the distance between the EL layers adjacent to each other to be less than 10 μm with a formation method using a metal mask, for example; however, with use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both a high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile arrangement; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

More specific examples of the structure and manufacturing method of the display device of one embodiment of the present invention are described below with reference to drawings.

Structure Example 1

Figure 15A:
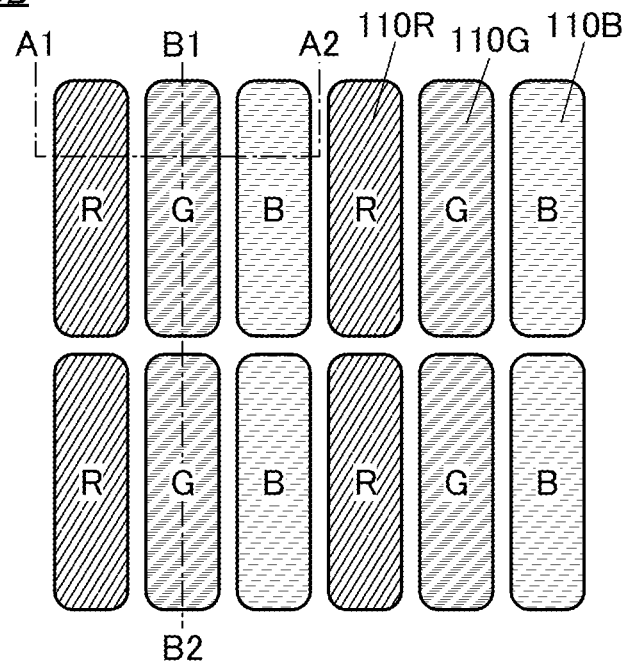
FIG. 15A is a top view.

FIG. 15A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 15A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 15A shows what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

As the light-emitting elements 110R, the light-emitting elements 110G, and the light-emitting element 110B, EL elements such as OLEDs (Organic Light Emitting Diodes) or QLEDs (Quantum-dot Light Emitting Diodes) are preferably used. As a light-emitting substance contained in the EL element, a substance that emits fluorescence (a fluorescent material), a substance that emits phosphorescence (a phosphorescent material), an inorganic compound (a quantum dot material), and a substance that exhibits thermally activated delayed fluorescence (a thermally activated delayed fluorescent (TADF) material) can be given.

Figure 15B:
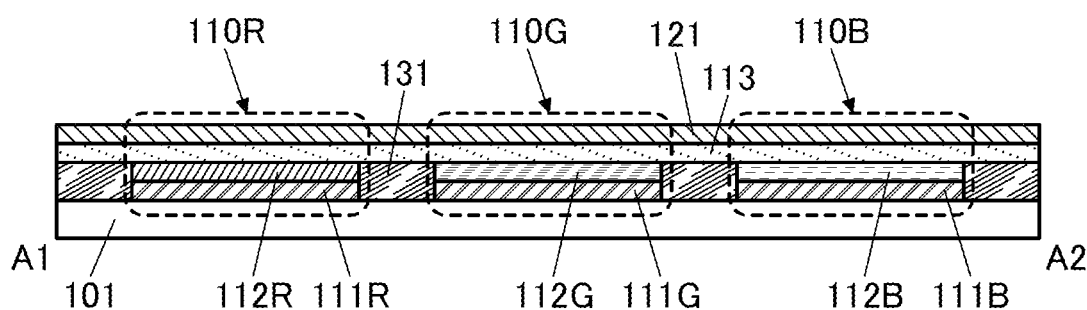
FIG. 15B and FIG. 15C are cross-sectional views showing a structure example of a display device.
Figure 15C:
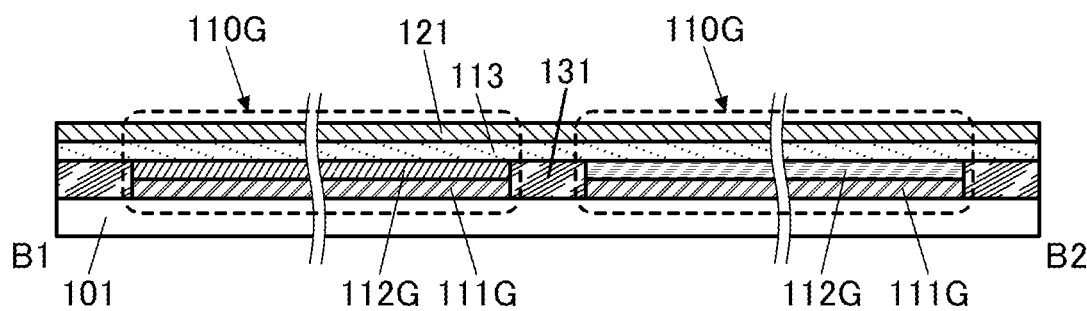

FIG. 15B is a schematic cross-sectional view taken along the dashed-dotted line A1-A2 in FIG. 15A, and FIG. 15C is a schematic cross-sectional view taken along the dashed-dotted line B1-B2.

FIG. 15B shows cross sections of the light-emitting element 110R, the light-emitting element 110G, and the light-emitting element 110B. The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113.

The light-emitting element 110R includes the EL layer 112R between the pixel electrode 111R and the common electrode 113. The EL layer 112R contains at least a light-emitting organic compound that emits light with intensity in the red wavelength range. In the light-emitting elements 110G, the EL layer 112G is included between the pixel electrode 111G and the common electrode 113. The EL layer 112G contains at least a light-emitting organic compound that emits light with intensity in the green wavelength range. In the light-emitting elements 110B, the EL layer 112B is included between the pixel electrode 111B and the common electrode 113. The EL layer 112B contains at least a light-emitting organic compound that emits light with intensity in the blue wavelength range.

The EL layer 112R, the EL layer 112G, and the EL layer 112B each include a layer containing a light-emitting organic compound (light-emitting layer). The light-emitting layer may contain one or more kinds of compounds (e.g., a host material and an assist material) in addition to the light-emitting substance (a guest material). As the host material and the assist material, one or more kinds of substances having a larger energy gap than the light-emitting substance (guest material) can be selected and used. As the host material and the assist material, compounds which form an exciplex are preferably used in combination. To form an exciplex efficiently, it is particularly preferable to combine a compound that easily accepts holes (hole-transport material) and a compound that easily accepts electrons (electron-transport material).

Either a low molecular compound or a high molecular compound can be used for the light-emitting element, and an inorganic compound (quantum dot material) may also be contained.

The EL layer 112R, the EL layer 112G, and the EL layer 112B may each include one or more of an electron-injection layer, an electron-transport layer, a hole-injection layer, and a hole-transport layer in addition to the light-emitting layer.

The pixel electrode 111R, the pixel electrode 111G, and the pixel electrode 111B are provided for the respective light-emitting elements. The common electrode 113 is provided as a continuous layer shared by the light-emitting elements. Note that when both the pixel electrodes and the common electrode 113 transmit light, a dual-emission display device can be obtained.

A conductive film that has a property of transmitting visible light is used for either the respective pixel electrodes or the common electrode 113, and a reflective conductive film is used for the other. When the pixel electrodes are light-transmitting electrodes and the common electrode 113 is a reflective electrode, a bottom-emission display device is obtained; in contrast, when the respective pixel electrodes are reflective electrodes and the common electrode 113 is a light-transmitting electrode, a top-emission display device is obtained.

An insulating layer 131 is provided between adjacent light-emitting elements 110R (or light-emitting elements 100G or light-emitting elements 100B). The insulating layer 131 is positioned between the EL layers (EL layers 112R, EL layers 112G, and the EL layers 112B) included in the light-emitting elements 110R, 100G, and 100B. The common electrode 113 is provided over the insulating layer 131.

The insulating layer 131 is provided, for example, between two EL layers exhibiting different colors (any two of the EL layer 112R, the EL layer 112G, and the EL layer 112B). Alternatively, the insulating layer 131 is provided, for example, between two EL layers exhibiting the same color (the EL layers 112R, the EL layers 112G, or the EL layers 112B). Alternatively, the following structure may be employed: the insulating layer 131 is provided between two EL layers exhibiting different colors (any two of the EL layer 112R, the EL layer 112G, and the EL layer 112B) and is not provided between two EL layers exhibiting the same color (the EL layers 112R, the EL layers 112G, or the EL layers 112B).

The insulating layer 131 is provided, for example, between two EL layers (any two of the EL layer 112R, the EL layer 112G, and the EL layer 112B) in a top view.

It is preferable that the EL layer 112R, the EL layer 112G, and the EL layer 112B each include a region in contact with the top surface of the pixel electrode and a region in contact with the side surface of the insulating layer 131. The end portions of the EL layer 112R, the EL layer 112G, and the EL layer 112B are preferably in contact with the side surface of the insulating layer 131.

When the insulating layer 131 is provided between the light-emitting elements of different colors, the EL layer 112R, the EL layer 112G, and the EL layer 112G can be inhibited from being in contact with each other. This suitably prevents unintentional light emission due to a current flow through two adjacent EL layers. As a result, the contrast can be increased to achieve a display device with high display quality.

The top surface of the insulating layer 131 is preferably substantially aligned with the top surface of the EL layer (any one of the EL layer 112R, the EL layer 112G, and the EL layer 112B). The top surface of the insulating layer 131 has a flat shape, for example.

Figure 20A:
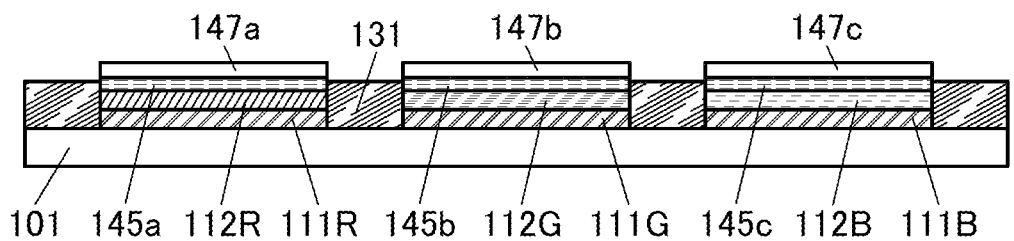
FIG. 20A to FIG. 20C are diagrams showing an example of a method for manufacturing a display device.
Figure 20B:
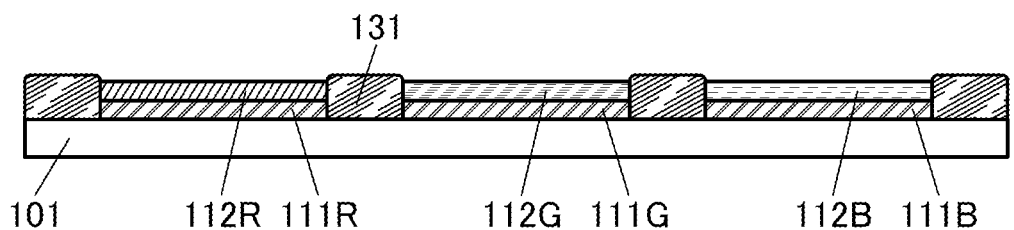
Figure 20C:
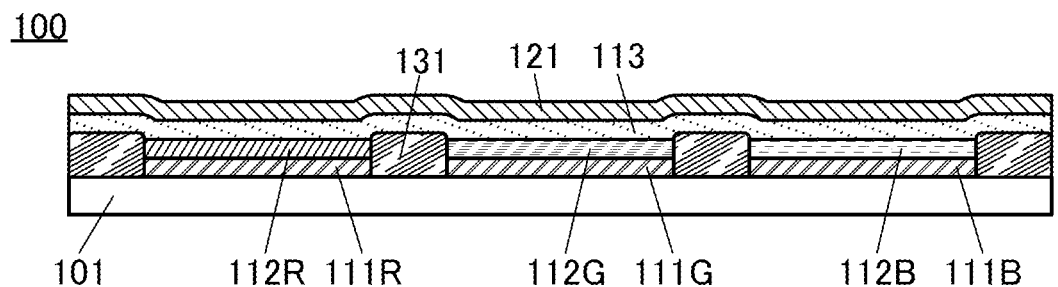
Figure 20D:
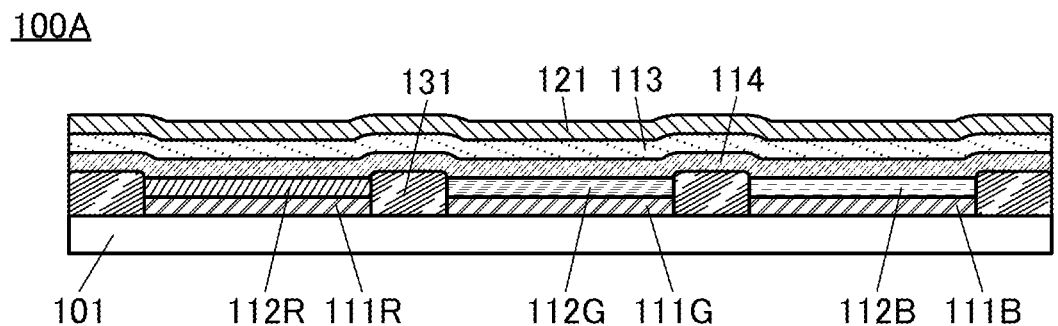
FIG. 20D is a cross-sectional view showing a structure example of the display device.
Figure 21A:
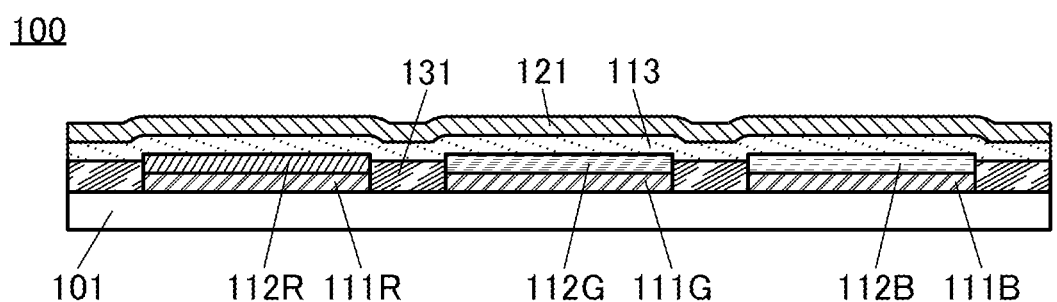
FIG. 21A and FIG. 21B are cross-sectional views showing structure examples of a display device.

The top surface of the insulating layer 131 is higher than the top surface of the EL layer (any one of the EL layer 112R, the EL layer 112G, and the EL layer 112B) in some cases (FIG. 20C described later). In addition, the top surface of the insulating layer 131 is lower than the top surface of the EL layer (any one of the EL layer 112R, the EL layer 112G, and the EL layer 112B) in some cases (FIG. 21A described later).

Figure 22A:
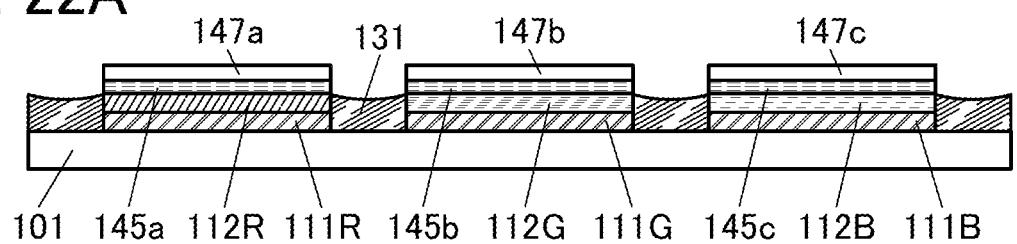
FIG. 22A to FIG. 22C are cross-sectional views showing structure examples of a display device.
Figure 22B:
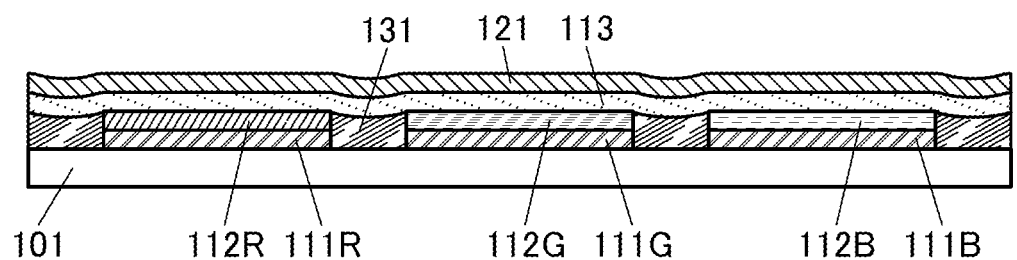
Figure 23A:
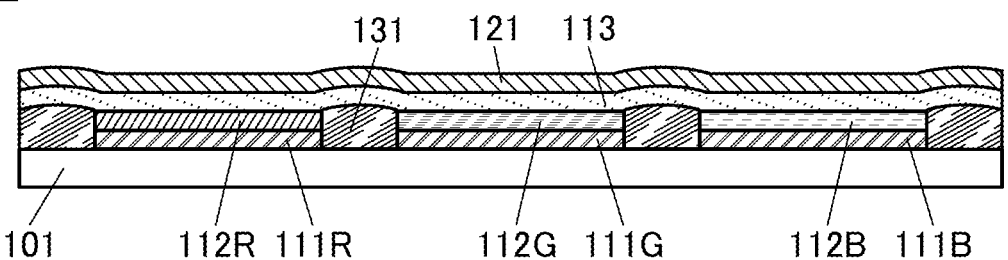
FIG. 23A and FIG. 23B are cross-sectional views showing structure examples of a display device.

The shape of the top surface of the insulating layer 131 includes a depression portion in some cases (FIG. 22B described later). Moreover, the shape of the top surface of the insulating layer 131 includes a projection portion in some cases (FIG. 23A described later).

For example, the difference in level between the top surface of the insulating layer 131 and the top surface of the EL layer (any one of the EL layer 112R, the EL layer 112G, and the EL layer 112B) is preferably less than or equal to 0.5 times, further preferably less than or equal to 0.3 times as larger as the thickness of the insulating layer 131. In addition, for example, the insulating layer 131 may be provided so that the top surface of the EL layer 112 is higher than the top surface of the insulating layer 131. Furthermore, for example, the insulating layer 131 may be provided so that the top surface of the insulating layer is higher than the top surface of the light-emitting layer included in the EL layer (any one of the EL layer 112R, the EL layer 112G, and the EL layer 112B). The thickness of the insulating layer 131 is, for example, substantially equal to a thickness from the bottom surface of the pixel electrode 111 to the top surface of the EL layer (any one of the EL layer 112R, the EL layer 112G, and the EL layer 112B). It is preferable that the thickness of the insulating layer 131 be, for example, greater than or equal to 0.3 times, greater than or equal to 0.5 times, or greater than or equal to 0.7 times as large as the thickness from the bottom surface of the pixel electrode 111 to the top surface of the EL layer (any one of the EL layer 112R, the EL layer 112G, and the EL layer 112B).

As the insulating layer 131, an acrylic resin, a polyimide resin, an epoxy resin, a polyamide resin, a polyimide-amide resin, a siloxane resin, a benzocyclobutene-based resin, a phenol resin, and precursors of these resins can be given.

A protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film, such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component is less affected by an uneven shape caused by the lower structure.

Structure Example 2

Figure 16A:
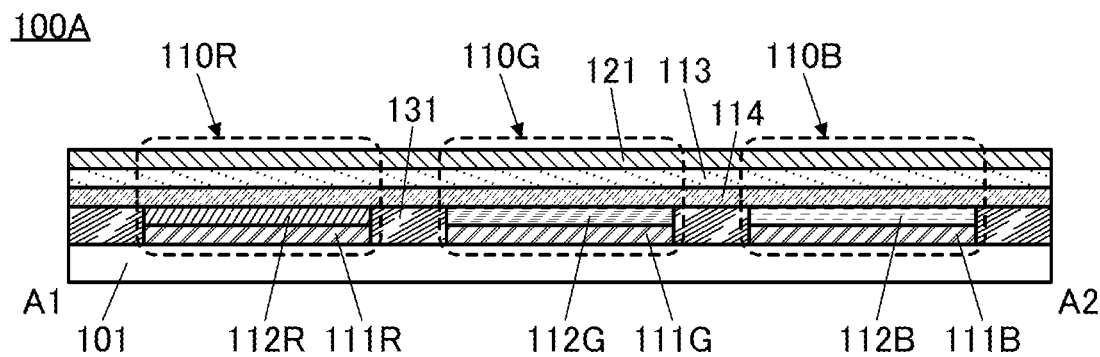
FIG. 16A and FIG. 16B are cross-sectional views showing structure examples of a display device.
Figure 16B:
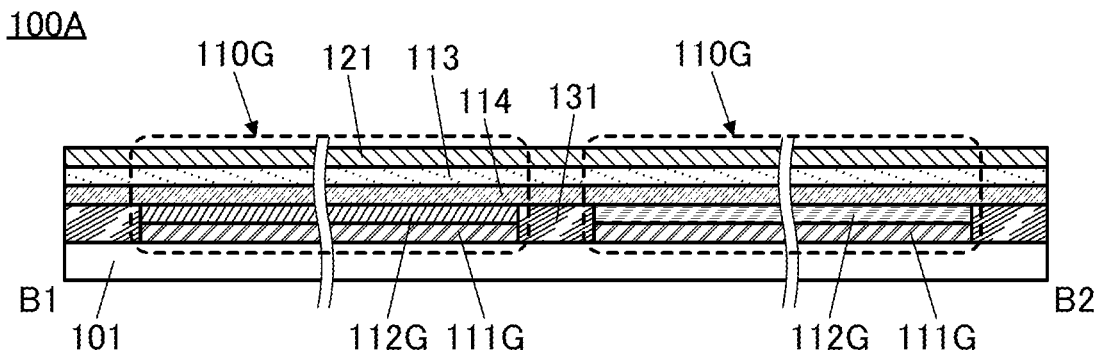

A display device 100A shown in FIG. 16A and FIG. 16B is different from the display device 100 shown in FIG. 15B and FIG. 15C in including a common layer 114. FIG. 16A is a schematic cross-sectional view taken along the dashed-dotted line A1-A2 in FIG. 15A, and FIG. 16B is a schematic cross-sectional view taken along the dashed-dotted line B1-B2.

Like the common electrode 113, the common layer 114 is provided across a plurality of light-emitting elements. The common layer 114 is provided to cover the EL layer 112R, the EL layer 112G, and the EL layer 112B. The manufacturing process can be simplified by including the common layer 114, reducing the manufacturing cost. The common layer 114 and the common electrode 113 can be formed successively without an etching step between formations of the common layer 114 and the common electrode 113. Thus, the interface between the common layer 114 and the common electrode can be clean, and the light-emitting element can have favorable characteristics.

The common layer 114 is preferably in contact with one or more of the top surfaces of the EL layer 112R, the EL layer 112G, and the EL layer 112B.

Each of the EL layer 112R, the EL layer 112G, and the EL layer 112B preferably includes at least a light-emitting layer containing a light-emitting material emitting one color. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

Manufacturing Method Example 2

An example of a manufacturing method of the display device of one embodiment of the present invention will be described below with reference to drawings. Here, description is made using the display device 100 described in the above structure example. FIG. 17A to FIG. 18E are schematic cross-sectional views in steps of the manufacturing method of the display device described below.

Note that thin films that form the display device (insulating films, semiconductor films, and conductive films) can be formed by a sputtering method, a chemical vapor deposition (CVD) method, a vacuum evaporation method, a pulsed laser deposition (PLD) method, or an atomic layer deposition (ALD) method. Examples of the CVD method include a plasma-enhanced chemical vapor deposition (PECVD) method and a thermal CVD method. As an example of the thermal CVD method, a metal organic chemical vapor deposition (MOCVD) method can be given.

Alternatively, thin films that form the display device (insulating films, semiconductor films, and conductive films) can be formed by a method such as spin coating, dipping, spray coating, ink-jetting, dispensing, screen printing, offset printing, a doctor knife method, a slit coater, a roll coater, a curtain coater, or a knife coater.

When the thin films that form the display device are processed, a photolithography method can be used. Besides, a nanoimprinting method, a sandblasting method, or a lift-off method may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, or ArF laser light can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultraviolet light, X-rays, or an electron beam because extremely minute processing can be performed. Note that when light exposure is performed by scanning of a beam such as an electron beam, a photomask is unnecessary.

For etching of the thin films, a dry etching method, a wet etching method, or sandblast method can be used.

[Preparation for Substrate 101]

As a substrate 101 having a light-transmitting property, a substrate having at least heat resistance high enough to withstand heat treatment performed later can be used. In the case where an insulating substrate is used as the substrate 101 having a light-transmitting property, a glass substrate, a quartz substrate, a sapphire substrate, a ceramic substrate or an organic resin substrate can be used.

Then, a conductive film 111f to be the pixel electrode 111 is formed over the substrate 101.

For the pixel electrode, a conductive film having a property of transmitting visible light is used. For the pixel electrode, a material that has a light transmittance as high as possible in the whole wavelength range of visible light (e.g., a transparent conductive film) is preferably used. For example, a conductive oxide such as indium oxide, indium tin oxide, indium zinc oxide, zinc oxide, zinc oxide containing gallium, indium tin oxide containing silicon, or indium zinc oxide containing silicon can be used for the conductive film 111f. This can increase color reproducibility as well as light extraction efficiency of the light-emitting elements. In addition, a stack of the above-described conductive film having a light-transmitting property and a thin metal film (aluminum) that transmits visible light can also be used.

[Formation of EL Film 112Rf]

Next, an EL film 112Rf that is to be the EL layer 112R later is formed over the conductive film 111f.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, as an evaporation method a sputtering method, or an inkjet method. Without limitation to this, the above-described deposition method can be used as appropriate.

[Formation of Sacrificial Film 144a]

Next, a sacrificial film 144a is formed to cover the EL film 112Rf.

As the sacrificial film 144a, it is possible to use a film highly resistant to etching treatment performed on various EL films such as the EL film 112Rf, i.e., a film having high etching selectivity. Furthermore, as the sacrificial film 144a, it is possible to use a film having high etching selectivity with respect to a protective film 146a described later. Moreover, as the sacrificial film 144a, it is possible to use a film that can be removed by a wet etching method less likely to cause damage to the EL film.

The sacrificial film 144a can be formed using an inorganic film such as a metal film, an alloy film, a metal oxide film, a semiconductor film, or an inorganic insulating film, for example.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, the sacrificial film 144a can be formed using a metal oxide such as an indium gallium zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), or indium gallium tin zinc oxide (In—Ga—Sn—Zn oxide). Alternatively, indium tin oxide containing silicon can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Furthermore, an inorganic insulating material such as aluminum oxide, hafnium oxide, or silicon oxide can be used for the sacrificial film 144a.

[Formation of Protective Film 146a]

Next, the protective film 146a is formed over the sacrificial film 144a.

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, silicon, silicon nitride, silicon oxide, tungsten, titanium, molybdenum, tantalum, tantalum nitride, an alloy containing molybdenum and niobium, or an alloy containing molybdenum and tungsten can be used for the protective film 146a. Here, a metal oxide film such as IGZO or ITO is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on etching conditions of the sacrificial film 144a and the protective film 146a. For example, any of the films that can be used for the sacrificial film 144a can be used.

As the protective film 146a, a nitride film can be used, for example. Specifically, it is possible to use as silicon nitride, aluminum nitride, hafnium nitride, titanium nitride, tantalum nitride, tungsten nitride, gallium nitride, or germanium nitride.

Alternatively, as the protective film 146a, an organic film that can be used for the EL film 112Rf can be used. For example, the organic film that is used as the EL film 112Rf, an EL film 112Gf, or an EL film 112Bf can be used for the protective film 146a. The use of such an organic film is preferable, in which case the deposition apparatus for the EL film 112Rf can be used in common.

[Formation of Resist Mask 143a]

Figure 17A:
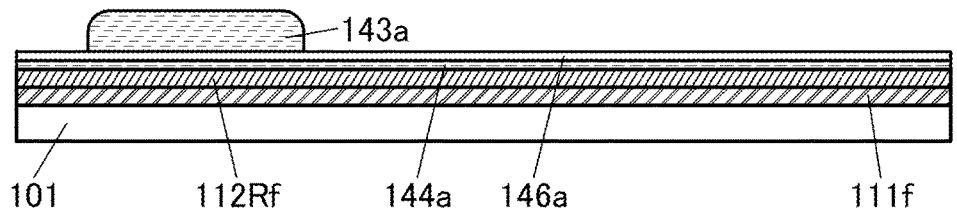
FIG. 17A to FIG. 17F are cross-sectional views showing an example of a method for manufacturing a display device.

Next, a resist mask 143a is formed over the protective film 146a (FIG. 17A).

For the resist mask 143a, a positive type resist material, a negative type resist material or a resist material containing a photosensitive resin can be used.

Here, in the case where the protective film 146a is not provided and the resist mask 143a is formed over the sacrificial film 144a, if a defect such as a pinhole exists in the sacrificial film 144a, there is a risk of dissolving the EL film 112Rf due to a solvent of the resist material. Such a defect can be prevented by using the protective film 146a.

[Etching of Protective Film 146a]

Next, part of the protective film 146a that is not covered with the resist mask 143a is removed by etching, so that an island-shaped or band-shaped protective layer 147a is formed.

In the etching of the protective film 146a, an etching condition with high selectively is preferably employed so that the sacrificial film 144a is not removed by the etching. Either wet etching or dry etching can be performed for the etching of the protective film 146a; with use of dry etching, a reduction in a processing pattern of the protective film 146a can be inhibited.

[Removal of the Resist Mask 143a]

Next, the resist mask 143a is removed.

The removal of the resist masks 143a can be performed by wet etching or dry etching. It is particularly preferable to perform dry etching (also referred to as plasma ashing) using an oxygen gas as an etching gas to remove the resist masks 143a.

At this time, the removal of the resist mask 143a is performed in a state where the EL film 112Rf is covered with the sacrificial film 144a; thus, the EL film 120Rb is less likely to be affected by the removal. In particular, when the EL film 112Rf is exposed to oxygen, the electrical characteristics are adversely affected in some cases; therefore, it is preferable that the EL film 112Rf be covered by the sacrificial film 144a when etching using an oxygen gas, such as plasma ashing, is performed.

[Etching of Sacrificial Film 144a]

Next, part of the sacrificial film 144a that is not covered with the protective layer 147a is removed by etching with use of the protective layer 147a as a mask, so that an islands-shaped or band-shaped sacrificial layer 145a is formed.

Either wet etching or dry etching can be performed for the etching of the mask film 144a; the use of dry etching is preferable, in which case a shrinkage of the pattern can be inhibited.

[Etching of EL Film 112Rf]

Figure 17B:
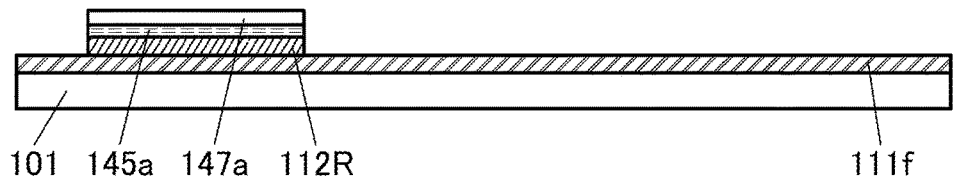

Next, part of the EL film 112Rf that is not covered with the sacrificial layer 145a is removed by etching, so that the island-shaped or band-shaped EL layer 112R is formed (FIG. 17B). For the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a rare gas such as He. Alternatively, a mixed gas of the above gas and a dilute gas that does not contain oxygen can be used as the etching gas. In the etching of the EL film 112Rf, the protective layer 147a may be removed.

[Formation of EL Layer 112G and EL Layer 112B]

Next, the EL film 112Gf that is to be the EL layer 112G later is formed over the sacrificial layer 145a and the exposed conductive film 111f. For the EL film 112Gf, the description of the EL film 112Rf can be referred to.

Then, a sacrificial film 144b is formed over the EL film 112Gf, and a protective film 146b is formed over the sacrificial film 144b. For the sacrificial film 144b, the description of the sacrificial film 144a can be referred to. For the protective film 146b, the description of the protective film 146a can be referred to.

Figure 17C:
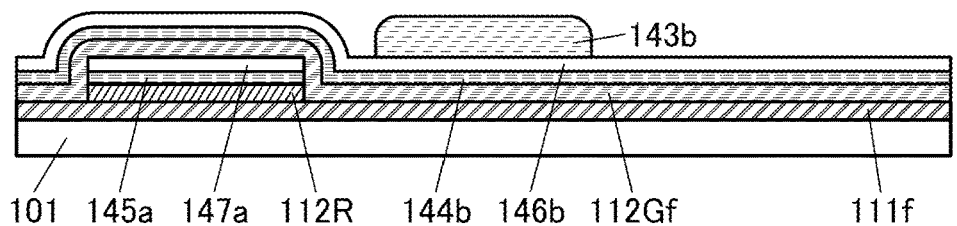

Next, a resist mask 143b is formed over the protective film 146b (FIG. 17C).

Then, the protective film 146b is etched with use of the resist mask 143b, so that a protective layer 147b is formed. After that, the resist mask 143b is removed.

Figure 17D:
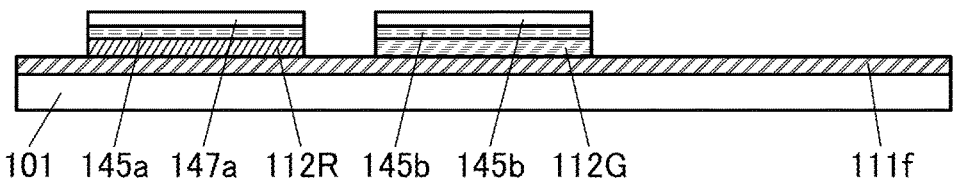

Next, the sacrificial film 144b and the EL film 112Gf are each etched with use of the protective layer 147b as a mask, so that a sacrificial layer 145b and the EL layer 112G are formed (FIG. 17D).

Next, the EL film 112Bf that is to be the EL layer 112B later is formed over the sacrificial layer 145a, the sacrificial layer 145b, and the exposed conductive film 111f. For the EL film 112Bf, the description of the EL film 112Rf can be referred to.

Next, a sacrificial layer 144c is formed over the EL film 112Bf, and a protective film 146c is formed over the sacrificial layer 144c. For the sacrificial layer 144c, the description of the sacrificial film 144a can be referred to. For the protective film 146c, the description of the protective film 146a can be referred to.

Figure 17E:
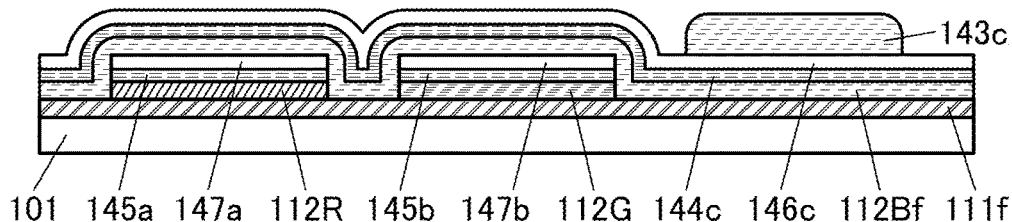

Next, a resist mask 143c is formed over the protective film 146c (FIG. 17E).

Then, the protective film 146c is etched with use of the resist mask 143c, so that a protective layer 147c is formed. After that, the resist mask 143c is removed.

Figure 17F:
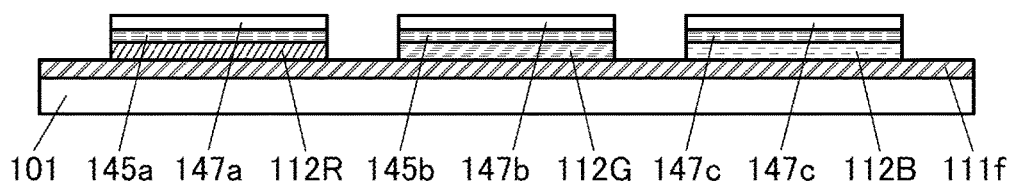

Next, the sacrificial layer 144c and the EL film 112Bf are each etched with use of the protective layer 147c as a mask, so that a sacrificial layer 145c and the EL layer 112B are formed (FIG. 17F).

[Formation of Pixel Electrode 111R, Pixel Electrode 111G, and Pixel Electrode 111B]

Figure 18A:
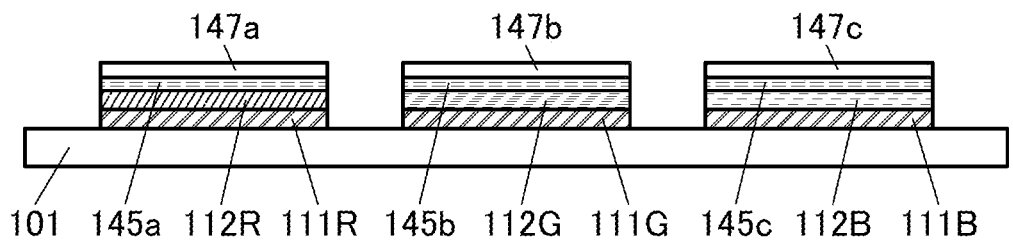
FIG. 18A to FIG. 18E are cross-sectional views showing an example of a method for manufacturing a display device and a structure example of the display device.

Next, part of the conductive film 111f that is not covered with the EL layer 112R, the EL layer 112G, the EL layer 112B, the sacrificial layer 145a, the sacrificial layer 145b, the sacrificial layer 145c, the protective layer 147a, the protective layer 147b, or the protective layer 147c is etched, so that the pixel electrode 111R, the pixel electrode 111G, and the pixel electrode 111B are formed (FIG. 18A).

The etching of the conductive film 111f can be performed by wet etching or dry etching. Here, dry etching with the use of an etching gas not containing oxygen as its main component is used for the etching conditions of the conductive film 111f, whereby damage to the EL layer 112 can be reduced. Furthermore, as described later with reference to FIG. 19A to FIG. 19E, damage to the EL layer 112 is reduced in some cases when the pixel electrode 111R, the pixel electrode 111G, and the pixel electrode 111B are formed in advance.

[Formation of Insulating Layer 131]

Figure 18B:
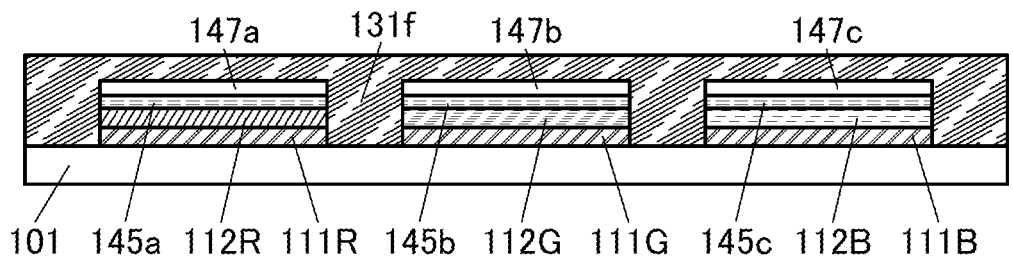

Next, an insulating film 131f to be the insulating layer 131 is formed (FIG. 18B). The insulating film 131f is provided so as to cover the protective layer 147, the sacrificial layer 145, the EL layer 112, and the pixel electrode 111. The insulating film 131f is preferably a planarization film.

A resin is preferably used for the insulating film 131f. The insulating film 131f is an organic insulating film, for example.

Examples of materials that can be used for the insulating film 131f include an acrylic resin, a polyimide resin, an epoxy resin, a polyamide resin, a polyimide-amide resin, a siloxane resin, a benzocyclobutene-based resin, a phenol resin, and precursors of these resins.

Figure 18C:
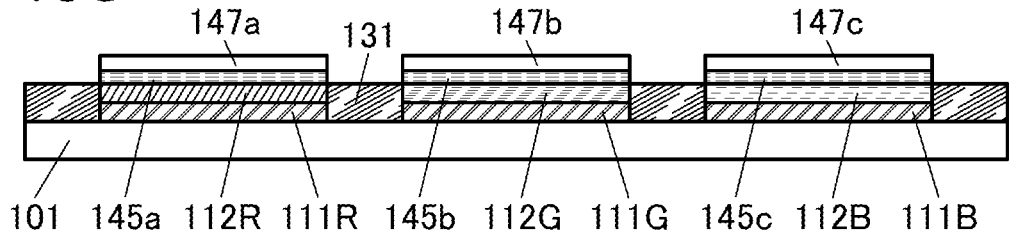

Next, the insulating film 131f is etched to expose the top surface of the protective layer 147 (FIG. 18C). The etching of the insulating film 131f is performed substantially uniformly on the top surface of the insulating film 131f. Such uniform etching for planarization is also referred to as etch back.

A dry etching method or a wet etching method can be used for the etching of the insulating film 131f. The etching of the insulating film 131f may be performed by ashing using oxygen plasma. Note that the ashing using oxygen plasma has advantages such as high controllability, good in-plane uniformity, and high suitability for treatment using a large-sized substrate and thus can be suitably used for removal of part of the insulating film 131f. Chemical mechanical polishing (CMP) may be used for the etching of the insulating film 131f.

Note that it is preferable to reduce damage to the EL layer 112 due to etching at the time of etching the insulating film 131f. For this reason, the insulating film 131f is preferably etched so that an exposed portion of the side surface of the EL layer 112 is small, for example.

Furthermore, it is possible to reduce damage to the top surface of the EL layer 112 due to etching by performing the etching of the insulating film 131*f* in the state where the sacrificial layer 145 is provided over the EL layer 112.

As shown in FIG. 18C, the etching of the insulating film 131*f* is performed so that the top surface of the insulating layer 131 is substantially aligned with the top surface of the EL layer 112. When the insulating layer 131 is provided so that the top surface of the insulating layer 131 is aligned with the top surface of the EL layer, unevenness of the surface where the common electrode 113 is provided can be made small at the time of formation of the common electrode 113, which is shown in FIG. 18E described later, and coverage can be increased.

FIG. 18C shows an example where the insulating layer 131 is formed so that the top surface and the side surface of the protective layer 147 and the side surface of the sacrificial layer 145 are exposed.

The surface planarity of the insulating film 131*f* may change due to unevenness of the formation surface and the sparseness and density of the pattern formed on the formation surface. The planarity of the insulating film 131*f* may change due to the viscosity of a material used for the insulating film 131*f*.

The thickness of the insulating film 131*f* is smaller, for example, in a region between a plurality of EL layers 112 than in a region over the EL layer 112. In such a case, for example, etch back of the insulating film 131*f* is performed, whereby the level of the top surface of the insulating layer 131 becomes lower than the level of the top surface of the protective layer 147 or the level of the top surface of the sacrificial layer 145 in some cases.

The insulating film 131*f* has a depressed shape or bulging shape in a region between the plurality of EL layers 112 in some cases.

FIG. 18C shows an example where the insulating layer 131 is provided so that the top surface of the insulating layer 131 is substantially aligned with the top surface of the EL layer; however, as described in detail later with reference to FIG. 20A to FIG. 20D, the insulating layer 131 may be provided so that the top surface of the insulating layer 131 is higher than the top surface of the EL layer 112. Alternatively, as described in detail later with reference to FIG. 21A and FIG. 21B, the insulating layer 131 may be provided so that the top surface of the insulating layer 131 is lower than the top surface of the EL layer 112.

Figure 22C:
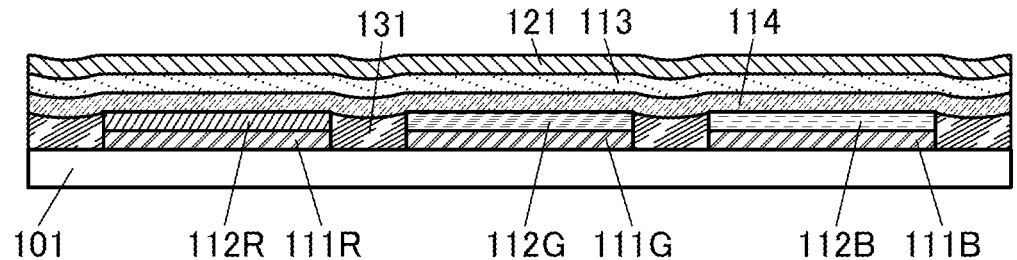
Figure 23B:
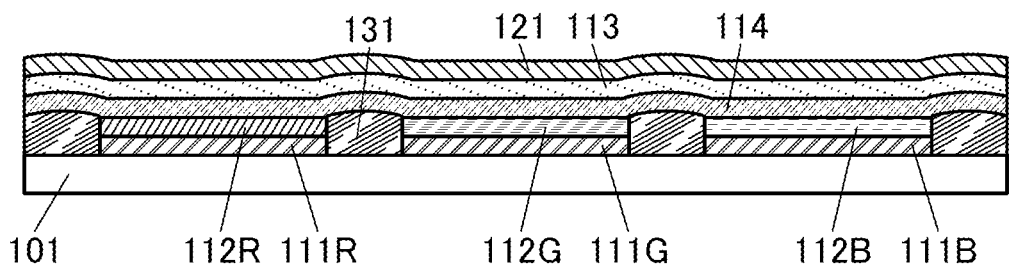

The shape of the top surface of the insulating layer 131 may have a depression portion as described in detail later with reference to FIG. 22A to FIG. 22C. The shape of the top surface of the insulating layer 131 may have a projection portion as described in detail later with reference to FIG. 23A and FIG. 23B.

The shape and level of the top surface of the insulating layer 131 may change due to removal of the protective layers and the sacrificial layers, which is described later with reference to FIG. 18D.

[Removal of Protective Layers and Sacrificial Layers]

Figure 18D:
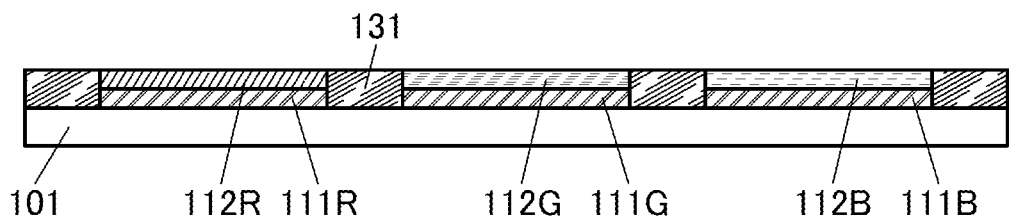
Figure 18E:
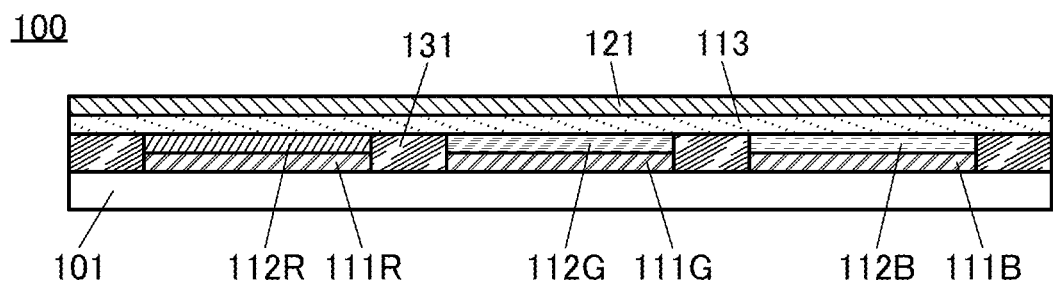

Next, the protective layer 147*a*, the protective layer 147*b*, the protective layer 147*c*, the sacrificial layer 145*a*, the sacrificial layer 145*b*, and the sacrificial layer 145*c* are removed to expose the top surfaces of the EL layer 112R, the EL layer 112G, and the EL layer 112B (FIG. 18D).

In the example shown in FIG. 18D, the insulating layer 131 is provided so that the level of the top surface of the insulating layer 131 is substantially the same as the level of the top surface of the EL layer 112. In FIG. 18D, the top surface of the EL layer 112 is exposed, and the side surface of the EL layer 112 is covered with the insulating layer 131. The side surface of the EL layer 112 is covered with the insulating layer 131, whereby damage to the EL layer due to etching of the protective layer 147 can be reduced.

The protective layer 147*a*, the protective layer 147*b*, and the protective layer 147*c* can be removed by wet etching or dry etching.

The sacrificial layer 145*a*, the sacrificial layer 145*b*, and the sacrificial layer 145*c* can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed. With use of these conditions of wet etching, for example, damage to the insulating layer can be reduced.

In this manner, the EL layer 112R, the EL layer 112G, and the EL layer 112B can be formed separately.

[Formation of Common Electrode 113]

Next, the common electrode 113 is formed to cover the EL layer 112R, the EL layer 112G, and the EL layer 112B. The common electrode 113 can be formed by a sputtering method or an evaporation method, for example.

Through the above steps, the light-emitting element 110R, the light-emitting element 110G, and the light-emitting element 110B can be manufactured.

[Formation of Protective Layer 121]

Next, the protective layer 121 is formed over the common electrode 113 (FIG. 18E). An inorganic insulating film used for the protective layer 121 is preferably deposited by a sputtering method, a PECVD method, or an ALD method. In particular, an ALD method is preferable because a film deposited by ALD has good step coverage and is less likely to cause a defect such as pinhole. An organic insulating film is preferably formed by an inkjet method because a uniform film can be formed in a desired area.

Through the above steps, the display device 100 shown in FIG. 15B and FIG. 15C can be manufactured.

Since process damage to the EL layer 112R, the EL layer 112G, and the EL layer 112B can be reduced with the use of the above manufacturing method, an extremely highly reliable display device can be achieved.

[Formation of Common Layer 114]

Note that the display device 100A shown in FIG. 16A and FIG. 16B can be manufactured when the common layer 114 is formed to cover the EL layer 112R, the EL layer 112G, and the EL layer 112B before the common electrode 113 is formed and then the common electrode 113 is formed.

Modification Example of Structure Example 2

Note that the pixel electrode 111R, the pixel electrode 111G, and the pixel electrode 111B may be formed before the EL film 112Rf is formed.

Figure 19A:
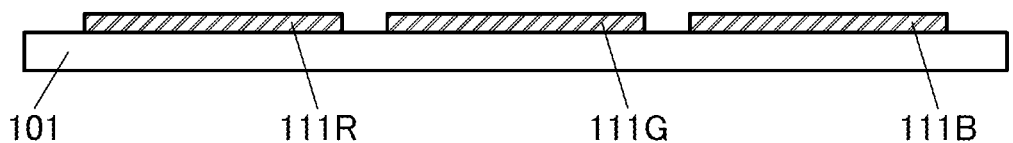
FIG. 19A to FIG. 19E are cross-sectional views showing an example of a method for manufacturing a display device and structural examples of the display device.
Figure 19B:
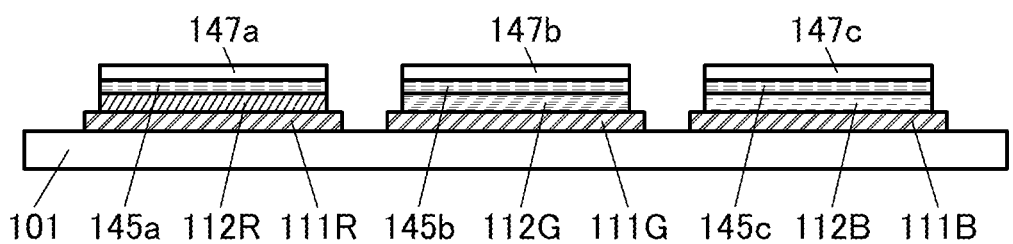
Figure 19C:
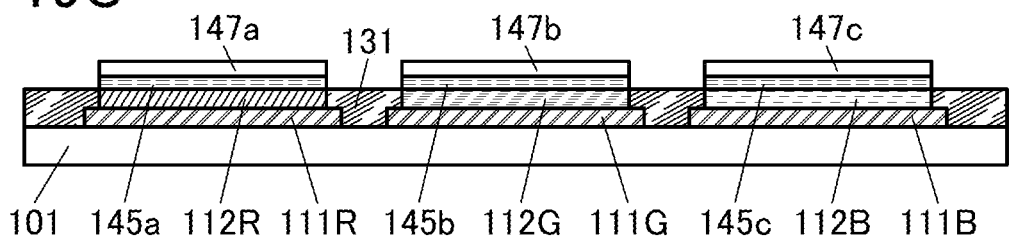
Figure 19D:
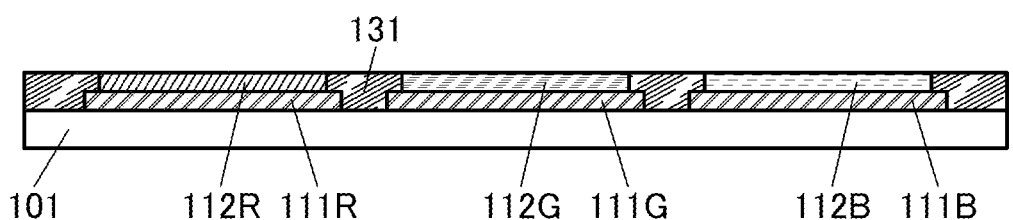

First, as shown in FIG. 19A, the pixel electrode 111R, the pixel electrode 111G, and the pixel electrode 111B are formed. After that, as described with reference to FIG. 17A to FIG. 17F, the EL layer 112, the sacrificial layer 145, and the protective layer 147 which correspond to each of the light-emitting elements 110 are formed using a resist mask (FIG. 19B). Then, the insulating layer 131 is formed (FIG.

Figure 19E:
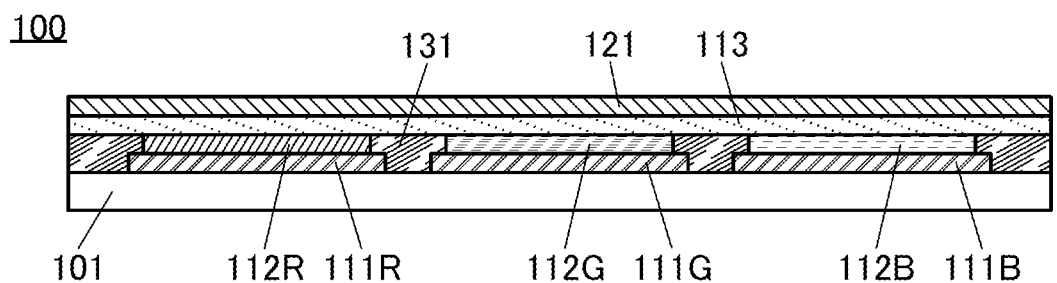

19C), and the sacrificial layer 145 and the protective layer 147 are removed (FIG. 19D) to obtain the display device 100 shown in FIG. 19E.

In each of the light-emitting elements 110 shown in FIG. 19E, the end portion of the pixel electrode 111 is positioned outside the end portion of the EL layer 112. In the top surface of the pixel electrode 111, the end portion and its vicinity are covered with the insulating layer 131.

Structure Example 3

Note that the insulating layer 131 may be provided so that the top surface of the insulating layer 131 is higher than the top surface of the EL layer 112.

The structure shown in FIG. 20A is different from the structure shown in FIG. 18C in that the insulating layer 131 is provided so that the top surface of the insulating layer 131 is higher than the top surface of the EL layer 112.

In the structure shown in FIG. 20A, the protective layer 147 and the sacrificial layer 145 are removed to obtain the structure shown in FIG. 20B. In FIG. 20B, the insulating layer 131 is provided so that the top surface of the insulating layer 131 is higher than the top surface of the EL layer 112, and the end surface of the insulating layer 131 is partly exposed. Note that part of the insulating layer 131 may be etched by the removal of the protective layer 147 and the sacrificial layer 145 to change the shape of the insulating layer 131. For example, the thickness of the insulating layer 131 may be reduced. Furthermore, for example, a corner formed by the top surface and the side surface of the insulating layer 131 may be rounded. Moreover, for example, the shape of the top surface of the insulating layer 131 may change into a projecting shape or depressed shape. When the corner formed by the top surface and the side surface of the insulating layer 131 is rounded, coverage with the common electrode 113 or the common layer 114 is improved in some cases.

In the step shown in FIG. 20B, the common electrode 113 and the protective layer 121 are formed to obtain the display device 100 shown in FIG. 20C. In addition, in the step shown in FIG. 20B, the common layer 114, the common electrode 113, and the protective layer 121 are formed to obtain the display device 100A shown in FIG. 20D.

When the top surface of the insulating layer 131 is made higher than the top surface of the EL layer 112, the side surface of the EL layer 112 can be covered with the insulating layer 131. Accordingly, damage to the EL layer 112 in the removal of the protective layer 147 can be reduced.

Structure Example 4

Figure 21B:
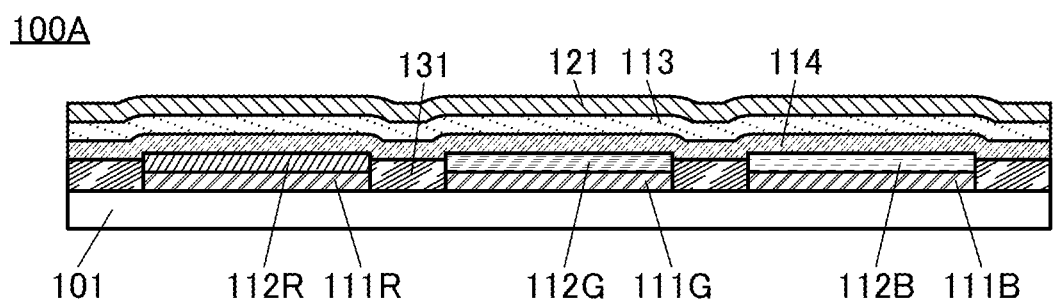

When the insulating layer 131 is provided so that the top surface of the insulating layer 131 is lower than the top surface of the EL layer 112, the display device 100 shown in FIG. 21A and the display device 100A shown in FIG. 21B are obtained.

The insulating layer 131 is provided so that the top surface of the insulating layer 131 is lower than the top surface of the EL layer 112, whereby coverage of the top surface of the EL layer 112 with the common electrode 113 or the common layer 114 is improved in some cases.

Structure Example 5

The top surface of the insulating layer 131 has a depression portion in some cases.

FIG. 22A shows a structure after etch back of the insulating film 131f is performed. As shown in FIG. 22A, the shape of the top surface of the insulating layer 131, which is formed by the etch back, has a depression portion in some cases. The shape of the top surface of the insulating layer 131 has a gently sloping depression, for example.

In the structure of FIG. 22A, the common electrode 113 and the protective layer 121 are formed to obtain the display device 100 shown in FIG. 22B. Alternatively, in the structure of FIG. 22A, the common layer 114, the common electrode 113, and the protective layer 121 are formed to obtain the display device 100A shown in FIG. 22C.

Structure Example 6

The shape of the top surface of the insulating layer 131 has a projection portion in some cases. The shape of the top surface of the insulating layer 131 shown in FIG. 23A and FIG. 23B has a gently curved surface projecting upward.

In the display device 100 shown in FIG. 23A, the common electrode 113 is provided over the EL layers 112 and the insulating layer 131 that is provided between the plurality of EL layers and has a top surface shape with a projection portion. In the display device 100 shown in FIG. 23B, the common layer 114 is provided over the EL layers 112 and the insulating layer 131 that is provided between the plurality of EL layers and has a top surface shape with a projection portion.

At least part of this embodiment can be implemented in combination with the other embodiments described in this specification as appropriate.

Embodiment 6

In this embodiment, structure examples of a display device of one embodiment of the present invention are described.

[Display Device 400A]

Figure 24:
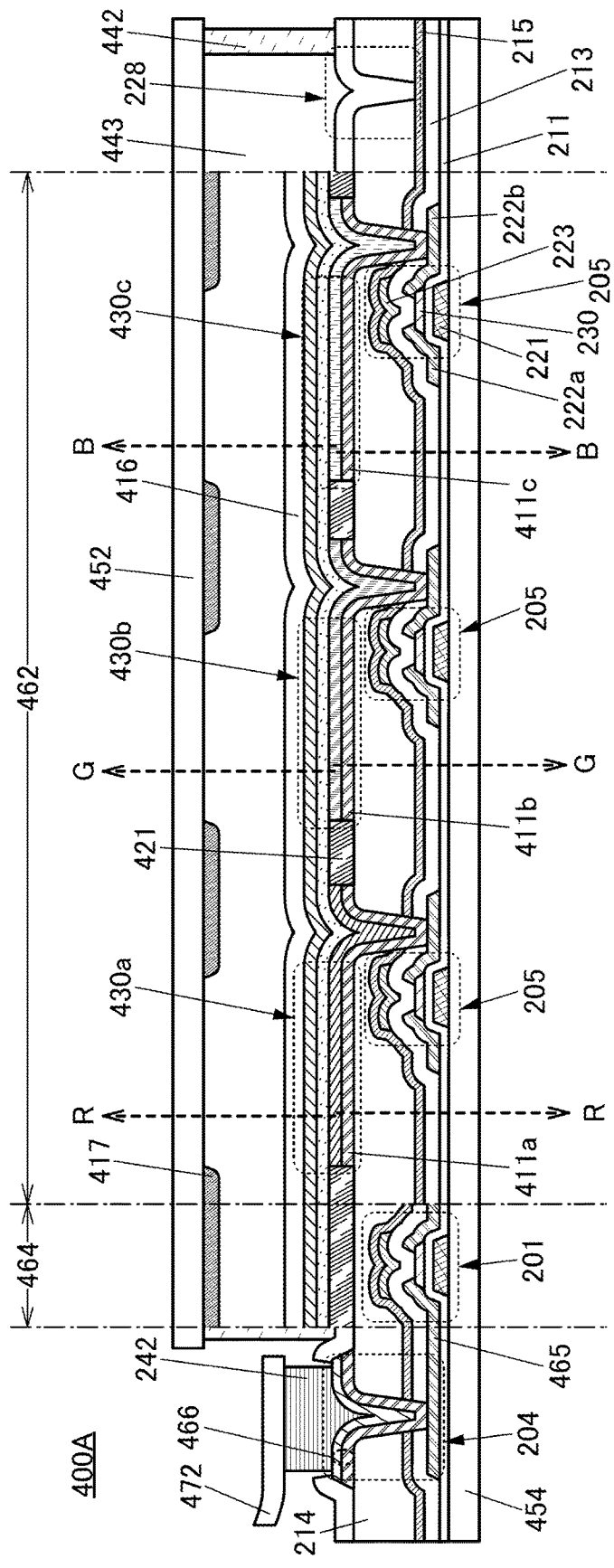
FIG. 24 is a cross-sectional view showing an example of a display device.
Figure 38:
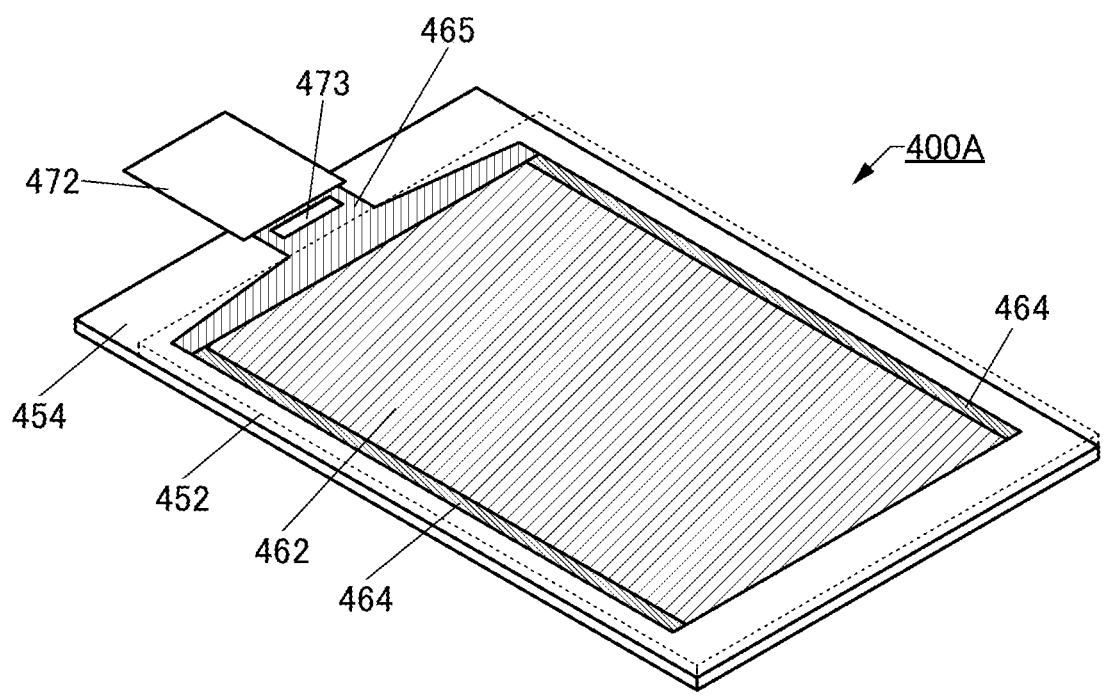
FIG. 38 is a perspective view showing an example of a display device.

FIG. 24 shows a cross-sectional view of a display device 400A. FIG. 38 is a perspective view of the display device 400A corresponding to FIG. 24.

The display device 400A has a structure in which a substrate 452 and a substrate 454 are bonded to each other. In FIG. 38, the substrate 452 is denoted by a dashed line.

The display device 400A includes a display portion 462, a circuit 464, and a wiring 465. FIG. 38 shows an example where an IC 473 and an FPC 472 are mounted on the display device 400A. Thus, the structure shown in FIG. 38 can be referred to as a display panel including the display device 400A, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or from the IC 473.

FIG. 38 shows an example where the IC 473 is provided over the substrate 454 by a COG (Chip On Glass) method or a COF (Chip on Film) method. An IC including a scan line driver circuit or a signal line driver circuit can be used as the IC 473, for example. Note that the display device 400A and the display module are not necessarily provided with an IC. The IC may be mounted on the FPC by a COF method. The structure of the display device 400A shown in FIG. 38, i.e., the device including the display portion, the IC, and the FPC is referred to as a display module in some cases.

Figure 25:
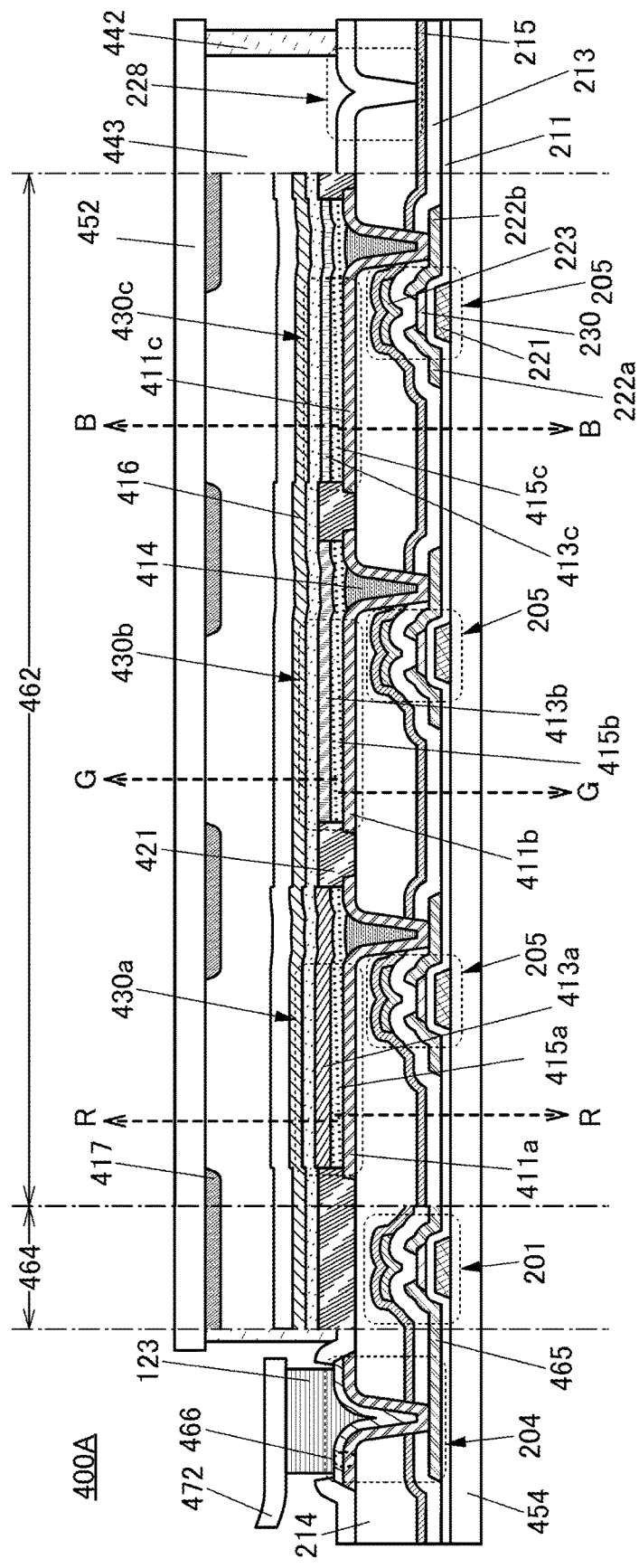
FIG. 25 is a cross-sectional view showing an example of a display device.

FIG. 25 shows an example of cross sections of part of a region including the FPC 472, part of the circuit 464, part of the display portion 462, and part of a region including an end portion of the display device 400A.

The display device 400A shown in FIG. 25 includes a transistor 201, a transistor 205, a light-emitting element 430a that emits red light, a light-emitting element 430b that emits green light, and a light-emitting element 430c that emits blue light, between the substrate 454 and the substrate 452.

The light-emitting element described in Embodiment 3 can be employed for the light-emitting element 430a, the light-emitting element 430b, and the light-emitting element 430c.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure or a hollow sealing structure can be employed to seal the light-emitting elements. In FIG. 25, a space 443 surrounded by the substrate 452, the adhesive layer 442, and the substrate 454 is filled with an inert gas (nitrogen or argon), that is, a hollow sealing structure is employed. The adhesive layer 442 may be provided so as to overlap with the light-emitting element. The space 443 surrounded with the substrate 452, the adhesive layer 442, and the substrate 454 may be filled with a resin different from that of the adhesive layer 442.

Pixel electrodes 411a, 411b, and 411c are each connected to a conductive layer 222b included in the transistor 205 through an opening provided in an insulating layer 214. The pixel electrode contains a material that transmits visible light, and an counter electrode contains a material that transmits visible light.

An insulating layer 421 is provided between the light-emitting element 430a and the light-emitting element 430b and between the light-emitting element 430b and the light-emitting element 430c. At the time of forming the insulating layer 421, the insulating layer in the vicinity of a terminal portion is removed using a mask.

Light emitted by the light-emitting element is emitted toward the substrate 452 side or the substrate 454 side. For the substrate 454 and the substrate 452, a material having a high visible-light-transmitting property is preferably used.

The transistor 201 and the transistors 205 are formed over the substrate 454. These transistors can be formed using the same materials in the same steps.

The insulating layer 211, an insulating layer 213, an insulating layer 215, and the insulating layer 214 are provided in this order over the substrate 454. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may be used. A stack including two or more of the above insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed so that an end portion of the organic insulating film is positioned on the inner side compared to the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 shown in FIG. 25, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

Note that as shown in FIG. 26, after the pixel electrodes 411a, 411b, and 411c are formed in openings provided in the insulating layer 214, a layer 414 may be provided so as to fill the depression portions formed to cover the opening portions. With the layer 414, unevenness of surfaces where optical adjustment layers 415a, 415b, and 415c and EL layers 413a, 413b, and 413c are formed can be reduced to improve coverage.

The layer 414 is preferably an insulating layer. Alternatively, the layer 414 may be a conductive layer.

Each of the transistor 201 and the transistors 205 includes a conductive layer 221 functioning as a gate, the insulating layer 211 functioning as a gate insulating layer, a conductive layer 222a and the conductive layer 222b functioning as a source and a drain, a semiconductor layer 230, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 230. The insulating layer 213 is positioned between the conductive layer 223 and the semiconductor layer 230.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used because deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment. Alternatively, the semiconductor layer of the transistor may include silicon. Examples of silicon include amorphous silicon and crystalline silicon (low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 454 that does not overlap with the substrate 452. In the connection portion 204, the wiring 465 is electrically connected to the FPC 472 through a conductive layer 466 and the anisotropic conductive connection layer 123. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the anisotropic conductive connection layer 123.

A light-blocking layer 417 is preferably provided on a surface of the substrate 452 on the substrate 454 side. Any of a variety of optical members can be arranged on the outer side of the substrate 452. Examples of the optical members include a polarizing plate, a retardation plate, a light diffusion layer (a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, or a shock absorbing layer may be provided on the outer side of the substrate 452.

With the protective layer 416 covering the light-emitting element, entry of impurities such as water into the light-emitting element can be inhibited, leading to an increase in the reliability of the light-emitting element.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display device 400A can be increased.

For each of the substrate 454 and the substrate 452, glass, quartz, ceramic, sapphire, or resin can be used. The substrate on the side where light from the light-emitting element is extracted is formed using a material that transmits the light. When a flexible material is used for the substrate 454 and the substrate 452, the flexibility of the display device can be increased. Furthermore, a polarizing plate may be used as the substrate 454 or the substrate 452.

For each of the substrate 454 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 454 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, a photocurable adhesive such as an ultraviolet curable adhesive, a reactive curable adhesive, a thermosetting adhesive, or an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet may be used.

As the anisotropic conductive connection layer 123, an anisotropic conductive film (ACF) or an anisotropic conductive paste (ACP) can be used.

Examples of materials that can be used for the gates, the sources, and the drains of the transistors and conductive layers such as a variety of wirings and electrodes included in the display device include metals such as aluminum, titanium, chromium, nickel, copper, yttrium, zirconium, molybdenum, silver, tantalum, and tungsten, and an alloy containing any of these metals as its main component. A film containing any of these materials can be used in a single layer or as a stacked-layer structure.

As the light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of an alloy of silver and magnesium and indium tin oxide is preferably used for increased conductivity. These can also be used, for example, for conductive layers such as a variety of wirings and electrodes included in the display device, or conductive layers (conductive layers functioning as the pixel electrode and the common electrode) included in the light-emitting element.

As an insulating material that can be used for each insulating layer, for example, an acrylic resin, an epoxy resin, or an inorganic insulating material such as silicon oxide, silicon oxynitride, silicon nitride oxide, silicon nitride, or aluminum oxide can be given.

[Display Device 400B]

FIG. 26A shows a cross-sectional view of a display device 400B. A perspective view of the display device 400B is similar to that of the display device 400A (FIG. 38). FIG. 26A shows an example of cross sections of part of a region including the FPC 472, part of the circuit 464, and part of the display portion 462 in the display device 400B. FIG. 26A specifically shows an example of a cross section of a region including light-emitting element 430b that emits green light and the light-emitting element 430c that emits blue light in the display portion 462. Note that portions similar to those of the display device 400A are not described in some cases.

The display device 400B shown in FIG. 26A includes a transistor 202, a transistor 217, the light-emitting element 430b, and the light-emitting element 430c between a substrate 453 and the substrate 454.

The substrate 454 and the protective layer 416 are bonded to each other with the adhesive layer 442. The adhesive layer 442 is provided so as to overlap with each of the light-emitting element 430b and the light-emitting element 430c, and the display device 400B employs a solid sealing structure.

The substrate 453 and the insulating layer 212 are bonded to each other with an adhesive layer 455.

In a method for manufacturing the display device 400B, first, a formation substrate provided with an insulating layer 212, the transistors, and the light-emitting elements is bonded to the substrate 454 provided with the light-blocking layer 417 with the adhesive layer 442. Then, the substrate 453 is bonded to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used as the insulating layer 211, the insulating layer 213, and the insulating layer 215 can be used as the insulating layer 212.

The pixel electrode is connected to the conductive layer 222b included in the transistor 217 through an opening provided in the insulating layer 214. The conductive layer 222b is connected to a low low-resistance region 230n through an opening provided in the insulating layer 215 and an insulating layer 225. The transistor 217 has a function of controlling the driving of the light-emitting element.

An end portion of the pixel electrode is covered with the insulating layer 421.

Light emitted by the light-emitting elements 430b and 430c is emitted toward the substrate 454 side or the substrate 453 side. For the substrate 453 and the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the anisotropic conductive connection layer 123. The conductive layer 466 can be obtained by processing the same conductive film as the pixel electrode. Thus, the connection portion 204 and the FPC 472 can be electrically connected to each other through the anisotropic conductive connection layer 123.

Each of the transistor 202 and the transistor 217 includes the conductive layer 221 functioning as a gate, the insulating layer 211 functioning as a gate insulating layer, a semiconductor layer including a channel formation region 230i and a pair of low-resistance regions 230n, the conductive layer 222a connected to one of the pair of low-resistance regions 230n, the conductive layer 222b connected to the other of the pair of low-resistance regions 230n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 230i. The insulating layer 225 is positioned between the conductive layer 223 and the channel formation region 230i.

The conductive layer 222a and the conductive layer 222b are connected to the corresponding low-resistance regions 230n through openings provided in the insulating layer 215. One of the conductive layer 222a and the conductive layer 222b functions as a source, and the other functions as a drain.

FIG. 26A shows an example where the insulating layer 225 covers the top surface and a side surface of the semiconductor layer. The conductive layer 222a and the conductive layer 222b are connected to the corresponding low-resistance regions 230n through openings provided in the insulating layer 225 and the insulating layer 215.

The transistors formed over the substrate 453 are not limited to the transistor 202 and the transistor 217 shown in FIG. 26A, and a transistor 209 shown in FIG. 26B can also be used.

In the transistor 209 shown in FIG. 26B, the insulating layer 225 overlaps with the channel formation region 230i of the semiconductor layer 230 and does not overlap the low-resistance regions 230n. The structure shown in FIG. 26B can be obtained by processing the insulating layer 225 with the conductive layer 223 as a mask, for example. In FIG. 26B, the insulating layer 215 is provided to cover the insulating layer 225 and the conductive layer 223, and the conductive layer 222a and the conductive layer 222b are connected to the low-resistance regions 230n through the openings in the insulating layer 215. Furthermore, an insulating layer 218 covering the transistor may be provided.

At least part of the structure examples and the drawings corresponding thereto described in this embodiment as an example can be combined with the other structure examples, the other drawings, and the like as appropriate.

Embodiment 7

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements that emit light of different colors. The light-emitting elements each include a pair of electrodes and an EL layer between them. The light-emitting elements are preferably organic EL elements (organic electroluminescent elements). The two or more light-emitting elements emitting different colors include respective EL layers containing different materials. For example, three kinds of light-emitting elements emitting red (R), green (G), and blue (B) light are included, whereby a full-color display device can be obtained.

As a way of forming EL layers separately between light-emitting elements of different colors, an evaporation method using a shadow mask that is a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high resolution and high aperture ratio. Thus, a measure has been taken for pseudo improvement in resolution (also referred to pixel density) by employing a unique pixel arrangement such as a PenTile arrangement.

In one embodiment of the present invention, fine patterning of an EL layer is performed without a shadow mask that is a metal mask. With this, a display device with high-resolution and a high aperture ratio, which has been difficult to achieve, can be fabricated. Moreover, EL layers can be formed separately, enabling the display device to perform extremely clear display with high contrast and high display quality.

Here, a description is made on a case where EL layers in light-emitting elements of two colors are separately formed, for simplicity. First, a stack of a first EL film and a first sacrificial layer is formed to cover two pixel electrodes. Next, a resist mask is formed over the first sacrificial layer in a position overlapping with one pixel electrode (a first pixel electrode). Then, the resist mask, part of the first sacrificial layer, and part of the first EL film are etched. At this time, the etching is stopped when the other pixel electrodes (a second pixel electrode) are exposed. Thus, part of the first EL film processed into a belt-like or island shape (also referred to as a first EL layer) can be formed over the first pixel electrode, and part of the sacrificial layer (also referred to as a first sacrificial layer) can be formed thereover.

Next, a stack of a second EL film and a second sacrificial layer is formed. Then, resist masks are formed in a position overlapping with the first pixel electrode and in a position overlapping with the second pixel electrode. Then, the resist masks, part of the second sacrificial layer, and part of the second EL film are etched in a manner similar to the above. As a result, the first EL layer and the first sacrificial layer are provided over the first pixel electrode, and a second EL layer and a second sacrificial layer are provided over the second pixel electrode. In this manner, the first EL layer and the second EL layer can be formed separately. Finally, the first sacrificial layer and second sacrificial layer are removed, and a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three color or four or more colors can be achieved.

It is difficult to set the distance between the EL layers for different colors to be less than 10 µm with a formation method using a metal mask, for example; however, with use of the above method, the distance can be decreased to be less than or equal to 3 µm, less than or equal to 2 µm, or less than or equal to 1 µm. For example, with use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the above manufacturing method, a pattern is formed by processing a film deposited to have a uniform thickness, which enables a uniform thickness in the pattern; thus, even with a fine pattern, almost the entire area can be used as a light-emitting region. Therefore, the above manufacturing method makes it possible to achieve both a high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile arrangement; therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

More specific examples of the structure and manufacturing method of the display device of one embodiment of the present invention are described below with reference to drawings.

Structure Example 1

Figure 27A:
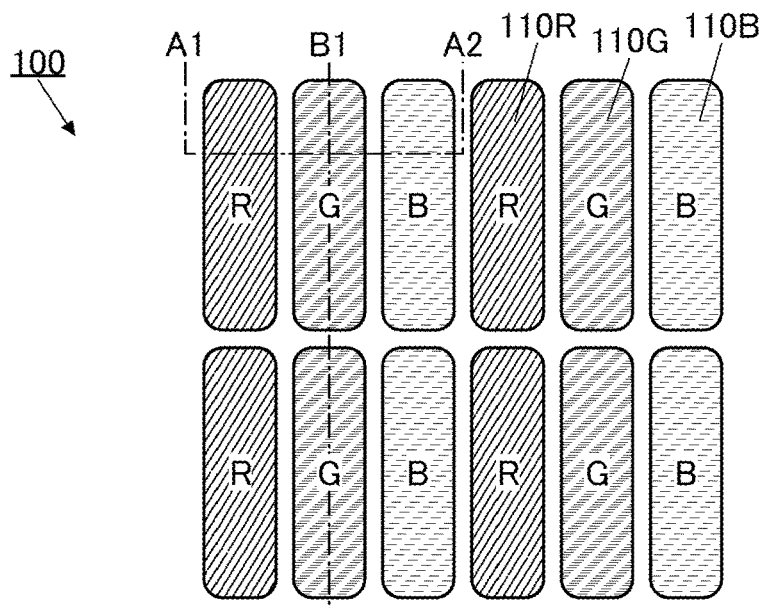
FIG. 27A is a top view showing an example of a display device.

FIG. 27A is a schematic top view of the display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 27A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 27A shows what is called a stripe arrangement, in which the light-emitting elements of the same color are arranged in one direction.

As the light-emitting elements 110R, the light-emitting elements 110G, and the light-emitting element 110B, EL elements such as OLEDs (Organic Light Emitting Diodes) or QLEDs (Quantum-dot Light Emitting Diodes) are preferably used. As a light-emitting substance contained in the EL element, a substance that emits fluorescence (a fluorescent material), a substance that emits phosphorescence (a phosphorescent material), an inorganic compound (a quantum dot material), or a substance that exhibits thermally activated delayed fluorescence (a thermally activated delayed fluorescent (TADF) material) can be given.

Figure 27B:
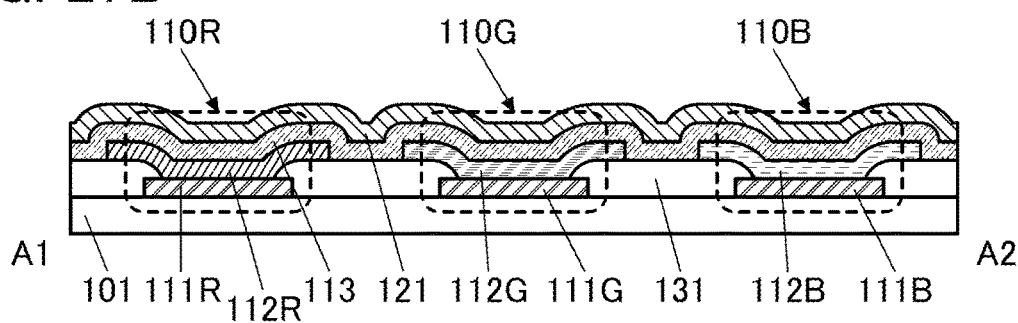
FIG. 27B to FIG. 27D are cross-sectional views showing structure examples of the display device.
Figure 27C:
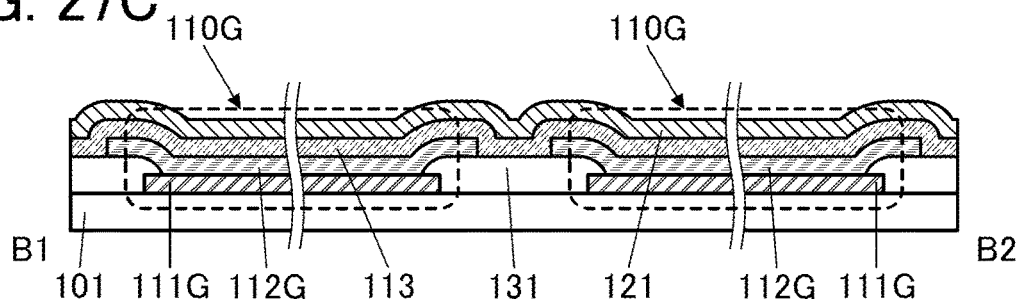

FIG. 27B is a schematic cross-sectional view taken along the dashed-dotted line A1-A2 in FIG. 27A, and FIG. 27C is a schematic cross-sectional view taken along the dashed-dotted line B1-B2.

FIG. 27B shows cross sections of the light-emitting element 110R, the light-emitting element 110G, and the light-emitting element 110B. The light-emitting element 110R includes the pixel electrode 111R, the EL layer 112R, and the common electrode 113. The light-emitting element 110G includes the pixel electrode 111G, the EL layer 112G, and the common electrode 113. The light-emitting element 110B includes the pixel electrode 111B, the EL layer 112B, and the common electrode 113.

The light-emitting element 110R includes the EL layer 112R between the pixel electrode 111R and the common electrode 113. The EL layer 112R contains at least a light-emitting organic compound that emits light with intensity in the red wavelength range. The EL layer 112G included in the light-emitting element 110G contains at least a light-emitting organic compound that emits light with intensity in the green wavelength range. The EL layer 112B included in the light-emitting element 110B contains at least a light-emitting organic compound that emits light with intensity in the blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer).

The pixel electrode 111R, the pixel electrode 111G, and the pixel electrode 111B are provided for the respective light-emitting elements. The common electrode 113 is provided as a continuous layer shared by the light-emitting elements. Note that when both the pixel electrodes and the common electrode 113 transmit light, a dual-emission display device can be obtained.

A conductive film that has a property of transmitting visible light is used for either the respective pixel electrodes or the common electrode 113, and a reflective conductive film is used for the other. When the pixel electrodes are light-transmitting electrodes and the common electrode 113 is a reflective electrode, a bottom-emission display device is obtained; in contrast, when the respective pixel electrodes are reflective electrodes and the common electrode 113 is a light-transmitting electrode, a top-emission display device is obtained.

The insulating layer 131 is provided to cover the end portions of the pixel electrode 111R, the pixel electrode 111G, and the pixel electrode 111B. The end portion of the insulating layer 131 is preferably tapered. Note that the insulating layer 131 is not necessarily provided when not needed.

The EL layer 112R, the EL layer 112G, and the EL layer 112B each include a region in contact with the top surface of the pixel electrode and a region in contact with a surface of the insulating layer 131. The end portions of the EL layer 112R, the EL layer 112G, and the EL layer 112B are positioned over the insulating layer 131.

As shown in FIG. 27B, there is a gap between the EL layers of two light-emitting elements with different colors. In this manner, the EL layer 112R, the EL layer 112G, and the EL layer 112G are preferably provided so as not to be in contact with each other. This suitably prevents unintentional light emission due to a current flow through two adjacent EL layers. As a result, the contrast can be increased to achieve a display device with high display quality.

Figure 27D:
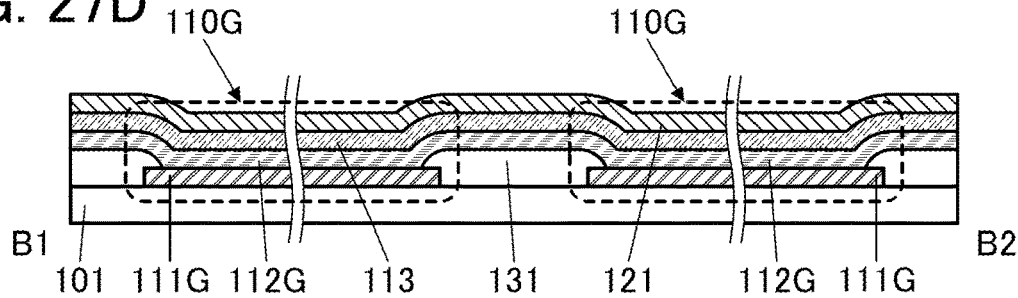

FIG. 27C shows an example where the EL layer 112G is processed into an island-like shape. Note that the EL layer 112G may be processed into a belt-like shape so as to be continuous in the column direction as shown in FIG. 27D. When the EL layer 112G is formed into a band-like shape, a space for dividing them is unnecessary and a non-light-emitting area between the light-emitting elements can be reduced, so that the aperture ratio can be increased. Note that FIG. 27C and FIG. 27D each show the cross section of the light-emitting element 110G as an example; the light-emitting element 110R and the light-emitting element 110B can also have a similar shape.

The protective layer 121 is provided over the common electrode 113 so as to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film, such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component is less affected by an uneven shape caused by the lower structure.

Manufacturing Method Example 3

An example of a manufacturing method of the display device of one embodiment of the present invention will be described below with reference to drawings. Here, description is made using the display device 100 described in the above structure example. FIG. 28A to FIG. 30D are schematic cross-sectional views in steps of the manufacturing method of the display device described below.

[Preparation for Substrate 101]

As the substrate 101 having a light-transmitting property, a substrate having at least heat resistance high enough to withstand heat treatment performed later can be used. In the case where an insulating substrate is used as the substrate 101 having a light-transmitting property, a glass substrate, a quartz substrate, a sapphire substrate, a ceramic substrate or an organic resin substrate can be used.

[Formation of Pixel Electrode 111R, Pixel Electrode 111G, and Pixel Electrode 111B]

Next, a plurality of pixel electrodes 111 are formed over the substrate 101 having a light-transmitting property. First, a conductive film to be the pixel electrodes is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

For each of the pixel electrodes, a conductive film having a property of transmitting visible light is used. For the pixel electrodes, a material that has a light transmittance as high as possible in the whole wavelength range of visible light (e.g., a transparent conductive film) is preferably used. For example, a conductive oxide such as indium oxide, indium tin oxide, indium zinc oxide, zinc oxide, zinc oxide containing gallium, indium tin oxide containing silicon, or indium zinc oxide containing silicon can be used. This can increase color reproducibility as well as light extraction efficiency of the light-emitting elements. Furthermore, a stack of the above-described conductive film having a light-transmitting property and a thin metal film (aluminum) that transmits visible light can also be used.

[Formation of Insulating Layer 131]

Figure 28A:
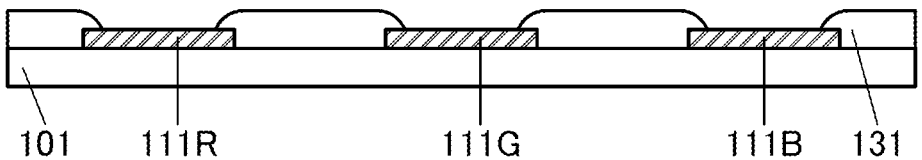
FIG. 28A to FIG. 28E are cross-sectional views showing an example of a method for manufacturing a display device.

Next, the insulating layer 131 is formed so as to cover the end portions of the pixel electrode 111R, the pixel electrode 111G, and the pixel electrode 111B (FIG. 28A). An organic insulating film or an inorganic insulating film can be used for the insulating layer 131. The end portion of the insulating layer 131 is preferably tapered to improve step coverage with an EL film formed later. In particular, when an organic insulating film is used, a photosensitive material is preferably used so that the shape of the end portions can be easily controlled by the conditions of light exposure and development. In this specification, for convenience, an angle formed by an inclined surface and a horizontal surface of the insulating layer 131 is referred as a taper angle, the inclined surface having the taper angle is referred to as a tapered shape, and a portion having the tapered shape is referred to as a tapered portion. The taper angle at the end portion of the insulating layer 131 is less than 90°.

[Formation of EL Film 112Rf]

Figure 28B:
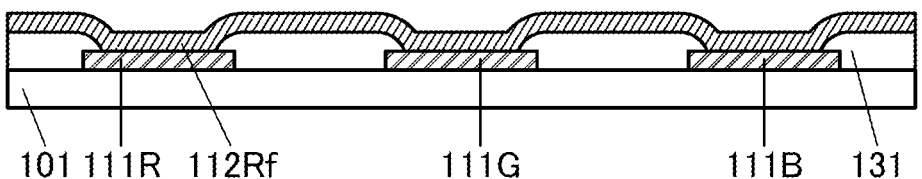

Subsequently, the EL film 112Rf to be the EL layer 112R is deposited over the pixel electrode 111R, the pixel electrode 111G, the pixel electrode 111B, and the insulating layer 131 (FIG. 28B).

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, as an evaporation method a sputtering method, or an inkjet method. Without limitation to this, the above-described deposition method can be used as appropriate.

[Formation of Sacrificial Layer 141a]

Figure 28C:
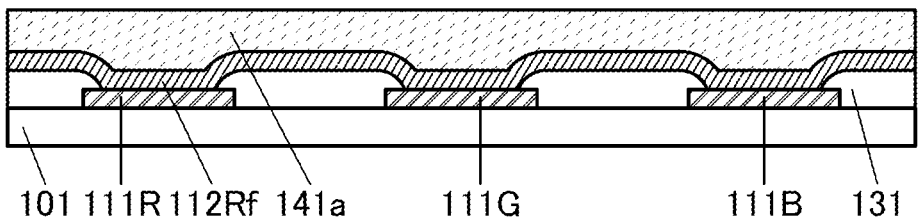

Subsequently, a sacrificial layer 141a is formed over the EL film 112Rf (FIG. 28C). The sacrificial layer 141a can be formed by a sputtering method, an ALD method (a thermal ALD method or a PEALD method), a CVD method, or a vacuum evaporation method, for example. A formation method that gives fewer damages to an EL layer is preferred, and an ALD method or a vacuum evaporation method is more suitable for the formation of the sacrificial layer 141a than a sputtering method.

For formation of the sacrificial layer 141a, a wet film formation method such as spin coating, dipping, spray coating, ink-jetting, dispensing, screen printing, offset printing, doctor blade coating, slit coating, roll coating, curtain coating, or knife coating can be favorably used. Other film formation methods such as an evaporation method and the above-described deposition methods can also be used as appropriate.

The sacrificial layer 141a is preferably formed using a material that can be dissolved in a solvent chemically stable with respect to at least the uppermost film of the EL film 112Rf. Specifically, a material that will be dissolved in water or alcohol can be suitably used for the sacrificial layer 141a. In deposition of the sacrificial layer 141a, it is preferable that application of such a material dissolved in a solvent such as water or alcohol be performed by the aforementioned wet process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

For the sacrificial layer 141a, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Resist Mask 143a]

Figure 28D:
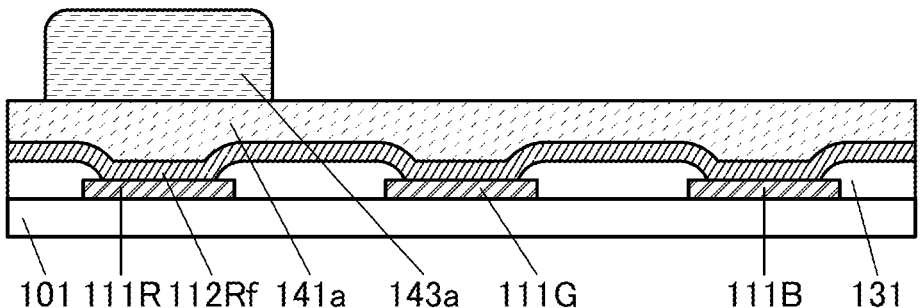

Next, the resist mask 143a is formed in a region that is over the sacrificial layer 141a and overlaps with the pixel electrode 111R (FIG. 28D). The resist mask 143a is preferably formed using an organic resin material that can be etched under the same etching condition as the sacrificial layer 141a.

For the resist mask 143a, a resist material containing a photosensitive resin such as a positive type resist material or a negative type resist material can be used.

[Etching of Sacrificial Layer 141a, Resist Mask 143a, and EL Film 112Rf]

Figure 28E:
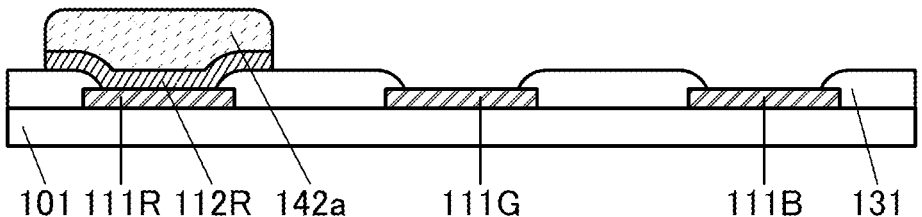

Next, the sacrificial layer 141a, the resist mask 143a, and the EL film 112Rf are etched to expose part of the top surface of the insulating layer 131, the top surface of the pixel electrode 111G, and the top surface of the pixel electrode 111B (FIG. 28E). Thus, the island-shaped or band-shaped EL layer 112R and the sacrificial layer 142a over the EL layer 112R can be formed.

The etching is preferably performed under the conditions that the sacrificial layer 141a, the resist mask 143a, and the EL film 112Rf can be etched. For the sacrificial layer 141a, a film which can be removed by a wet etching method is preferably used. The use of a wet etching method can reduce damage to the EL film in processing of the sacrificial layer 141a, as compared with the case of using a dry etching method. In the case of using a wet etching method, it is preferable to use a chemical solution of a developer, an aqueous solution of tetramethylammonium hydroxide (TMAH), dilute hydrofluoric acid, oxalic acid, phosphoric acid, nitric acid, acetic acid, or a mixed solution thereof, for example.

It is preferable to perform anisotropic dry etching, which can prevent an exposed side surface of the EL layer 112R from being etched and the pattern of the EL layer 112R from being reduced after the etching.

Note that the sacrificial layer 141a, the resist mask 143a, and the EL film 112Rf may be individually etched or any two of them may be etched in the same step. For example, the sacrificial layer 141a may be etched first; then, the resist mask 143a and the EL film 112Rf may be etched in the same step.

The sacrificial layer 142a preferably remains over the EL layer 112R when the etching is completed. This enables the sacrificial layer 142a to function as a protective layer that protects the EL layer 112R from damage in a later step.

[Formation of EL Film 112Gf]

Figure 29A:
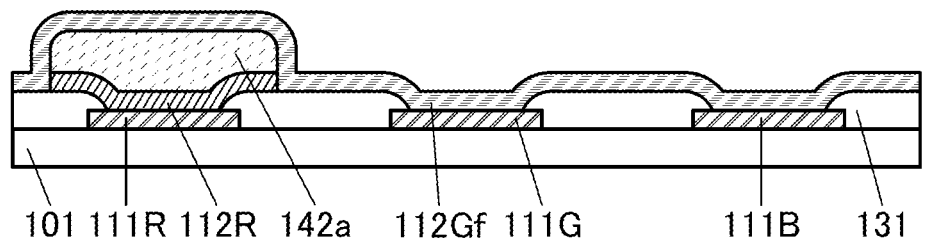
FIG. 29A to FIG. 29D are cross-sectional views showing an example of a method for manufacturing a display device.

Subsequently, the EL film 112Gf to be the EL layer 112G is deposited over the sacrificial layer 142a, the insulating layer 131, the pixel electrode 111G, and the pixel electrode 111B (FIG. 29A).

The description of the EL film 112Rf can be referred to for the formation method of the EL film 120Gf.

[Formation of Sacrificial Layer 141b]

Figure 29B:
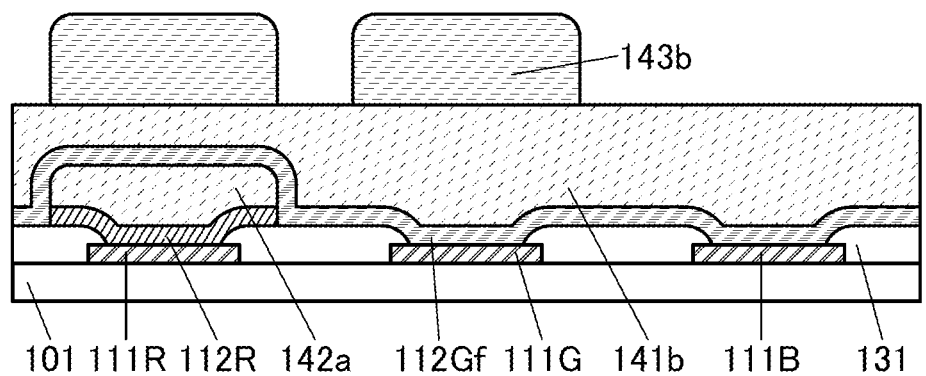

Subsequently, a sacrificial layer 141b is formed over the EL film 112Gf (FIG. 29B). The sacrificial layer 141b can be formed in a manner similar to that for the sacrificial layer 141a. In particular, the sacrificial layer 141b is preferably formed using the same material as the sacrificial layer 141a.

[Formation of Resist Mask 143b]

Next, the resist mask 143b is formed over the sacrificial layer 141b. The resist mask 143b is formed in a region overlapping with the pixel electrode 111G and a region overlapping with the pixel electrode 111R.

The description of the resist mask 143a can be referred to for the formation method of the resist mask 143b.

[Etching of Sacrificial Layer 141b, Resist Mask 143b, and EL Film 112Gf]

Figure 29C:
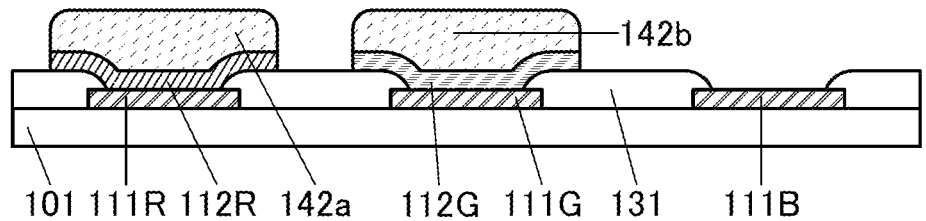

Then, the sacrificial layer 141b, the resist mask 143b, and the EL film 112Gf are etched to expose part of the top surface of the insulating layer 131 and the top surface of the pixel electrode 111B (FIG. 29C). Thus, the island-shaped or band-shaped EL layer 112G and a sacrificial layer 142b can be formed.

The etching is preferably performed under the conditions that the sacrificial layer 141b, the resist mask 143b, and the EL film 112Gf can be etched. For example, when the etching is performed by anisotropic dry etching, part of the sacrificial layer 141b over the pixel electrode 111B, which is not covered with the resist mask 143b, disappears faster than the other part covered with the resist mask 143b, so that the sacrificial layer 142b can remain.

In the case where the etching is performed by single etching treatment, the treatment is stopped when the etching of the EL film 112Gf is completed; thus, as shown in FIG. 29C, the sacrificial layer 142a over the EL layer 112R can remain without disappearing.

[Formation of EL Film 112Bf]

Figure 29D:
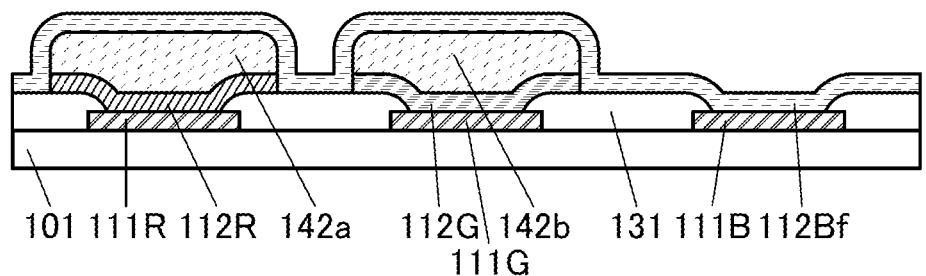

Subsequently, the EL film 112Bf to be the EL layer 112B is deposited over the sacrificial layer 142a, the sacrificial layer 142b, the pixel electrode 111B and the insulating layer 131 (FIG. 29D).

The description of the EL film 112Rf can be referred to for the formation method of the EL film 120Bf.

[Formation of Sacrificial Layer 141c]

Subsequently, a sacrificial layer 141c is formed over the EL film 112Bf. The sacrificial layer 141c can be formed in a manner similar to that for the sacrificial layer 141a. In particular, the sacrificial layer 141c is preferably formed using the same material as the sacrificial layer 141a and the sacrificial 141b.

[Formation of Resist Mask 143c]

Figure 30A:
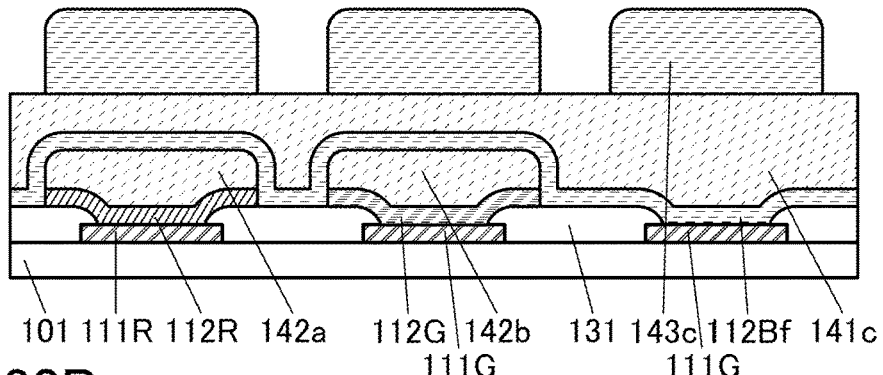
FIG. 30A to FIG. 30E are cross-sectional views showing an example of a method for manufacturing a display device.

Next, the resist mask 143c is formed over the sacrificial layer 141c (FIG. 30A). The resist mask 143b is formed in a region overlapping with the pixel electrode 111B, a region overlapping with the pixel electrode 111R, and a region overlapping with the pixel electrode 111G. The description of the resist mask 143a can be referred to for the formation method of the resist mask 143c.

[Etching of Sacrificial Layer 141c, Resist Mask 143c, and EL Film 112Bf]

Figure 30B:
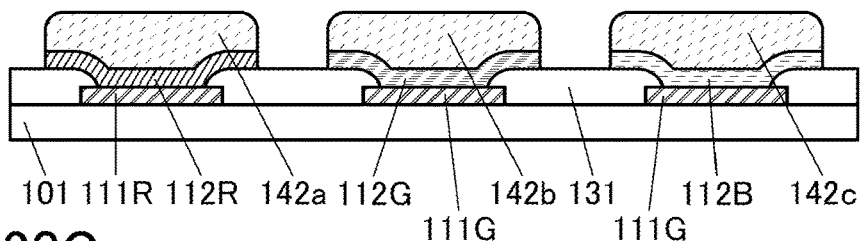

Then, the sacrificial layer 141c, the resist mask 143c, and the EL film 112Bf are etched to expose part of the top surface of the insulating layer 131 (FIG. 30B). Thus, the island-shaped or band-shaped EL layer 112B and a sacrificial layer 142c can be formed.

For the etching, the description of the etching of the sacrificial layer 141b can be referred to. The etching allows the sacrificial layer 142a over the EL layer 112R and the sacrificial layer 142b over the EL layer 112G to remain without disappearing.

[Removal of Sacrificial Layers]

Figure 30C:
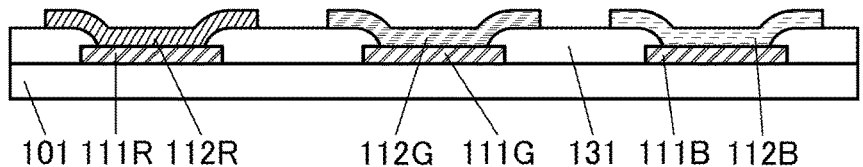

Next, the sacrificial layer 142a, the sacrificial layer 142b, and the sacrificial layer 142c are removed to expose the top surfaces of the EL layer 112R, the EL layer 112G, and the EL layer 112B (FIG. 30C).

The sacrificial layer 142a, the sacrificial layer 142b, and the sacrificial layer 142c can be removed by wet etching or dry etching. At this time, a method that causes damage to the EL layer 112R, the EL layer 112G, and the EL layer 112B as little as possible is preferably employed.

In particular, the sacrificial layer 142a, the sacrificial layer 142b, and the sacrificial layer 142c are preferably removed by being dissolved in a solvent such as water or alcohol.

As the alcohol in which the sacrificial layer 142a, the sacrificial layer 142b, and the sacrificial layer 142c can be dissolved, any of various alcohols such as ethyl alcohol, methyl alcohol, isopropyl alcohol (IPA), and glycerin can be used.

After the sacrificial layer 142a, the sacrificial layer 142b, and the sacrificial layer 142c are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Through the above steps, the three kinds of EL layers can be separately formed.

[Formation of Common Electrode 113]

Figure 30D:
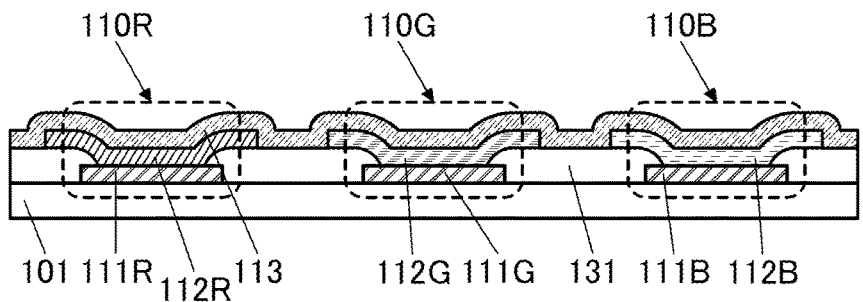

Next, the common electrode 113 is formed to cover the EL layer 112R, the EL layer 112G, and the EL layer 112B (FIG. 30D). The common electrode 113 can be formed by a sputtering method or an evaporation method, for example. For the common electrode 113, a conductive film transmitting visible light is used. For example, a conductive oxide such as indium oxide, indium tin oxide, indium zinc oxide, zinc oxide, zinc oxide containing gallium, indium-tin oxide containing silicon, or an indium zinc oxide containing silicon can be used.

Through the above steps, the light-emitting element 110R, the light-emitting element 110G, and the light-emitting element 110B can be manufactured.

[Formation of Protective Layer 121]

Figure 30E:
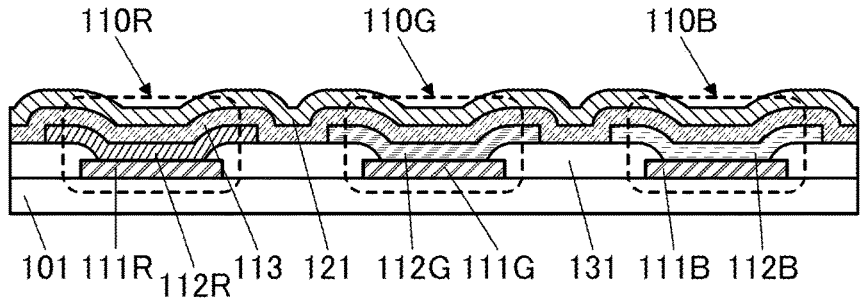

Next, the protective layer 121 is formed over the common electrode 113 (FIG. 30E). An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably formed by an inkjet method because a uniform film can be formed in a desired area.

The above is the description of the example of the method for manufacturing a display device.

Structure Example 2

A structure example of a display device different from the above-described structure example 1 will be described below. Note that portions similar to those described above are not described below in some cases.

Structure Example 2

Figure 31:
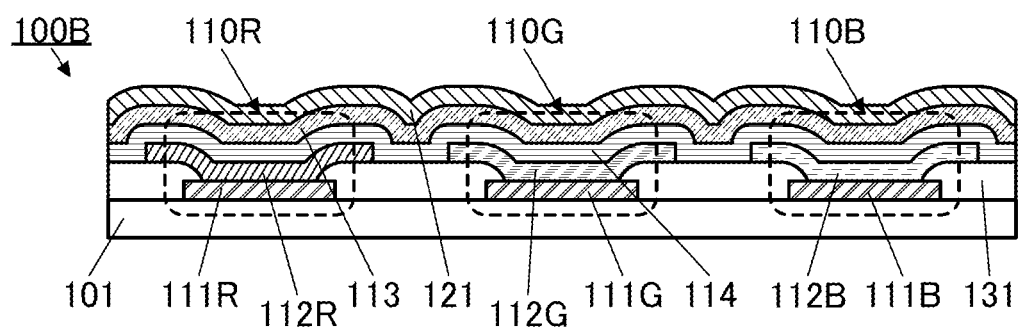
FIG. 31 is a cross-sectional view showing a structure example of a display device.

A display device 100B shown in FIG. 31 is different from the display device 100 mainly in including the common layer 114.

Like the common electrode 113, the common layer 114 is provided across a plurality of light-emitting elements. The common layer 114 is provided to cover the EL layer 112R, the EL layer 112G, and the EL layer 112B. The manufacturing process can be simplified by including the common layer 114, reducing the manufacturing cost.

Each of the EL layer 112R, the EL layer 112G, and the EL layer 112B preferably includes at least a light-emitting layer containing a light-emitting material emitting one color. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

Manufacturing Method Example 4

An example of a method for manufacturing a display device, which is different from the above-described manufacturing method example 1 of will be described below. Note that the above description can be referred to for portions similar to those described above, and the repeated description is skipped in some cases.

As in the above-described manufacturing method example 1, the pixel electrode 111R, the pixel electrode 111G, the pixel electrode 111B, and the insulating layer 131 are formed over the substrate 101 having a light-transmitting property. Furthermore, the EL film 112Rf is formed to cover them.

[Formation of Sacrificial Film 144a]

Next, a sacrificial film 144a is formed to cover the EL film 112Rf.

As the sacrificial film 144a, it is possible to use a film highly resistant to etching treatment performed on various EL films typified by the EL film 112Rf, i.e., a film having high etching selectivity. Furthermore, as the sacrificial film 144a, it is possible to use a film having high etching selectivity with respect to a protective film 146a described later. Moreover, as the sacrificial film 144a, it is possible to use a film that can be removed by a wet etching method less likely to cause damage to the EL film.

The sacrificial film 144a can be formed using an inorganic film such as a metal film, an alloy film, a metal oxide film, a semiconductor film, or an inorganic insulating film, for example. Alternatively, an organic film that is described as an example in the manufacturing method example 1 and can be used for the sacrificial layer 141a, e.g., polyvinyl alcohol, can also be used.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, for the sacrificial film 144a, a metal oxide such as an indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), or indium gallium tin zinc oxide (In—Ga—Sn—Zn oxide). Alternatively, indium tin oxide containing silicon can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of aluminum and yttrium Furthermore, an inorganic insulating material such as aluminum oxide, hafnium oxide, or silicon oxide can be used for the sacrificial film 144a.

[Formation of Protective Film 146a]

Next, the protective film 146a is formed over the sacrificial film 144a.

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, silicon, silicon nitride, silicon oxide, tungsten, titanium, molybdenum, tantalum, tantalum nitride, an alloy containing molybdenum and niobium, or an alloy containing molybdenum and tungsten can be used for the protective film 146a. Here, a metal oxide film such as IGZO or ITO is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on etching conditions of the sacrificial film 144a and the protective film 146a. For example, any of the films that can be used for the sacrificial film 144a can be used.

As the protective film 146a, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, as the protective film 146a, an organic film that can be used for the EL film 112Rf or the like can be used. For example, the organic film that is used as the EL film 112Rf, the EL film 112Gf, or the EL film 112Bf can be used for the protective film 146a. The use of such an organic film is preferable, in which case the deposition apparatus for the EL film 112Rf can be used in common.

[Formation of Resist Mask 143a]

Figure 32A:
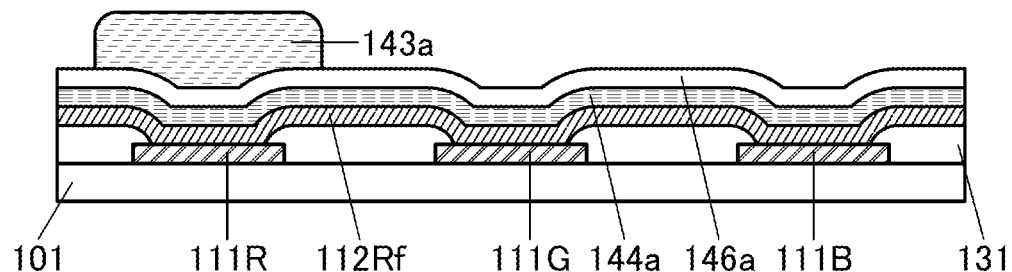
FIG. 32A to FIG. 32D are cross-sectional views showing an example of a method for manufacturing a display device.

Then, the resist mask 143a is formed a position that is over the protective film 146a and overlaps with the electrode 111R (FIG. 32A).

Here, in the case where the protective film 146a is not provided and the resist mask 143a is formed over the sacrificial film 144a, if a defect such as a pinhole exists in the sacrificial film 144a, there is a risk of dissolving the EL film 112Rf due to a solvent of the resist material. Such a defect can be prevented by using the protective film 146a.

[Etching of Protective Film 146a]

Next, part of the protective film 146a that is not covered with the resist mask 143a is removed by etching, so that an island-shaped or band-shaped protective layer 147a is formed.

In the etching of the protective film 146a, an etching condition with high selectively is preferably employed so that the sacrificial film 144a is not removed by the etching. Either wet etching or dry etching can be performed for the etching of the protective film 146a; with use of dry etching, a reduction in a processing pattern of the protective film 146a can be inhibited.

[Removal of the Resist Mask 143a]

Figure 32B:
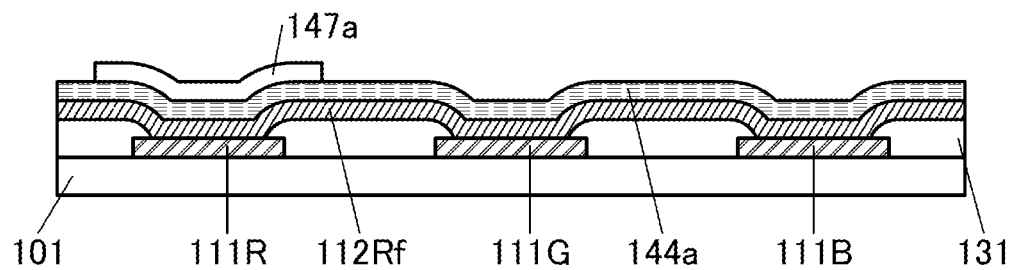

Next, the resist mask 143a is removed (FIG. 32B).

The removal of the resist masks 143a can be performed by wet etching or dry etching. It is particularly preferable to perform dry etching (also referred to as plasma ashing) using an oxygen gas as an etching gas to remove the resist masks 143a.

At this time, the removal of the resist mask 143a is performed in a state where the EL film 112Rf is covered with the sacrificial film 144a; thus, the EL film 120Rb is less likely to be affected by the removal. In particular, when the EL film 112Rf is exposed to oxygen, the electrical characteristics are adversely affected in some cases; therefore, it is preferable that the EL film 112Rf be covered by the sacrificial film 144a when etching using an oxygen gas, such as plasma ashing, is performed.

[Etching of Sacrificial Film 144a]

Figure 32C:
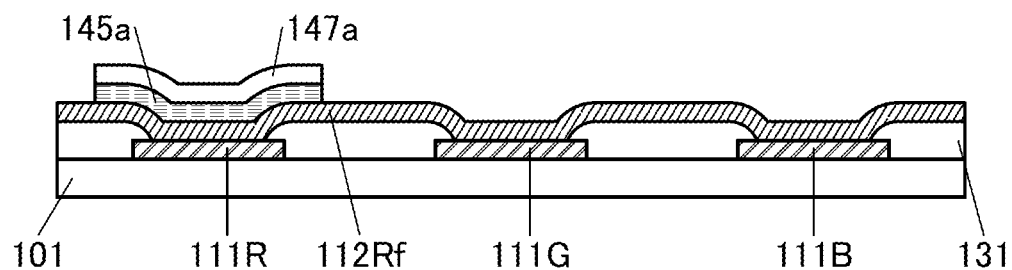

Next, part of the sacrificial film 144a that is not covered with the protective layer 147a is removed by etching with use of the protective layer 147a as a mask, so that an islands-shaped or band-shaped sacrificial layer 145a is formed (FIG. 32C).

Either wet etching or dry etching can be performed for the etching of the mask film 144a; the use of dry etching is preferable, in which case a shrinkage of the pattern can be inhibited.

[Etching of EL Film 112Rf and Protective Layer 147a]

Figure 32D:
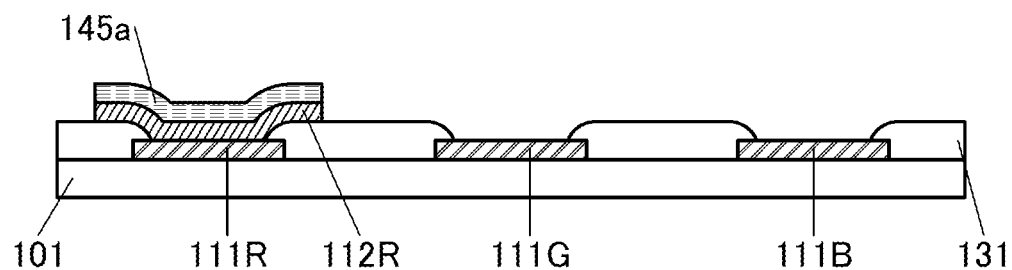

Next, part of the EL film 112Rf that is not covered with the sacrificial layer 145a is removed by etching at the same time as etching of the protective layer 147a, whereby the EL layer 112R having an island-like shape or band-like shape is formed (FIG. 32D).

When the EL film 112Rf and the protective layer 147a are etched by the same treatment, the process can be simplified to reduce the manufacturing cost of the display device.

In particular, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, and a rare gas such as He. Alternatively, a mixed gas of the above gas and a dilute gas that does not contain oxygen can be used as the etching gas.

Note that the etching of the EL film 112Rf and the etching of the protective layer 147a may be performed separately. In that case, either the etching of the EL film 112Rf or the etching of the protective layer 147a may be performed first.

[Formation of EL Layer 112G and EL Layer 112B]

The EL film 112Gf is subjected to the above steps, whereby the EL layer 112G having an island-like shape and the sacrificial layer 145b can be formed.

Figure 33A:
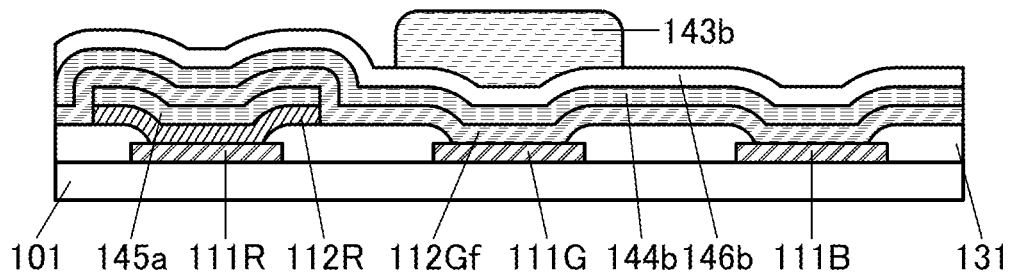
FIG. 33A to FIG. 33E are cross-sectional views showing an example of a method for manufacturing a display device.
Figure 33B:
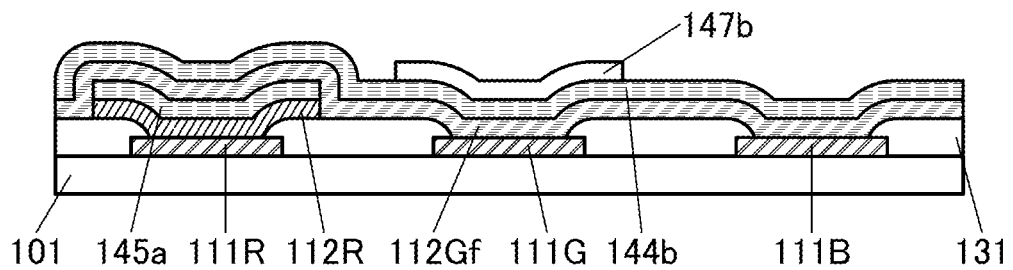
Figure 33C:
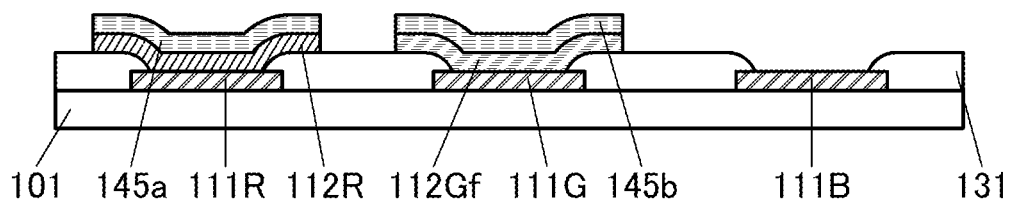

That is, after formation of the EL layer 112R, as shown in FIG. 33A, the EL film 112Gf, the sacrificial film 144b, the protective film 146b, and the resist mask 143b are formed in this order. After that, the protective film 146b is etched to form the protective layer 147b; then, the resist mask 143b is removed (FIG. 33B). Subsequently, the sacrificial film 144b is etched to form the sacrificial layer 145b. After that, the protective layer 147b and the EL film 112Gf are etched to form the EL layer 112G having an island-like shape or band-like shape (FIG. 33C).

Figure 33D:
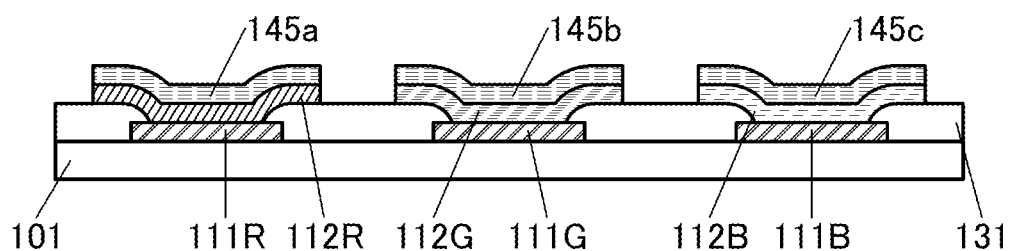

Then, the EL film 112Bf is subjected to steps similar to those described above, whereby the EL layer 112B having an island-like shape and the sacrificial layer 145c are formed (FIG. 33D).

[Removal of Sacrificial Layers]

Figure 33E:
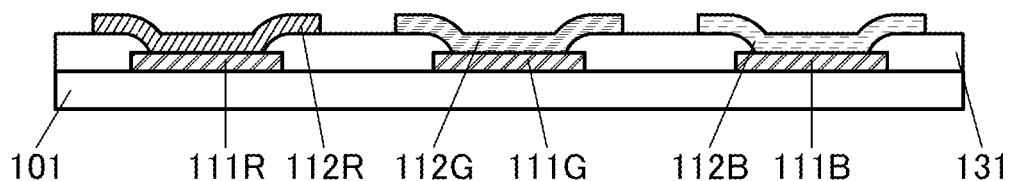

Next, the sacrificial layer 145a, the sacrificial layer 145b, and the sacrificial layer 145c are removed to expose the top surfaces of the EL layer 112R, the EL layer 112G, and the EL layer 112B (FIG. 33E).

The sacrificial layer 145a, the sacrificial layer 145b, and the sacrificial layer 145c can be removed by wet etching or dry etching. At this time, a method that causes damage to the EL layers 112R, 112G, and 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

In this manner, the EL layer 112R, the EL layer 112G, and the EL layer 112B can be formed separately. Note that the manufacturing method example 1 can be referred to for the following process.

The above is the description of the manufacturing method example 2.

Since process damage to the EL layer 112R, the EL layer 112G, and the EL layer 112B can be reduced with the use of the above manufacturing method, an extremely highly reliable display device can be achieved.

Structure Example 3

An example of using a light-emitting element exhibiting white light emission will be described below.

Figure 34A:
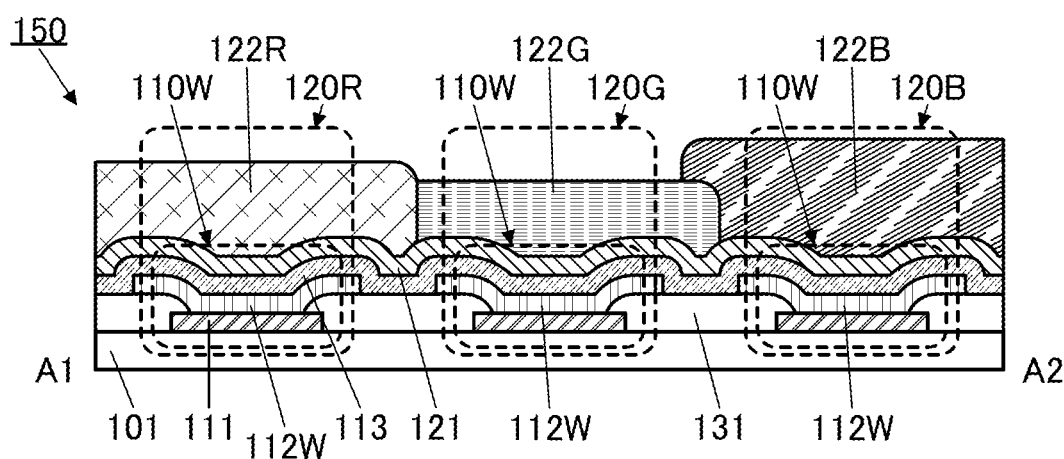
FIG. 34A to FIG. 34B are cross-sectional views showing structure examples of a display device.
Figure 34B:
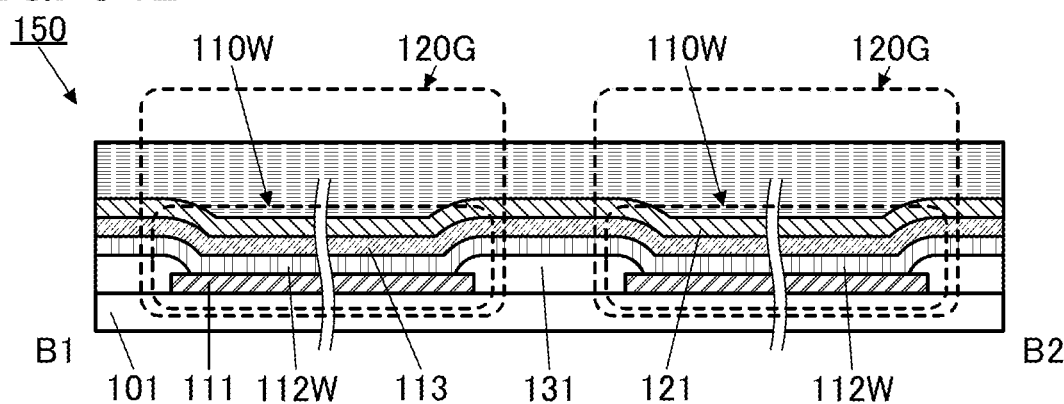

FIG. 34A and FIG. 34B shows a schematic cross-sectional view of a display device 150. FIG. 27A can be referred to for the top view.

The display device 150 includes the light-emitting unit 120R, the light-emitting unit 120G, and the light-emitting unit 120B. The light-emitting unit 120R, the light-emitting unit 120G, and the light-emitting unit 120B each include a light-emitting element 110W. The light-emitting element 110W includes the pixel electrode 111, an EL layer 112W, and the common electrode 113. The EL layer 112W and the common electrode 113 are provided across a plurality of pixels to be shared by the plurality of pixels. The EL layer 112W includes a light-emitting layer that exhibits white light emission. The light-emitting element 110W is a light-emitting element that exhibits white light emission.

The light-emitting unit 120R, the light-emitting unit 120G, and the light-emitting unit 120B include a coloring layer 122R, a coloring layer 122G, and a coloring layer 122B, respectively, over the protective layer 121. For example, the coloring layer 122R transmits red light, the coloring layer 122G transmits green light, and the coloring layer 122B transmits blue light. This can achieve a full-color display device. Since each coloring layer is formed over the protective layer 121, the positional alignment of the light-emitting elements and the coloring layers is easy compared with the case where the coloring layers are formed over a substrate different from the substrate 101 and then the two substrates are bonded to each other; thus, a display device with extremely high resolution can be achieved.

Here, the EL layer 112W is partitioned between different light-emitting units. This suitably prevents unintentional light emission (also referred to as crosstalk) due to a current flow through the EL layer 112W between adjacent light-emitting units. As a result, the contrast can be increased to achieve a display device with high display quality.

Note that as shown in FIG. 34B, a structure where the EL layer 112W is not divided between the light-emitting units of the same color may be employed.

Manufacturing Method Example 5

An example of a method for manufacturing the display device 150 shown as Structure example 3 mentioned above will be described below. Note that for the portions similar to those in Manufacturing method examples 1 and 2, the above description is referred to and the repeated description is skipped in some cases.

Figure 35A:
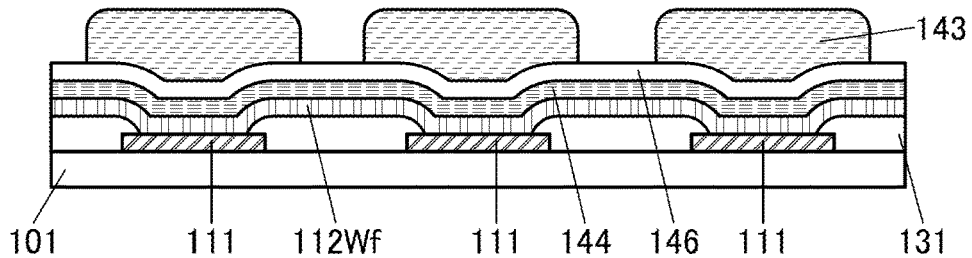
FIG. 35A to FIG. 35F are cross-sectional views showing an example of a method for manufacturing a display device.

First, as shown in FIG. 35A, a plurality of pixel electrodes 111 and the insulating layer 131 are formed over the substrate 101 having a light-transmitting property. Furthermore, an EL film 112Wf, a sacrificial layer 144, and a protective film 146 are formed to cover them. In addition, a resist mask 143 is formed in a position that is over the protective film 146 and overlaps with the pixel electrodes 111.

Figure 35B:
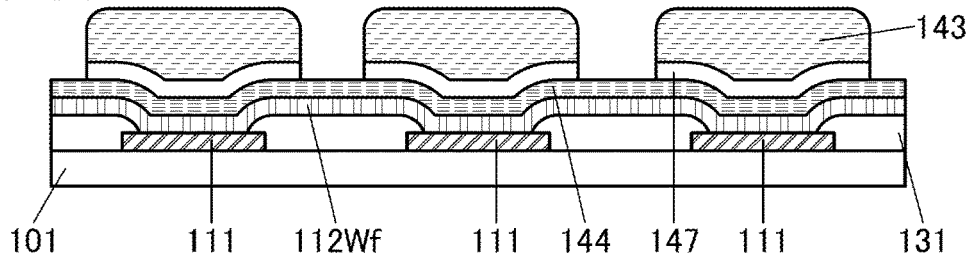

Then, the protective film 146 is etched to form a protective layer 147 having a band-like shape (FIG. 35B).

Figure 35C:
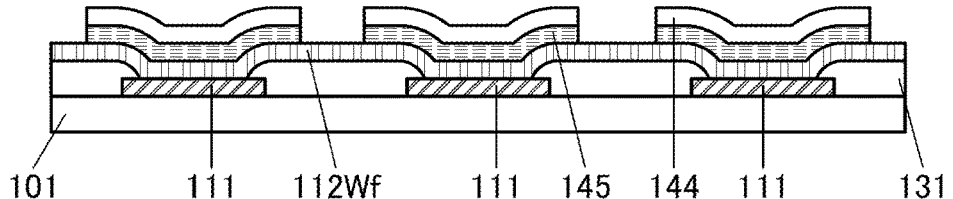

Next, the resist mask 143 is removed, and then the sacrificial layer 144 is etched using the protective layer 147 as a mask to form a sacrificial layer 145 (FIG. 35C).

Figure 35D:
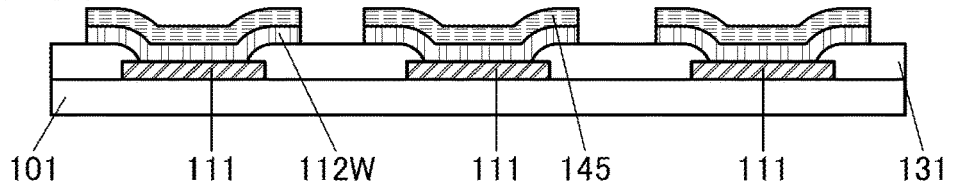
Figure 35E:
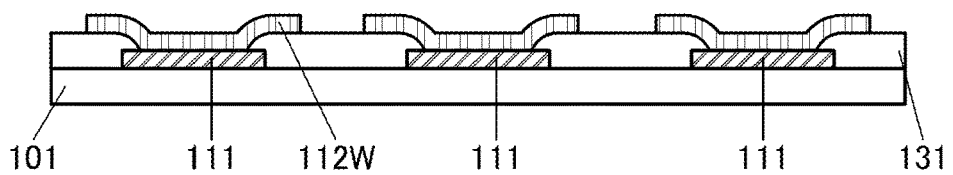

Subsequently, the protective layer 147 and the EL film 112Wf are etched to divide the EL film 112Wf. Accordingly, a plurality of EL layers 112W each having a band-like shape are formed (FIG. 35D). After that, the sacrificial layer 145 over the EL layer 112W is removed to expose the EL layers 112W (FIG. 35E).

Figure 35F:
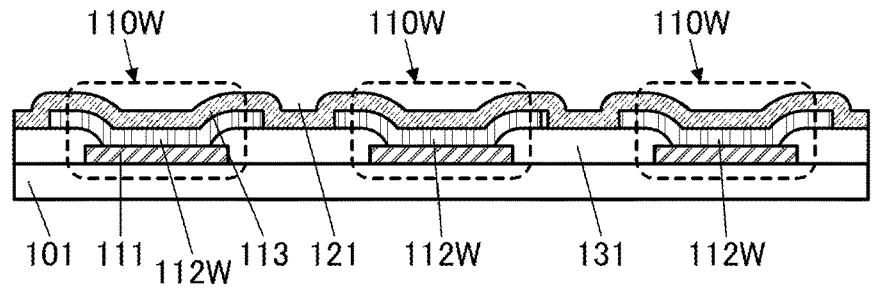

Next, the common electrode 113 is formed to cover the EL layers 112W and the insulating layer 131, whereby a plurality of light-emitting elements 110W can be manufactured (FIG. 35F).

Subsequently, the protective layer 121 is formed to cover the common electrode 113, and the coloring layer 122R, the coloring layer 122G, and the coloring layer 122B are each formed over the protective layer 121. Each of the coloring layer 122R, the coloring layer 122G, and the coloring layer 122B can be formed by a photolithography method using a photosensitive resin.

Through the above steps, the display device 150 described as an example in Structure example 3 can be manufactured.

At least part of this embodiment can be implemented in combination with the other embodiments described in this specification as appropriate.

Embodiment 8

In this embodiment, structure examples of a display device of one embodiment of the present invention are described.

[Display Device 400A]

FIG. 38 shows a perspective view of the display device 400A, and FIG. 36A shows a cross-sectional view of the display device 400A. Note that it is a partially modified example of Embodiment 6; thus, portions different from those in Embodiment 6 are described below.

The display device 400A includes the display portion 462, the circuit 464, and the wiring 465. FIG. 36 shows an example in which the IC 473 and the FPC 472 are integrated on the display device 400A. Thus, the structure shown in FIG. 36A can also be referred to as a display panel including the display device 400A, the IC (integrated circuit), and the FPC.

FIG. 38 shows an example where the IC 473 is provided over the substrate 454 by a COG method or a COF method. An IC including a scan line driver circuit or a signal line driver circuit can be used as the IC 473, for example.

FIG. 36A shows an example of cross sections of part of a region including the FPC 472, part of the circuit 464, part of the display portion 462, and part of a region including an end portion in the display device 400A.

The display device 400A shown in FIG. 36A includes the transistor 201, the transistor 205, the light-emitting element 430a that emits red light, the light-emitting element 430b that emits green light, and the light-emitting element 430c that emits blue light between the substrate 454 and the substrate 452.

In FIG. 36A, a hollow sealing structure is employed in which the space 443 surrounded by the substrate 452, the adhesive layer 442, and the substrate 454 is filled with an inert gas (nitrogen or argon).

The light-emitting elements 430a, 430b, and 430c each have an optical adjustment layer between the pixel electrode and the EL layer. The light-emitting element 430a includes an optical adjustment layer 426a, the light-emitting element 430b includes an optical adjustment layer 426b, and the light-emitting element 430c includes an optical adjustment layer 426c. Embodiment 3 can be referred to for the details of the light-emitting elements.

The end portions of the pixel electrode and the optical adjustment layer are covered with the insulating layer 421. The pixel electrode contains a material that transmits visible light, and the counter electrode contains a material that transmits visible light. The insulating layer 421 is also referred to as a partition.

Light emitted by the light-emitting elements is emitted toward the substrate 452 side or the substrate 454 side. For the substrate 454 and the substrate 452, a material having a high visible-light-transmitting property is preferably used.

In the region 228 shown in FIG. 36A, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

FIG. 36B shows an example where the protective layer 416 has a three-layer structure. In FIG. 36B, the protective layer 416 includes an inorganic insulating layer 416a over the light-emitting element 430c, an organic insulating layer 416b over the inorganic insulating layer 416a, and an inorganic insulating layer 416c over the organic insulating layer 416b.

An end portion of the inorganic insulating layer 416a and an end portion of the inorganic insulating layer 416c extend beyond an end portion of the organic insulating layer 416b and are in contact with each other. The inorganic insulating layer 416a is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, an end portion of the inorganic insulating film preferably extends beyond an end portion of the organic insulating film.

For each of the substrate 454 and the substrate 452, glass, quartz, ceramic, sapphire, or resin can be used. The substrate on the side where light from the light-emitting element is extracted is formed using a material that transmits the light. When a flexible material is used for the substrate 454 and the substrate 452, the flexibility of the display device can be increased. Furthermore, a polarizing plate may be used as the substrate 454 or the substrate 452.

[Display Device 400B]

FIG. 37A shows a cross-sectional view of the display device 400B. A perspective view of the display device 400B is similar to that of the display device 400A (FIG. 38). FIG. 37A shows an example of cross sections of part of a region including the FPC 472, part of the circuit 464, and part of the display portion 462 in the display device 400B. FIG. 37A specifically shows an example of a cross section of a region including the light-emitting element 430b that emits green light and the light-emitting element 430c that emits blue light in the display portion 462. Note that portions similar to those of the display device 400A are not described in some cases.

The display device 400B shown in FIG. 37A includes the transistor 202, the transistor 217, the light-emitting element 430b, and the light-emitting element 430c between the substrate 453 and the substrate 454.

The substrate 454 and the protective layer 416 are bonded to each other with the adhesive layer 442. The adhesive layer 442 is provided to overlap with each of the light-emitting element 430b and the light-emitting element 430c; that is, the display device 400B employs a solid sealing structure.

The substrate 453 and the insulating layer 212 are bonded to each other with the adhesive layer 455.

In a method for manufacturing the display device 400B, first, a formation substrate provided with the insulating layer 212, the transistors, and the light-emitting elements is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used as the insulating layer 211, the insulating layer 213, and the insulating layer 215 can be used as the insulating layer 212.

The pixel electrode is connected to the conductive layer 222b included in the transistor 217 through an opening provided in the insulating layer 214. The conductive layer 222b is connected to the low-resistance region 230n through an opening provided in the insulating layer 215 and the insulating layer 225. The transistor 217 has a function of controlling the driving of the light-emitting element.

An end portion of the pixel electrode is covered with the insulating layer 421.

Light emitted by the light-emitting elements 430b and 430c is emitted toward the substrate 454 side or the substrate 453 side. For the substrate 453 and the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the anisotropic conductive connection layer 123. The conductive layer 466 can be obtained by processing the same conductive film as the pixel electrode. Thus, the connection portion 204 and the FPC 472 can be electrically connected to each other through the anisotropic conductive connection layer 123.

Each of the transistor 202 and the transistor 217 includes the conductive layer 221 functioning as a gate, the insulating layer 211 functioning as a gate insulating layer, a semiconductor layer including the channel formation region 230i and the pair of low-resistance regions 230n, the conductive layer 222a connected to one of the pair of low-resistance regions 230n, the conductive layer 222b connected to the other of the pair of low-resistance regions 230n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 230i. The insulating layer 225 is positioned between the conductive layer 223 and the channel formation region 230i.

The conductive layer 222a and the conductive layer 222b are connected to the corresponding low-resistance regions 230n through openings provided in the insulating layer 215. One of the conductive layer 222a and the conductive layer 222b functions as a source, and the other functions as a drain.

FIG. 37A shows an example where the insulating layer 225 covers the top surface and the side surface of the semiconductor layer. The conductive layer 222a and the conductive layer 222b are connected to the corresponding low-resistance regions 230n through openings provided in the insulating layer 225 and the insulating layer 215.

Meanwhile, in the transistor 209 shown in FIG. 37B, the insulating layer 225 overlaps with the channel formation region 230i of the semiconductor layer 230 and does not overlap with the low-resistance regions 230n. The structure shown in FIG. 37B can be manufactured by processing the insulating layer 225 using the conductive layer 223 as a mask, for example. In FIG. 37B, the insulating layer 215 is provided to cover the insulating layer 225 and the conductive layer 223, and the conductive layer 222a and the conductive layer 222b are connected to the low-resistance regions 230n through the openings in the insulating layer 215. Furthermore, the insulating layer 218 covering the transistor may be provided.

At least part of the structure examples and the drawings corresponding thereto described in this embodiment as an example can be combined with the other structure examples and the other drawings as appropriate.

Embodiment 9

In this embodiment, a structure example of a display device different from those described above will be described.

The display device in this embodiment can be a high-resolution display device.

[Display Panel]

Figure 39A:
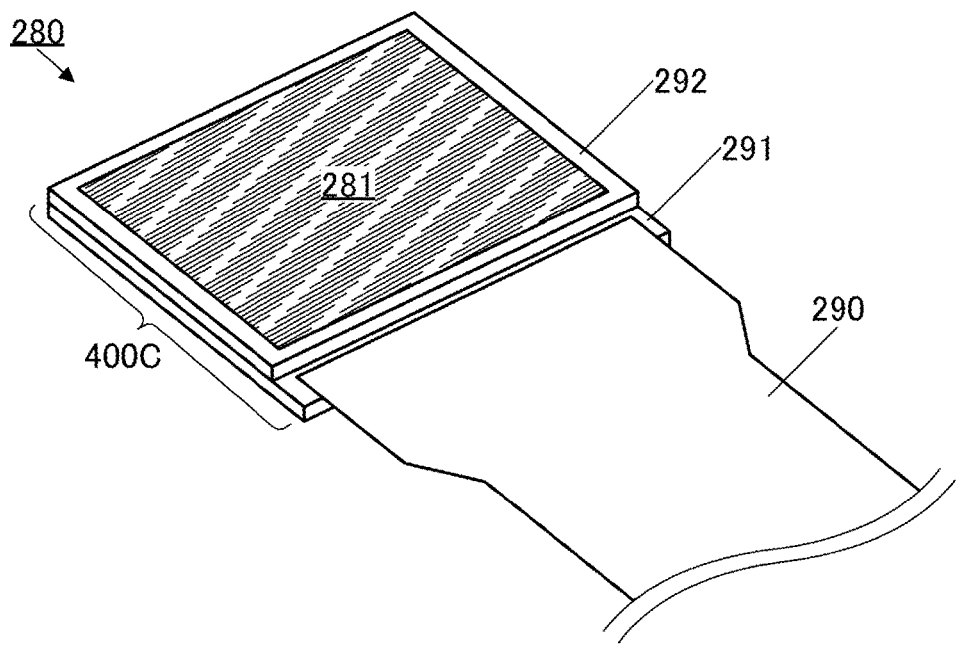
FIG. 39A and FIG. 39B are perspective views showing an example of a display panel.

FIG. 39A shows a perspective view of a display panel 280. The display panel 280 includes a display device 400C and an FPC 290.

The display panel 280 includes a substrate 291 and a substrate 292. The display panel 280 includes a display portion 281. The display portion 281 is a region of the display panel 280 where an image is displayed and is a region where light emitted from pixels provided in a pixel portion 284 described later can be seen.

Figure 39B:
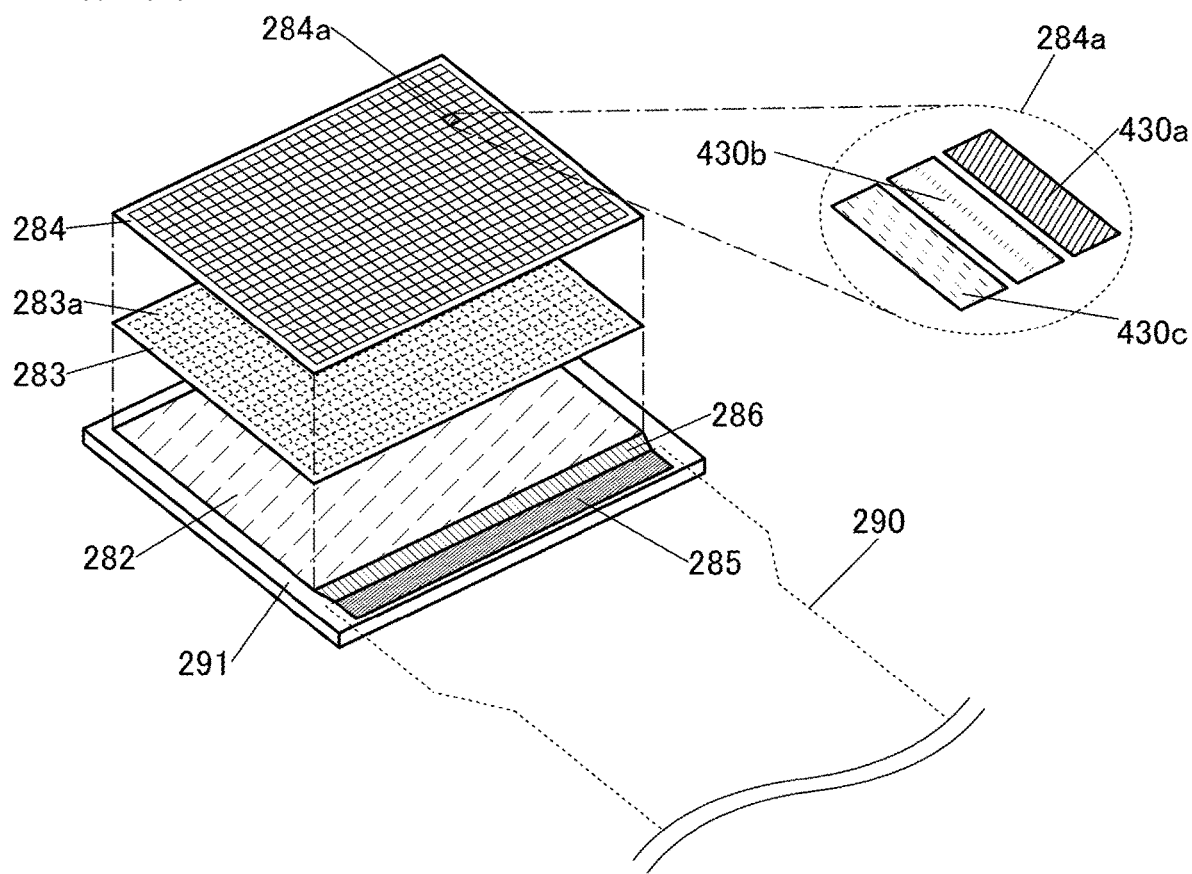

FIG. 39B shows a perspective view schematically illustrating a structure on the substrate 291 side. A circuit portion 282, a pixel circuit portion 283 over the circuit portion 282, and the pixel portion 284 over the pixel circuit portion 283 are stacked over the substrate 291. In addition, a terminal portion 285 for connection to the FPC 290 is provided in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is shown on the right side of FIG. 39B. The pixel 284a includes the light-emitting elements 430a, 430b, and 430c whose emission colors are different one another. The plurality of light-emitting elements may be arranged in a stripe pattern as shown in FIG. 39B.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits for controlling light emission of respective light-emitting elements. For example, the pixel circuit 283a for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, and a power supply circuit may be included.

The FPC 290 functions as a wiring for supplying a video signal or a power supply potential to the circuit portion 282 from the outside. In addition, an IC may be mounted on the FPC 290.

The display panel 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Embodiment 10

In this embodiment, light-emitting elements (also referred to as light-emitting devices) that can be used in a display device that is one embodiment of the present invention will be described.

<Structure Example of Light-Emitting Element>

Figure 40A:
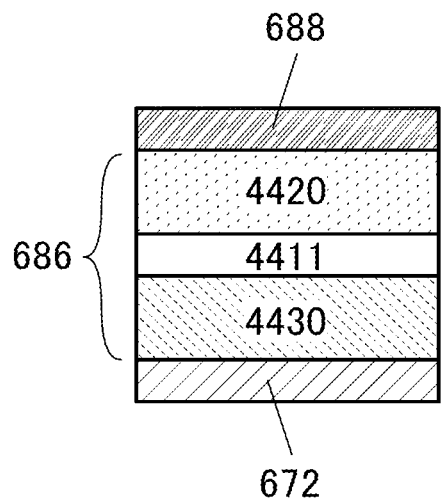
FIG. 40A to FIG. 40D are cross-sectional views showing structure examples of a light-emitting element.

As shown in FIG. 40A, the light-emitting element includes an EL layer 686 between a pair of electrodes (a lower electrode 672 and an upper electrode 688). The EL layer 686 can be formed of a plurality of layers, i.e., a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 40A is referred to as a single structure in this specification.

Figure 40B:
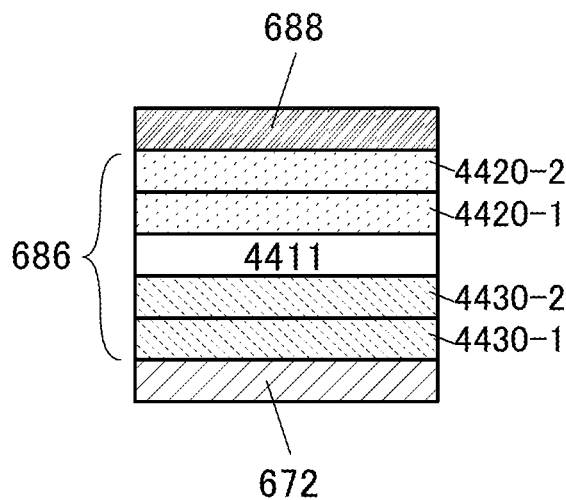

FIG. 40B shows a modification example of the EL layer 686 included in the light-emitting element shown in FIG. 40A. Specifically, the light-emitting element shown in FIG. 40B includes a layer 4430-1 over the lower electrode 672, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 688 over the layer 4420-2. For example, when the lower electrode 672 functions as an anode and the upper electrode 688 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 672 functions as a cathode and the upper electrode 688 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Figure 40C:
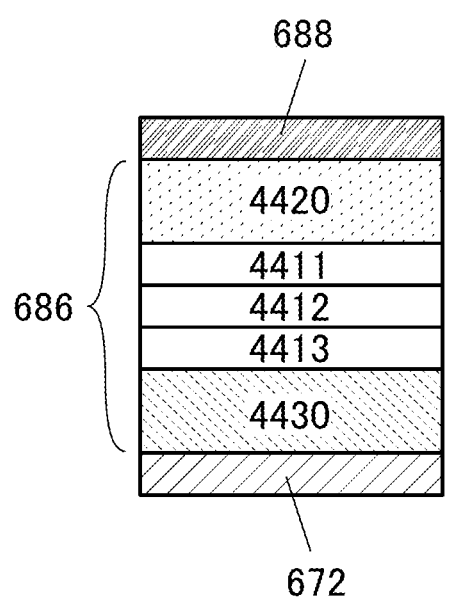

Note that the structure in which a plurality of light-emitting layers (light-emitting layers 4411, 4412, and 4413) is provided between the layer 4420 and the layer 4430 as shown in FIG. 40C is another variation of the single structure.

Figure 40D:
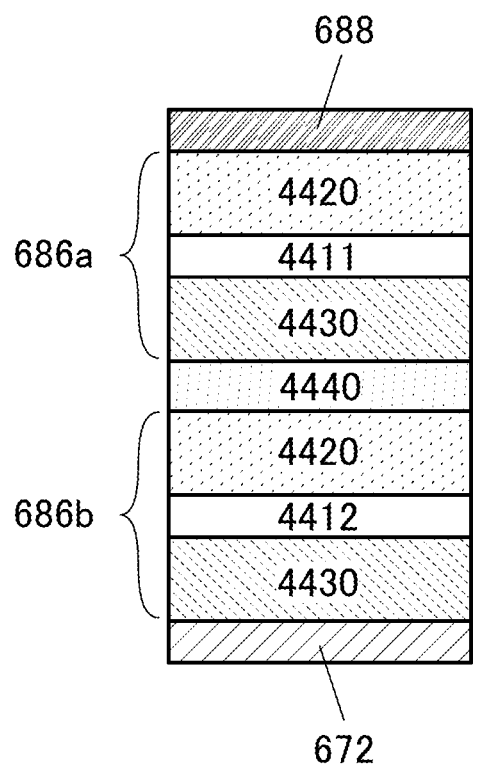

The structure in which a plurality of light-emitting units (EL layers 686a and 686b) is connected in series with an intermediate layer (charge-generation layer) 4440 therebetween as shown in FIG. 40D is referred to as a tandem structure in this specification. In this specification, the structure shown in FIG. 40D is referred to as a tandem structure; however, without being limited to this, a tandem structure may be referred to as a stack structure, for example. The tandem structure enables a light-emitting element capable of high luminance light emission.

In FIG. 40C and FIG. 40D, the layer 4420 and the layer 4430 may each have a stacked-layer structure of two or more layers as in FIG. 40B.

In the case where the single structure and the tandem structure described above and an SBS structure describe later are compared with each other, the SBS structure, the tandem structure, and the single structure have lower consumption in this order. To reduce power consumption, the SBS structure is preferably employed. Meanwhile, the single structure and the tandem structure are preferable in terms of lower manufacturing cost or higher manufacturing yield because the manufacturing processes of the single structure and the tandem structure are simpler than that of the SBS structure.

The emission color of the light-emitting element can be red, green, blue, cyan, magenta, yellow, white, or the like depending on the material that constitutes the EL layer 686. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. This can be applied to a light-emitting element including three or more light-emitting layers.

The light-emitting layer preferably contains two or more selected from light-emitting substances that emit light of red (R), green (G), blue (B), yellow (Y), and orange (O). A light-emitting substance that emits light of violet, bluish violet, yellowisblue, and near infrared may be included. Alternatively, the light-emitting layer preferably contains two or more light-emitting substances that emit light containing two or more of spectral components of R, G, and B.

At least part of the structure examples and the drawings corresponding thereto described in this embodiment as an example can be combined with the other structure examples and the other drawings as appropriate.

Embodiment 11

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition to them, aluminum, gallium, yttrium, or tin is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and cobalt may be contained.

The metal oxide can be formed by a sputtering method, a chemical vapor deposition (CVD) method such as a metal organic chemical vapor deposition (MOCVD) method, or an atomic layer deposition (ALD) method.

<Classification of Crystal Structures>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, and titanium), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at or around $2\theta$ of 31°. Note that the position of the peak indicating c-axis alignment (the value of $2\theta$) may change depending on the kind or composition of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement or a heptagonal lattice arrangement is included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, or an interatomic bond distance changed by substitution of a metal atom.

A crystal structure in which a clear grain boundary is observed is what is called polycrystal. It is highly probable that the grain boundary becomes a recombination center and traps carriers and thus decreases the on-state current and field-effect mobility of a transistor. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. In addition, entry of impurities or formation of defects might decrease the crystallinity of an oxide semiconductor. This means that the CAAC-OS can also be referred to as an oxide semiconductor having small amounts of impurities and defects (oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has [In] higher than [In] in the second region and [Ga] lower than [Ga] in the second region. Moreover, the second region has higher [Ga] and lower [In] than the first region.

Specifically, the first region includes indium oxide or indium zinc oxide as its main component. The second region includes gallium oxide or gallium zinc oxide as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases. Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 12

In this embodiment, application examples of the display device of one embodiment of the present invention will be described with reference to FIG. 41.

[Vehicle]

An example where the display device of one embodiment of the present invention is mounted on a mobile body, typically, a vehicle, is described.

The display device of one embodiment of the present invention can be mounted on next-generation clean energy vehicles such as hybrid vehicles (HVs), electric vehicles (EVs), and plug-in hybrid vehicles (PHVs). The display device of one embodiment of the present invention can also be mounted on transport vehicles such as agricultural machines such as electric tractors, motorized bicycles including motor-assisted bicycles, motorcycles, electric wheelchairs, electric carts, boats or ships, submarines, aircraft such as fixed-wing aircraft and rotary-wing aircraft, rockets, artificial satellites, space probes, planetary probes, and spacecraft.

Figure 41A:
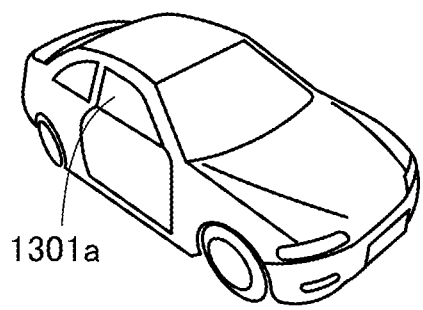
FIG. 41A to FIG. 41D are perspective views showing examples of transport vehicles.

FIG. 41A to FIG. 41D show vehicles each including the display device of one embodiment of the present invention. A motor vehicle 2001 shown in FIG. 41A is an electric vehicle that runs using an electric motor as a driving power source. Alternatively, the motor vehicle 2001 is a hybrid vehicle that can appropriately select an electric motor or an engine as a driving power source. In the case where a display device 1301a is mounted on the vehicle, the display device 1301a is set in a position in contact with window glass or in the vicinity thereof and is placed on one or more portions of a plurality of pieces of window glass. The display device 1301a can be applied not only to the electric vehicle but also to a motor vehicle with a combustion engine.

The motor vehicle 2001 can be charged when a secondary battery included in the motor vehicle 2001 is supplied with electric power through external charging equipment by a plug-in system or a contactless power feeding system. In charging, a given method such as CHAdeMO (registered trademark) or Combined Charging System can be employed as a charging method or the standard of a connector as appropriate. A charging device may be a charging station provided in a commerce facility or a power source in a house. For example, with the use of the plug-in technique, a secondary battery mounted on the motor vehicle 2001 can be charged by being supplied with electric power from the outside. The charging can be performed by converting AC electric power into DC electric power through a converter such as an ACDC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven. In addition, the contactless power feeding system may be utilized to perform transmission and reception of electric power between two vehicles. Furthermore, a solar cell may be provided in the exterior of the vehicle to charge the secondary battery when the vehicle stops or moves. To supply electric power in such a contactless manner, an electromagnetic induction method or a magnetic resonance method can be used.

In the case where a dual-emission display device is used as the display device 1301a, the state of charge, e.g., the remaining time to full charge, is displayed when the motor vehicle 2001 is stopped during charging, so that the state of charge can be checked also from the outside of the vehicle. It is possible to perform display toward the inside of the vehicle and display toward the outside of the vehicle alternately. Not only the owner of the motor vehicle 2001 but also a driver that intends to perform charge next can see the display, which enables him/her to determine whether to wait for the next turn or move to another location for charge. In the case of such display of the state of charge during the stop of the vehicle, the display device 1301a is also provided on the windshield, whereby the display of the dual-emission display device can be seen from a third party outside the vehicle through the windshield. In a cold district, heat is generated when display is performed with the display device 1301a provided in contact with the window glass of the motor vehicle 2001, which allows frost forming on the window glass to melt in a short time. In the case of such use, the display device 1301a is preferably placed not only on the windshield but also on the rear windshield and the window glass on the driver's seat side.

Manufacture without a fine metal mask is possible with the use of the method for manufacturing the display device of one embodiment of the present invention, thereby allowing mass production at low cost.

Figure 41B:
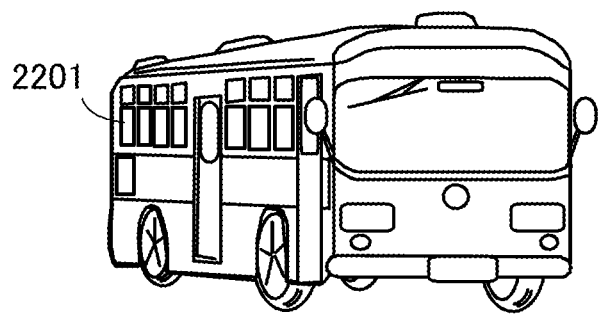

FIG. 41B shows a large transport vehicle 2002 with a motor controlled by electricity as an example of a transport vehicle. In the shown example, a display device 2201 is mounted on the window glass of the transport vehicle 2002. The display device 2201 can display an advertising image toward passengers.

Figure 41C:
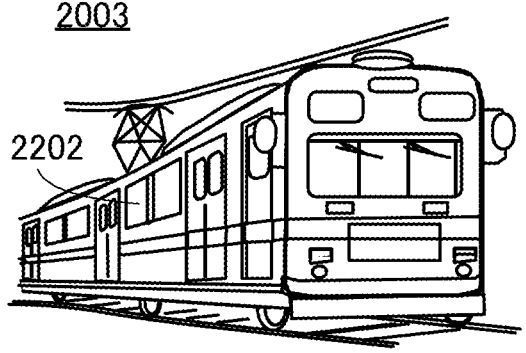

FIG. 41C shows a large transport vehicle 2003 with a motor controlled by electricity as an example. In the shown example, a display device 2202 is mounted on the window glass of the transport vehicle 2003.

Figure 41D:
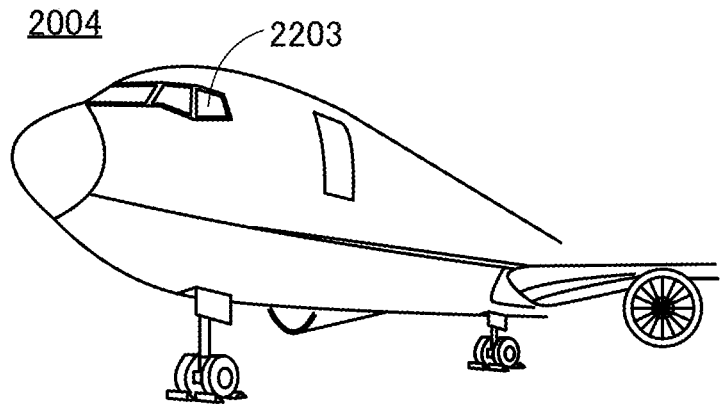

FIG. 41D shows an aircraft 2004 including a combustion engine as an example. The aircraft 2004 shown in FIG. 41D has wheels for takeoff and landing and thus can be referred to as one of transport vehicles, in which a display device 2203 is provided in contact with the window glass. The outside view can be seen because the display device 2203 is see-through, which is effective because the number of pieces of window glass of the aircraft 2004 needs to be small.

Application Example

An example of applying the display device of one embodiment of the present invention to information display at a counter of a commercial facility, medical facility, or public facility will be described.

Figure 42A:
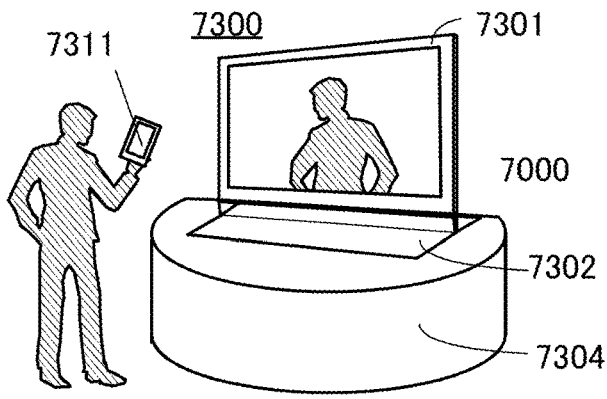
FIG. 42A to FIG. 42C are perspective views showing application examples of a display device.

FIG. 42A shows a display device 7300 placed on a counter table 7304. The display device 7300 is placed between two users. The user sitting on the counter table 7304 side can see the user standing on the opposite side through the display device 7300.

Figure 42B:
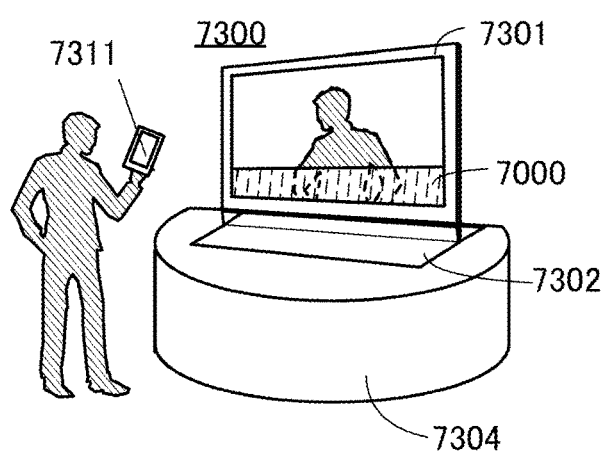
Figure 42D:
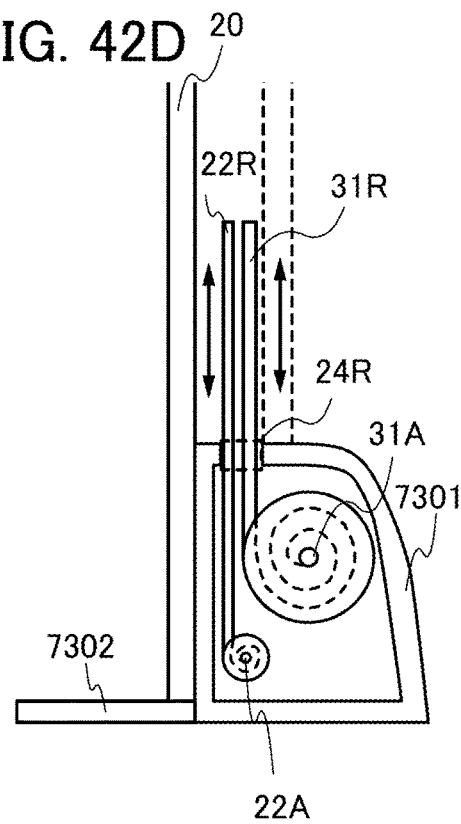
FIG. 42D is a diagram showing an example of a cross section of the display device.

The user sitting on the counter table 7304 side can operate the display device 7300 to move a display region 7000 of the display device 7300 as shown in FIG. 42B, and characters or pictures can be displayed. Note that they are displayed normally for one of the users but are displayed as mirror writing for the other user. FIG. 42D shows an example of a cross-sectional structure of the display device 7300 in FIG. 42B.

In the display device 7300, in which a flat board 20 having a light-transmitting property, such as a glass substrate or an acrylic resin board, a base 7302, and a housing 7301 are fixed and a region where the housing 7301 and the flat board 20 do not overlap with each other serves as a window, the window and the display panel that is movable so as to slide are placed to overlap with each other. As shown in FIG. 42D, when the display panel is flexible, it is possible to make the storage space small by rotating the winding shaft 31A. It is preferable to employ a structure in which the flexible display panel is sandwiched between the flat board 20 and another light-transmitting flat board and is moved in a gap therebetween. Although the display device 7300 including the housing 7301, the base 7302, and the flat board 20 is shown in FIG. 42D, the structure is not particularly limited thereto; the display device may be configured by attaching the housing 7301 and the display panel 31R to a transparent board placed at the reception counter. In the case of indoor use, the film 22R including the light-blocking layer and the winding shaft 22A are not necessarily provided.

Figure 42C:
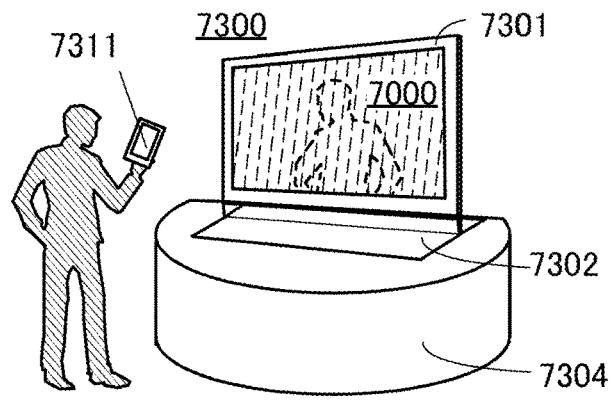

In the case where a hard substrate such as a glass substrate is used for the display panel, it is preferable to change the housing 7301 to obtain a structure in which the counter table serves as part of the structure of the display device. In such a case, a lower end portion of the display panel is placed to be lower than the top surface of the counter table, and when the display panel is moved upward, the display region 7000 is widened when seen from the user holding an information terminal 7311. Although not seen from the user holding the information terminal 7311, the display on the lower portion of the counter table can be seen by the user sitting. By utilizing it, the display region 7000 can turn into blind display to hide the hands of the user. FIG. 42C shows the state where the display region 7000 is moved to the maximum range.

Even when the display region 7000 is widened, it is possible to recognize the figure of the user on the opposite side. The display device 7300 is not limited to the one that turns into the state of FIG. 42B and then to the state of FIG. 42C from the state of FIG. 42A, but may be the display device 7300 that turns into the state of FIG. 42B from the state of FIG. 42A or the display device 7300 that turns into the state of FIG. 42C from the state of FIG. 42B where the display region 7000 always remains.

It is preferable that the user in FIG. 42A to FIG. 42C be able to work with the display device 7300 through wireless communication with the use of the information terminal 7311 that the user holds.

Although the display device 7300 is positioned as a partition between the two users in the example shown in FIG. 42A to FIG. 42C, almost all of the space may be occupied by an acrylic resin board or a wall to make a partition between the two users. When the display device 7300 is provided at a reception counter in a medical facility for prevention of infection, the distance between the users can be kept. Furthermore, without opening their mouths to talk with each other, character information input to the information terminal 7311 can be transferred to the display device 7300 to be displayed on the display region 7000, in which case checking in at the reception or consultation is also possible.

Being capable of working with the information terminal 7311 owned by the user, such as a smartphone, through wireless communication is applicable in various ways. For example, information of an advertisement displayed on the display region 7000 can be displayed on the screen of the information terminal 7311. By operation of the information terminal 7311, the display on the display region 7000 can be switched.

Furthermore, it is possible to make the display device 7300 execute a game with use of the screen of the information terminal 7311 as an operation means (controller). Thus, an unspecified number of users can join in and enjoy the game concurrently.

This embodiment can be implemented in an appropriate combination with the structures described in the other embodiments.

REFERENCE NUMERALS

11: electric vehicle, 12: steering front wheel, 13: driving rear wheel, 14: motor, 15: transmission, 16: inverter, 17: secondary battery, 18: wheel, 20: flat board, 20L: window glass, 20R: window glass, 21R: display panel, 22A: shaft, 22R: film, 23R: door trim, 24R: opening portion, 25: roller, 26: roller, 27: exterior body part, 28: interior body part, 29: rubber component, 30L: window glass, 30R: window glass, 31A: shaft, 31R: display panel, 100: display device, 100A: display device, 101: substrate, 102: element formation substrate, 103: substrate, 104: partition, 110: light-emitting element, 110B: light-emitting element, 110G: light-emitting element, 110R: light-emitting element, 110W: light-emitting element, 111: pixel electrode, 111B: pixel electrode, 111$f$: conductive film, 111G: pixel electrode, 111R: pixel electrode, 112: EL layer, 112B: EL layer, 112Bf: EL film, 112G: EL layer, 112Gf: EL film, 112R: EL layer, 112Rf: EL film, 112W: EL layer, 112Wf: EL film, 113: common electrode, 114: common layer, 115: electrode, 117: EL layer, 117G: EL layer, 117R: EL layer, 118: electrode, 120: adhesive layer, 120B: light-emitting unit, 120G: light-emitting unit, 120R: light-emitting unit, 121: protective layer, 122: opening, 122B: coloring layer, 122G: coloring layer, 122R: coloring layer, 123: anisotropic conductive connection layer, 124: external electrode, 125: light-emitting element, 128: opening, 129: opening, 131: insulating layer, 131$f$: insulating film, 132: light-emitting portion, 133: light-transmitting portion, 135: scan line, 136: signal line, 141$a$: sacrificial layer, 141$b$: sacrificial layer, 141$c$: sacrificial layer, 142$a$: sacrificial layer, 142$b$: sacrificial layer, 142$c$: sacrificial layer, 143: resist mask, 143$a$: resist mask, 143$b$: resist mask, 143$c$: resist mask, 144: sacrificial layer, 144$a$: sacrificial film, 144$b$: sacrificial film, 144$c$: sacrificial film, 145: sacrificial layer, 145$a$: sacrificial layer, 145$b$: sacrificial layer, 145$c$: sacrificial layer, 146: protective film, 146$a$: protective film, 146$b$: protective film, 146$c$: protective film, 147: protective layer, 147$a$: protective layer, 147$b$: protective layer, 147$c$: protective layer, 150: display device, 151: substrate, 152: adhesive layer, 153: separation layer, 191: external light, 192: light, 192G: light, 192R: light, 201: transistor, 202: transistor, 203: insulating layer, 204: connection portion, 205: transistor, 206: gate electrode, 207: gate insulating layer, 208: semiconductor layer, 209: transistor, 209$a$: source electrode, 209$b$: drain electrode, 210: insulating layer, 211: insulating layer, 212: insulating layer, 213: insulating layer, 214: insulating layer, 215: insulating layer, 216: terminal electrode, 217: transistor, 218: insulating layer, 219: wiring, 221: conductive layer, 222$a$: conductive layer, 222$b$: conductive layer, 223: conductive layer, 225: insulating layer, 228: region, 230: semiconductor layer, 230$i$: channel formation region, 230$n$: low-resistance region, 231: display region, 231$a$: portion, 232: driver circuit, 233: driver circuit, 235: light, 242: transistor, 243: capacitor, 250: display panel, 252: transistor, 263: electrode, 266: coloring layer, 268: overcoat layer, 280: display panel, 281: display portion, 282: circuit portion, 283: pixel circuit portion, 283$a$: pixel circuit, 284: pixel portion, 284$a$: pixel, 285: terminal portion, 286: wiring portion, 290: FPC, 291: substrate, 292: substrate, 300: display panel, 318: electrode, 320: EL layer, 320a: charge generation layer, 322: electrode, 330: light-emitting element, 331: light-emitting element, 400A: display device, 400B: display device, 400C: display device, 411a: pixel electrode, 411b: pixel electrode, 411c: pixel electrode, 413a: EL layer, 413b: EL layer, 413c: EL layer, 414: layer, 415a: optical adjustment layer, 415b: optical adjustment layer, 415c: optical adjustment layer, 416: protective layer, 416a: inorganic insulating layer, 416b: organic insulating layer, 416c: inorganic insulating layer, 417: light-blocking layer, 421: insulating layer, 426a: optical adjustment layer, 426b: optical adjustment layer, 426c: optical adjustment layer, 430a: light-emitting element, 430b: light-emitting element, 430c: light-emitting element, 431: transistor, 435: node, 437: node, 442: adhesive layer, 443: space, 452: substrate, 453: substrate, 454: substrate, 455: adhesive layer, 462: display portion, 464: circuit, 465: wiring, 466: conductive layer, 472: FPC, 473: IC, 672: lower electrode, 686: EL layer, 686a: EL layer, 686b: EL layer, 688: upper electrode, 991: conductive layer, 992: insulating layer, 993: conductive layer, 994: substrate, 1301a: display device, 2001: motor vehicle, 2002: transport vehicle, 2003: transport vehicle, 2004: aircraft, 2201: display device, 2202: display device, 2203: display device, 4411: light-emitting layer, 4412: light-emitting layer, 4413: light-emitting layer, 4420: layer, 4420-1: layer, 4420-2: layer, 4430: layer, 4430-1: layer, 4430-2: layer, 7000: display region, 7300: display device, 7301: housing, 7302: base, 7304: counter table, 7311: information terminal This application is based on Japanese Patent Application Serial No. 2020-202399 filed on Dec. 7, 2020; Japanese Patent Application Serial No. 2021-008774 filed on Jan. 22, 2021; Japanese Patent Application Serial No. 2021-008656 filed on Jan. 22, 2021; and Japanese Patent Application Serial No. 2021-158694 filed on Sep. 29, 2021, the entire contents of each are hereby incorporated herein by reference.

The invention claimed is:

1. A display device comprising:
a display panel;
a first driving unit configured to control the display panel,
a film comprising a light-blocking layer between window glass and the display panel; and
a second driving unit configured to control the film,
wherein the display panel is placed inside a mobile body comprising the window glass.

2. The display device according to claim 1, wherein the first driving unit is configured to change a positional relationship between the window glass and the display panel.

3. The display device according to claim 1, wherein the second driving unit is configured to change a positional relationship between the window glass and the film.

4. The display device according to claim 1, wherein the film comprising the light-blocking layer is stored away so as to be wound by the second driving unit.

5. The display device according to claim 1, wherein the display panel comprises a first substrate, a second substrate, a display portion, a sealing layer, and a protective layer.

6. The display device according to claim 1, wherein the display panel is stored away so as to be wound by the first driving unit.

7. The display device according to claim 1, wherein the display panel comprises a light-emitting element,
wherein the light-emitting element comprises:
an insulating layer;
a first lower electrode;
a first EL layer over the first lower electrode;
a second lower electrode;
a second EL layer over the second lower electrode; and
an upper electrode over the first EL layer, the second EL layer, and the insulating layer,
wherein the first lower electrode and the second lower electrode each have a light-transmitting property, and
wherein the upper electrode has a light-transmitting property.

8. The display device according to claim 1, wherein the display panel comprises a curved surface.

9. A device comprising:
a display panel;
a film comprising a light-blocking layer;
a first driving unit; and
a second driving unit,
wherein the display panel is placed inside a mobile body comprising window glass,
wherein the film is placed between the window glass and the display panel,
wherein the first driving unit is configured to control a positional relationship between the window glass and the display panel, and
wherein the second driving unit is configured to control a positional relationship between the window glass and the film.

10. The display device according to claim 9, wherein the display panel comprises a curved surface.

* * * * *